(12) United States Patent
Fujitani et al.

(10) Patent No.: US 10,042,258 B2
(45) Date of Patent: Aug. 7, 2018

(54) COMPOSITION FOR FORMING A RESIST UPPER-LAYER FILM AND METHOD FOR PRODUCING A SEMICONDUCTOR DEVICE USING THE COMPOSITION

(71) Applicant: NISSAN CHEMICAL INDUSTRIES, LTD., Tokyo (JP)

(72) Inventors: Noriaki Fujitani, Toyama (JP); Takafumi Endo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/324,542

(22) PCT Filed: Jul. 23, 2015

(86) PCT No.: PCT/JP2015/070909
§ 371 (c)(1),
(2) Date: Jan. 6, 2017

(87) PCT Pub. No.: WO2016/013598
PCT Pub. Date: Jan. 28, 2016

(65) Prior Publication Data
US 2017/0205711 A1 Jul. 20, 2017

(30) Foreign Application Priority Data
Jul. 24, 2014 (JP) ................. 2014-150975

(51) Int. Cl.
| | | |
|---|---|---|
| *G03F 7/004* | (2006.01) |
| *G03F 7/11* | (2006.01) |
| *G03F 7/20* | (2006.01) |
| *G03F 7/16* | (2006.01) |
| *G03F 7/38* | (2006.01) |
| *G03F 7/32* | (2006.01) |
| *G03F 7/40* | (2006.01) |
| *G03F 7/038* | (2006.01) |
| *G03F 7/039* | (2006.01) |
| *C09D 161/06* | (2006.01) |
| *C09D 125/16* | (2006.01) |
| *H01L 21/027* | (2006.01) |
| *G03F 7/09* | (2006.01) |
| *C08F 220/22* | (2006.01) |
| *C08F 220/18* | (2006.01) |
| *C08F 220/30* | (2006.01) |
| *H01L 21/311* | (2006.01) |

(52) U.S. Cl.
CPC ............. *G03F 7/11* (2013.01); *C08F 220/18* (2013.01); *C08F 220/22* (2013.01); *C08F 220/30* (2013.01); *C09D 125/16* (2013.01); *C09D 161/06* (2013.01); *G03F 7/038* (2013.01); *G03F 7/039* (2013.01); *G03F 7/091* (2013.01); *G03F 7/094* (2013.01); *G03F 7/162* (2013.01); *G03F 7/168* (2013.01); *G03F 7/2004* (2013.01); *G03F 7/2037* (2013.01); *G03F 7/322* (2013.01); *G03F 7/38* (2013.01); *G03F 7/40* (2013.01); *H01L 21/0274* (2013.01); *H01L 21/31111* (2013.01)

(58) Field of Classification Search
CPC ... G03F 7/004; G03F 7/11; G03F 7/32; G03F 7/091; G03F 7/094; G03F 7/40; G03F 7/38; H01L 21/0274; H01L 21/31111; C08F 220/22; C08F 220/30; C08F 220/18
USPC ...... 430/270.1, 271.1, 273.1, 322, 325, 329, 430/330, 331; 438/703
See application file for complete search history.

(56) References Cited

U.S. PATENT DOCUMENTS

| | | | |
|---|---|---|---|
| 8,076,053 B2 | 12/2011 | Nakamura et al. | |
| 8,435,718 B2 | 5/2013 | Nakamura et al. | |
| 9,052,600 B2 | 6/2015 | Maruyama et al. | |
| 2007/0160930 A1 | 7/2007 | Wang et al. | |
| 2010/0003615 A1 | 1/2010 | Nakamura et al. | |
| 2011/0143281 A1 | 6/2011 | Wang et al. | |
| 2012/0021355 A1 | 1/2012 | Kim et al. | |
| 2012/0028198 A1 | 2/2012 | Nakamura et al. | |
| 2013/0059252 A1* | 3/2013 | Maruyama | G03F 7/091 430/296 |
| 2013/0143162 A1 | 6/2013 | Hatakeyama et al. | |

(Continued)

FOREIGN PATENT DOCUMENTS

| | | |
|---|---|---|
| JP | 2006-113171 A | 4/2006 |
| JP | 2007-219504 A | 8/2007 |

(Continued)

OTHER PUBLICATIONS

Oct. 13, 2015 International Search Report issued in International Patent Application No. PCT/JP2015/070909.

*Primary Examiner* — Amanda C Walke
(74) *Attorney, Agent, or Firm* — Oliff PLC

(57) ABSTRACT

This composition for forming an extreme-ultraviolet (EUV) or electron-beam upper-layer resist film including (a) a polymer (P) and (b) a solvent, the solvent containing 1 to 13 mass % of a C4-12 ketone compound with respect to the entire solvent, is used in the lithography process of a procedure for manufacturing a semiconductor device. Without needing to be intermixed with a resist, and particularly on the occasion of EUV exposure, the composition for forming an EUV or electron-beam upper-layer resist film blocks undesirable exposure light, e.g., ultraviolet (UV) or deep ultraviolet (DUV) rays, and selectively transmits only the EUV rays, and can be developed using a developing solution after exposure.

13 Claims, No Drawings

(56) References Cited

U.S. PATENT DOCUMENTS

| | | | |
|---|---|---|---|
| 2013/0143163 A1* | 6/2013 | Hatakeyama | C09D 145/00 430/296 |
| 2013/0209940 A1 | 8/2013 | Sakamoto et al. | |
| 2014/0080064 A1* | 3/2014 | Hatakeyama | G03F 7/11 430/296 |
| 2014/0113223 A1 | 4/2014 | Kato et al. | |
| 2014/0120730 A1 | 5/2014 | Nakajima et al. | |
| 2014/0255847 A1 | 9/2014 | Ohnishi et al. | |
| 2015/0140490 A1 | 5/2015 | Wang et al. | |

FOREIGN PATENT DOCUMENTS

| | | |
|---|---|---|
| JP | 2007-241109 A | 9/2007 |
| JP | 2008-065304 A | 3/2008 |
| JP | 2012-103738 A | 5/2012 |
| JP | 2013-033227 A | 2/2013 |
| JP | 2013-120194 A | 6/2013 |
| JP | 2013-228663 A | 11/2013 |
| JP | 2013-254109 A | 12/2013 |
| JP | 2015-011169 A | 1/2015 |
| WO | 2007/049637 A1 | 5/2007 |
| WO | 2012/053302 A1 | 4/2012 |
| WO | 2013/012068 A1 | 1/2013 |
| WO | 2013/051442 A1 | 4/2013 |

\* cited by examiner

COMPOSITION FOR FORMING A RESIST UPPER-LAYER FILM AND METHOD FOR PRODUCING A SEMICONDUCTOR DEVICE USING THE COMPOSITION

TECHNICAL FIELD

The present invention relates to a composition for forming a resist upper-layer film for lithography, which is used in the semiconductor device production step using photolithography, and which is effective in reducing an adverse effect caused due to an exposure light to obtain an excellent resist pattern, and a method for forming a resist pattern using the composition for forming a resist upper-layer film for lithography as well as a method for producing a semiconductor device using the method for forming a resist pattern.

BACKGROUND ART

Conventionally, microfabrication using a photolithography technique has been carried out in the production of a semiconductor device. The microfabrication is a processing method in which a thin film of a photoresist composition is formed on a substrate to be processed, such as a silicon wafer, and irradiated with a ray of an active light, such as an ultraviolet light, through a mask pattern having a pattern for a semiconductor device, and subjected to development, and the substrate to be processed, such as a silicon wafer, is etched using the resultant photoresist pattern as a protective film (mask). In recent years, as the integration degree of the semiconductor device produced is being increased, an active light ray having a shorter wavelength is used, namely, the active light ray used for the processing has been changed from a KrF excimer laser (wavelength: 248 nm) to an ArF excimer laser (wavelength: 193 nm). In accordance with such a tendency, adverse effects of irregular reflection of an active light ray from the substrate or standing waves cause serious problems, and a method of forming a bottom anti-reflective coating (BARC) between the photoresist and the substrate to be processed as a resist lower-layer film having a role of preventing reflection of the light has been widely employed.

As an anti-reflective coating, an inorganic anti-reflective coating comprised of, for example, titanium, titanium dioxide, titanium nitride, chromium oxide, carbon, or α-silicon, and an organic anti-reflective coating comprised of a light absorbing substance and a high molecular-weight compound have been known. The former requires a facility for forming the film, such as a vacuum evaporation apparatus, a CVD apparatus, or a sputtering apparatus, whereas the latter advantageously requires no special facility, and a number of studies have been made on the organic anti-reflective coating.

Recently, as a photolithography technique of a generation next to the photolithography technique using an ArF excimer laser (wavelength: 193 nm), an ArF immersion lithography technique in which exposure through water is performed has been put into practical use. However, the photolithography technique using a light has limitations, and, as a new lithography technique following the ArF immersion lithography technique, an EUV lithography technique using an EUV light (wavelength: 13.5 nm) or an electron beam has attracted attention.

In a semiconductor device production step using EUV lithography, a substrate covered with an EUV resist is subjected to exposure by irradiation with an EUV light, followed by development, to form a resist pattern.

In a semiconductor device production step using electron beam lithography, a substrate covered with an electron beam resist is subjected to exposure by irradiation with an electron beam, followed by development, to form a resist pattern.

As a composition for forming a resist upper-layer film for EUV lithography, a novolak material containing a naphthalene ring has been disclosed (Patent Literature 1).

A composition for forming a photoresist upper-layer film, which contains a mixed solvent of a solvent having an ether structure and an alcohol solvent, has been disclosed (Patent Literature 2).

A composition for forming a photoresist upper-layer film, which contains a solvent having an ether structure, has been disclosed (Patent Literature 3).

A composition for forming a protective film for immersion exposure, which contains a solvent having a ketone solvent, has been disclosed (Patent Literature 4).

A resist protective film material comprising a high molecular-weight compound obtained by copolymerizing repeating units having a carboxyl group and/or a sulfonic group and repeating units comprising a hydrocarbon has been disclosed (Patent Literature 5).

A method for forming an EUV or electron beam resist pattern comprising a polymer having at least any of an aromatic group and an aromatic hetero group has been disclosed (Patent Literature 6).

As mentioned above, a variety of compositions for forming an EUV lithography upper-layer film have been disclosed. Important properties required for the EUV lithography upper-layer film are that the upper-layer film can transmit an EUV light and cut off the above-mentioned OOB (out of band) emission and further can maintain the barrier property for outgassing from the resist, making it possible to form an excellent resist pattern.

Further, in the situation in which the composition of the present invention is practically used (in the production of a semiconductor device), from the viewpoint of handling of the composition, it is important that the composition itself has excellent storage stability (that is, the composition suffers no change in the properties even after being stored for a long time) and that when the composition is used in forming a resist upper-layer film, a problem, such as an application defect, is not caused. This is a property similarly required for the electron beam resist upper-layer film.

A composition for forming a resist upper-layer film which satisfies all the above-mentioned properties has not yet been known.

CITATION LIST

Patent Literatures

Patent Literature 1: WO 2012/053302 A1 pamphlet
Patent Literature 2: WO 2007/049637 A1 pamphlet
Patent Literature 3: JP 2012-103738 A
Patent Literature 4: JP 2006-113171 A
Patent Literature 5: JP 2008-065304 A
Patent Literature 6: JP 2013-228663 A

SUMMARY OF THE INVENTION

Technical Problem

In view of the above-mentioned problems, the present invention has been made to provide an optimum composition for forming a resist upper-layer film, and there is provided a composition for forming an EUV or electron beam resist upper-layer film for use in a lithography process in the semiconductor device production, wherein a resist upper-layer film formed from the composition, particularly an EUV or electron beam resist upper-layer film formed from the composition cuts off an undesirable exposure light particularly during the EUV or electron beam exposure, for example, an UV light or a DUV light and selectively transmits only an EUV light or an electron beam without intermixing with the resist, and has excellent barrier property for outgassing from the resist, and can be developed using a developing agent after the exposure, and further can be applied to any of a positive resist and a negative resist, making it possible to obtain an excellent resist pattern.

Solution to Problem

The present invention is as follows.

[1] A composition for forming an EUV or electron beam resist upper-layer film, wherein the composition comprises:
(a) a polymer (P), and
(b) a solvent,
wherein the solvent contains a ketone compound having 4 to 12 carbon atoms in an amount of 1 to 13% by mass, based on a total mass of the solvent.

[2] The composition according to item [1] above, wherein (a) polymer (P) comprises two or more types of repeating units and comprises all of the groups selected from the following (a1) to (a3):
(a1) an alkyl group having 1 to 10 carbon atoms and hydrogen atoms, wherein part or all of the hydrogen atoms may be substituted by a fluorine atom,
(a2) a hydroxyl group and/or a carboxyl group, and
(a3) an organic group having an aromatic ring.

[3] The composition according to item [1] above, wherein (a) polymer (P) comprises repeating units represented by any of the following formulae (1-1) to (1-4):

[Chemical formula 1]

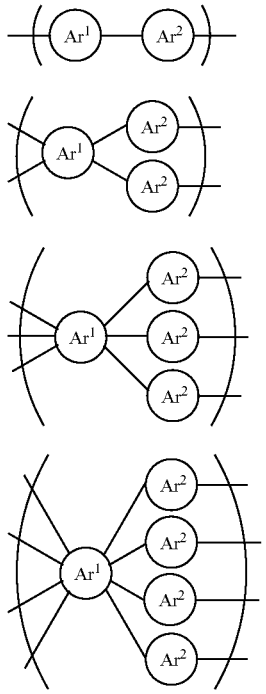

wherein, in formulae (1-1) to (1-4), $Ar^1$ is an organic group having an aromatic ring of 6 to 18 carbon atoms, and $Ar^2$ represents an organic group having an aromatic ring of 6 to 18 carbon atoms and being linked with $Ar^1$ through a methylene group or a tertiary carbon atom; wherein the organic group containing an aromatic ring in $Ar^1$ or $Ar^2$ comprises an alkyl group (a1) having 1 to 10 carbon atoms and hydrogen atoms, wherein part or all of the hydrogen atoms may be substituted by a fluorine atom, and a number of substitution is an integer of 1 to 10; wherein at least one of hydrogen atoms of the aromatic ring in $Ar^1$ or $Ar^2$ is substituted by a hydroxyl group and/or a carboxyl group, and is optionally substituted by a halogen atom, a nitro group, a cyano group, a methylenedioxy group, an acetoxy group, a methylthio group, an alkoxy group having 1 to 9 carbon atoms, an amino group having hydrogen atoms that may be substituted by an alkyl group having 1 to 3 carbon atoms, an alkyl group having 1 to 6 carbon atoms and hydrogen atoms that may be substituted by a hydroxyl group, a halogenated alkyl group having 1 to 6 carbon atoms, or a combination thereof, and a number of substitution is an integer of 1 to 10.

[4] The composition according to item [3] above, wherein $Ar^1$ represents an organic group represented by any of the following formulae (2-1) to (2-5) or a combination thereof, and the aromatic ring in $Ar^1$ is appropriately linked with $Ar^2$, and $Ar^2$ represents a methylene group or an organic group represented by the following formula (3-1) or formula (3-2):

[Chemical formula 2]

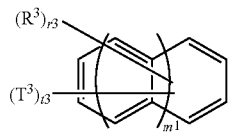

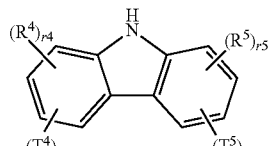

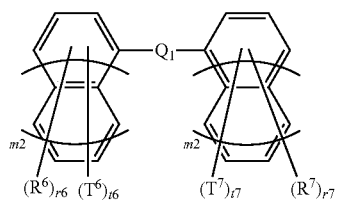

[Chemical formula 3]

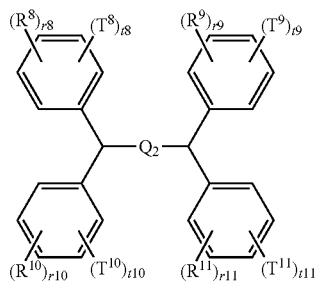

-continued (2-5)
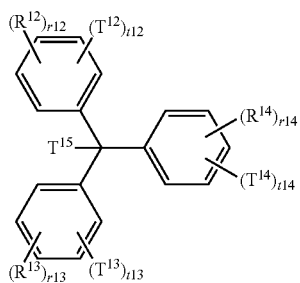

[Chemical formula 4]

(3-1)
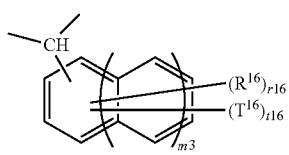

(3-2)
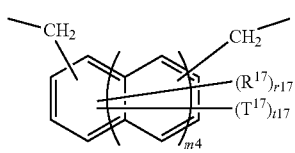

wherein, in formulae (2-1) to (2-5) and formula (3-1) or formula (3-2), each of $R_3$ to $R_{14}$, $R_{16}$, and $R_{17}$ independently represents the alkyl group (a1) having 1 to 10 carbon atoms and hydrogen atoms, wherein part or all of the hydrogen atoms may be substituted by a fluorine atom; each of $T_3$ to $T_{17}$ independently comprises a hydroxyl group and/or a carboxyl group and represents a hydrogen atom, a halogen atom, a nitro group, a cyano group, a methylenedioxy group, an acetoxy group, a methylthio group, an alkoxy group having 1 to 9 carbon atoms, an amino group having hydrogen atoms that may be substituted by an alkyl group having 1 to 3 carbon atoms, an alkyl group having 1 to 6 carbon atoms and having hydrogen atoms that may be substituted by a hydroxyl group, a halogenated alkyl group having 1 to 6 carbon atoms, or a combination thereof; each of $Q_1$ and $Q_2$ represents a single bond, an oxygen atom, a sulfur atom, a sulfonyl group, a carbonyl group, an imino group, an arylene group having 6 to 40 carbon atoms, an alkylene group having 1 to 10 carbon atoms and having hydrogen atoms that may be substituted by a halogen atom, or a combination thereof, wherein the alkylene group optionally forms a ring; each of m1 to m4, r4, r5, r8 to r14, t4, t5, and t8 to t14 independently represents an integer of 0 to 2; each of r3, r6, r7, r17, t3, t6, t7, and t17 independently represents an integer of 0 to 8; and each of r16 and t16 independently represents an integer of 0 to 9, wherein each of the total of r3 to r14, r16, and r17 and the total of t3 to t14, t16, and r17 is independently an integer of 1 to 10.

[5] The composition according to item [1] above, wherein (A) polymer (P) comprises repeating units represented by any of the following formulae (4-1) and (4-2):

[Chemical formula 5]

(4-1)
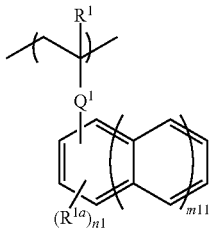

(4-2)
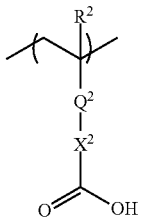

wherein, in formulae (4-1) and (4-2),
$R^1$ and $R^2$ are the same or different and represent a hydrogen atom or an alkyl group having 1 to 10 carbon atoms,
$Q^1$ and $Q^2$ are the same or different and represent a single bond, an ester linkage (—C(=O)—O— or —O—C(=O)—), or an amide linkage (—NH—CO— or —CO—NH—),
$X^2$ represents a single bond, an alkylene group having 1 to 10 carbon atoms, or an arylene group having 6 to 14 carbon atoms,
$R^{1a}$ represents an alkyl group (a1) having 1 to 10 carbon atoms and hydrogen atoms, wherein part or all of the hydrogen atoms may be substituted by a fluorine atom,
n1 represents an integer of 1 to 3, and
m11 represents an integer of 0 to 2.

[6] The composition according to any one of items [2] to [5] above, wherein the alkyl group (a1) is the following formula (5):

[Chemical formula 6]

(5)
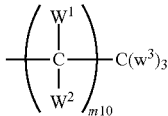

wherein, in formula (5), each of $W^1$ and $W^2$ independently represents a hydrogen atom, a fluorine atom, a trifluoromethyl group, a difluoromethyl group, or a monofluoromethyl group, $w^3$ represents a hydrogen atom, a fluorine atom, or a combination thereof, wherein at least one of $W^1$, $W^2$, and $w^3$ is a fluorine atom or the fluorine-containing organic group as defined above, and m10 represents an integer of 0 to 9, wherein a number of the carbon atoms contained in formula (5) is at most 10.

[7] The composition according to any one of items [2] to [5] above, wherein the alkyl group (a1) is unsubstituted by fluorine atom.

[8] The composition according to any one of items [1] to [7] above, which further comprises an ether compound having 8 to 16 carbon atoms as a solvent.

[9] The composition according to any one of items [1] to [8] above, which further comprises an acid compound and/or a basic compound.

[10] A method for producing a semiconductor device, wherein the method comprises the steps of: forming a resist film on a substrate; applying the composition according to any one of items [1] to [9] above to the resist film and calcining the applied composition to form a resist upper-layer film; subjecting the semiconductor substrate covered with the resist upper-layer film and the resist film to exposure with an EUV light or an electron beam; and subjecting the substrate obtained after the exposure to development to remove the resist upper-layer film and the resist film.

[11] A method for forming a resist pattern for use in producing a semiconductor device, which comprises the step of applying the composition according to any one of items [1] to [9] above to a resist formed on a semiconductor substrate and calcining the applied composition to form a resist upper-layer film.

[12] A method for producing the composition according to any one of items [1] to [9] above, which comprises the step of mixing the polymer (P) and a ketone compound having 4 to 12 carbon atoms as a solvent.

[13] The composition according to item [1] above, wherein (a) polymer (P) comprises repeating units represented by any of the following formulae (P-1) to (P-4) and (P-8) to (P-10):

[Chemical formula 7]

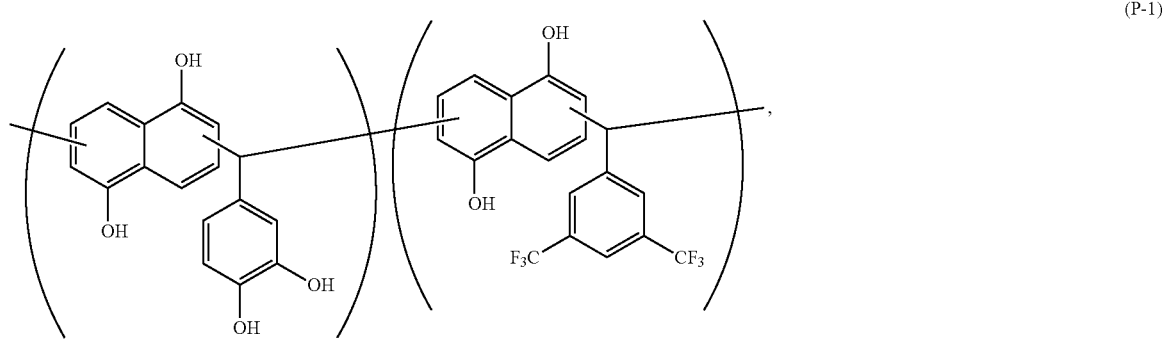

(P-1)

[Chemical formula 8]

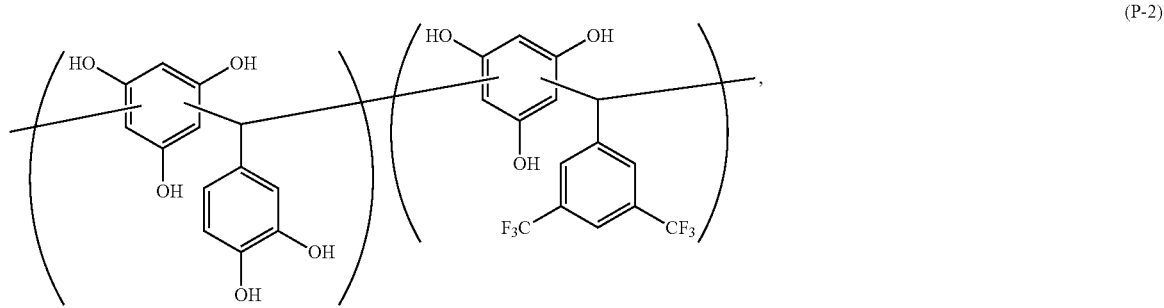

(P-2)

[Chemical formula 9]

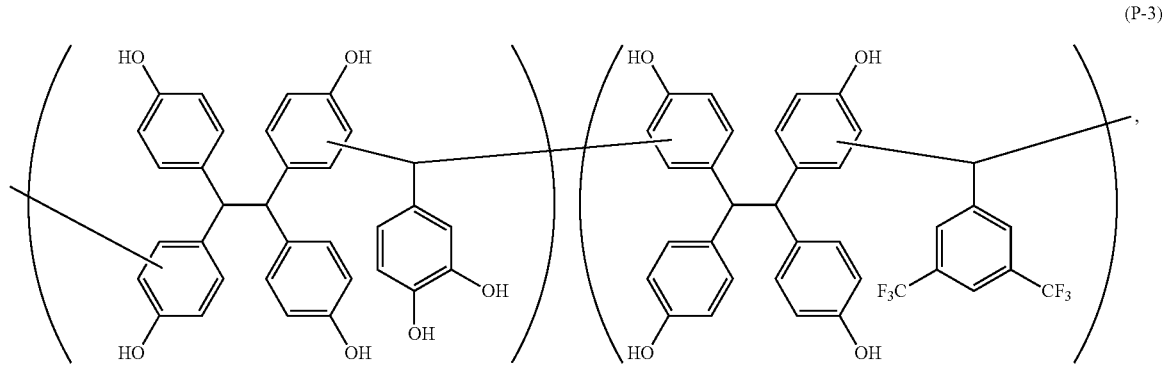

(P-3)

-continued
(P-4)
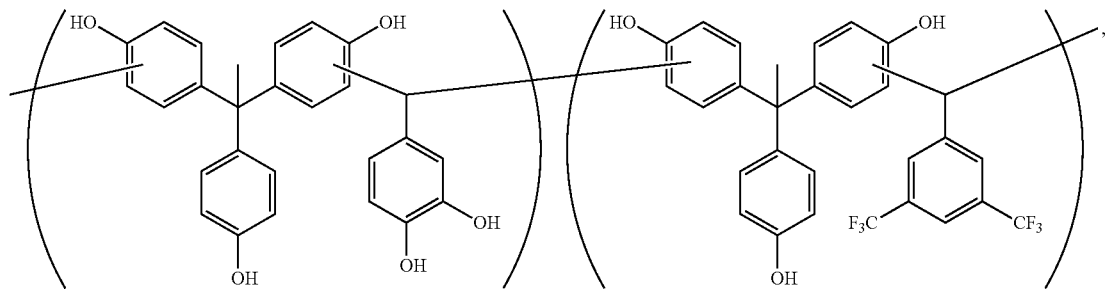
[Chemical formula 11]
(P-8)
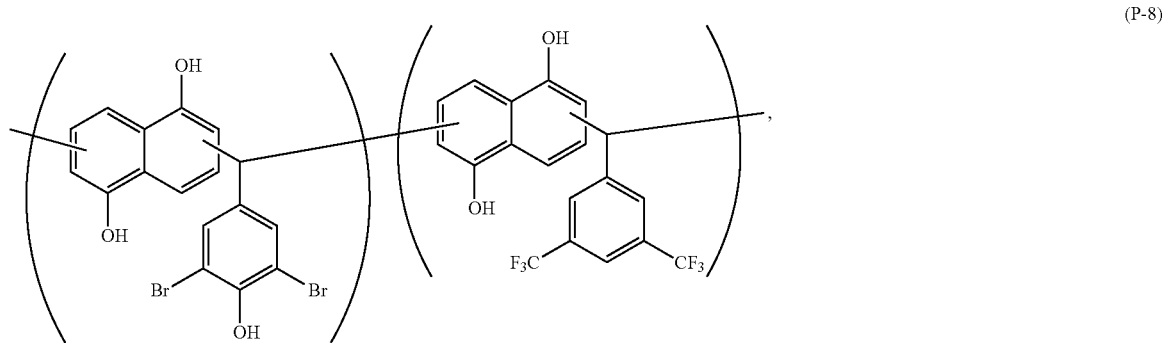
[Chemical formula 12]
(P-9)
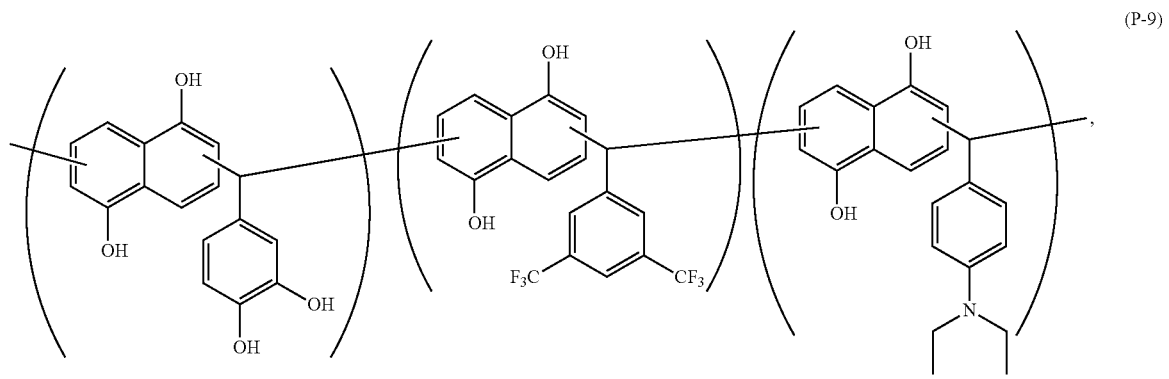
[Chemical formula 13]
(P-10)
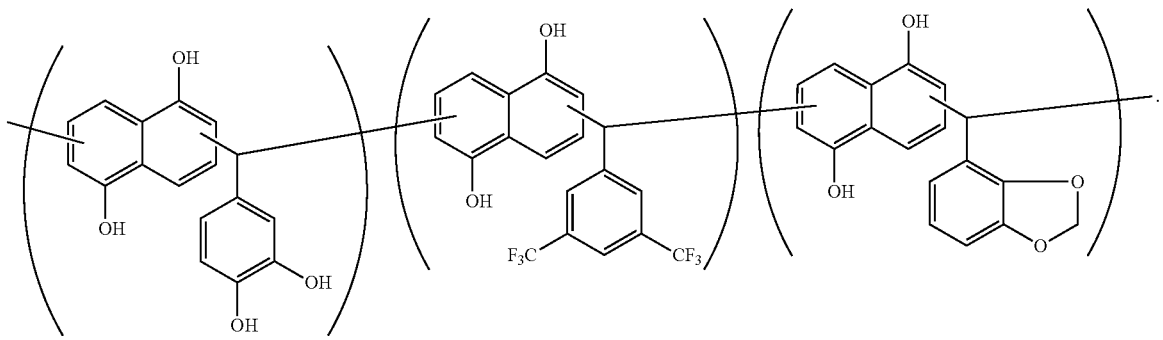

[14] The composition according to item [1] above, wherein (a) polymer (P) comprises repeating units represented by any of the following formulae (P-5) to (P-7):

a copolymer of:

[Chemical formula 14]

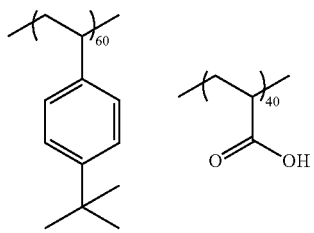
(P-5)

a copolymer of:

[Chemical formula 15]

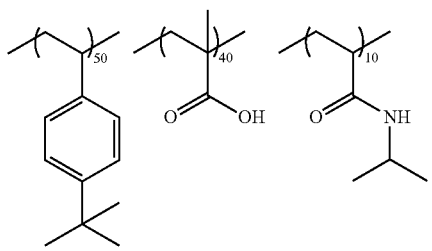
(P-6)

a copolymer of:

[Chemical formula 16]

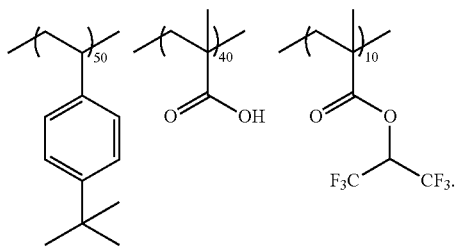
(P-7)

Advantageous Effects of Invention

The present invention relates to a composition for forming an EUV or electron beam resist upper-layer film which cuts off an undesirable exposure light during the EUV or electron beam exposure, for example, an UV light or a DUV light and selectively transmits only an EUV light or an electron beam without intermixing with the EUV or electron beam resist, and further can be developed using a developing agent after the exposure.

Particularly, in the exposure for an EUV resist, an EUV light as well as an UV light and a DUV light are emitted. The EUV light includes about 5% of a light having a wavelength of 300 nm or less in addition to the EUV light, and, in such a light, a ray of light having a wavelength in a region of, for example, 190 to 300 nm, especially around 220 to 260 nm has the highest intensity, causing a lowering of the sensitivity of the EUV resist or deterioration of the shape of pattern (or making it impossible to form a rectangular pattern). The formation of a pattern having a line width of 22 nm or less is likely affected by the UV light or DUV light (OUT of BAND emission), adversely affecting the resolution of the EUV resist.

There is a method in which the lithography system is provided with a filter for removing a light having a wavelength of about 220 to 260 nm. However, this method has a problem in that the step is complicated. In the present invention, the aromatic hydrocarbon ring contained in the composition of the present invention absorbs an undesirable DUV light at 220 to 260 nm among the DUV light (OUT of BAND emission) contained in the EUV exposure light, making it possible to improve the resolution of the EUV resist.

With respect to the composition used for achieving the above improvement, it is important to select the solvent used in the composition so that the solubility of the polymer, which is contained in the composition and which has the most suitable properties for the composition, in the solvent is excellent, that the resultant composition has excellent storage stability and provides reduced number of defects when applying the composition, and that the intermixing of the film formed from the composition with the underlying resist (mixing of the layers) is avoided.

As mentioned above, various solvents usable for a resist upper-layer film have been disclosed. The present inventors have conducted extensive and intensive studies, and as a result, they have found that the composition for forming a resist upper-layer film, which contains a ketone compound having 4 to 12 carbon atoms in an amount of 1 to 13% by mass, based on a total mass of the solvent contained in the composition, is useful in forming an EUV or electron beam resist upper-layer film, and completed the present invention.

When the composition for forming a resist upper-layer film of the present invention is used, the resultant resist upper-layer film can be applied to various resists irrespective of the type of resists (a positive type or a negative type).

The polymer contained in the composition of the present invention is soluble in a solvent for development (such as butyl acetate or 2-heptanone) used in a negative development process, and therefore can be removed by dissolution using the developing agent. Such a development process for a negative resist is called an NTD (negative tone development).

Further, the polymer in the present invention as well as the EUV or electron beam resist are soluble in an alkaline developing agent upon development after the exposure, and, in this case, the composition using the polymer can be removed by dissolution using an alkaline developing agent. Such a development process for a positive resist is called a PTD (positive tone development).

Further, the polymer in the present invention has so excellent barrier property for outgassing from the resist particularly during the EUV or electron beam exposure that it can prevent an exposure system from suffering pollution due to the outgas components.

Furthermore, when patterning is performed using the composition for forming a resist upper-layer film of the present invention, it is possible to form an excellent resist pattern.

DESCRIPTION OF EMBODIMENTS

Hereinbelow, the composition for forming a resist upper-layer film of the present invention will be described in detail.

The present invention is directed to a composition for forming an EUV or electron beam resist upper-layer film, wherein the composition comprises (a) a polymer (P), and (b) a ketone compound having 4 to 12 carbon atoms, as a solvent, in an amount of 1 to 13% by mass, based on a total mass of the solvent.

(a) Polymer (P) is a polymer (called also a high molecular-weight compound) produced by polymerizing one type or two or more types of monomers.

With respect to (a) polymer (P), there is no particular limitation as long as it can form a resist upper-layer film, but a novolak polymer, an acrylic polymer, or a methacrylic polymer is preferred.

A novolak polymer is obtained by subjecting a known monomer to condensation reaction in the presence of an acid catalyst or a basic catalyst.

In the present invention, the expression "(meth)acrylic polymer" means both an acrylic polymer and a methacrylic polymer. For example, the expression "(meth)acrylate" means both an acrylate and a methacrylate.

Desirably, solvent (b) contains a ketone compound having 4 to 12 carbon atoms in an amount of 1 to 13% by mass, based on a total mass of the solvent.

Solvent (b) is a solvent for dissolving a substance in the solid state or in the liquid state into a solution state (composition) at a temperature at which the composition solution for forming a resist upper-layer film is used (10 to 30° C. under atmospheric pressure).

The ketone compound having 4 to 12 carbon atoms is represented by a general formula, for example, the following formula (S-1).

[Chemical formula 17]

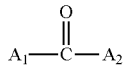

(S-1)

In formula (S-1), each of $A_1$ and $A_2$ independently represents an alkyl group having 1 to 11 carbon atoms and optionally being substituted. $A_1$ and $A_2$ may together form a ring.

Examples of alkyl groups having 1 to 11 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a n-hexyl group, a n-heptyl group, a n-octyl group, a n-nonyl group, a n-decanyl group, a n-undecanyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group. The linear, branched, or cyclic saturated alkyl group having 1 to 11 carbon atoms and optionally being substituted means that part of or all of the hydrogen atoms of the hydrocarbon group may be substituted by a halogen atom (a fluorine atom, a chlorine atom, a bromine atom, or an iodine atom).

Examples of ketone compounds other than the ketone compounds represented by formula (S-1) include 2,4-pentanedione, acetonylacetone, acetophenone, and diacetone alcohol.

Of these, examples of preferable ketone compounds having 4 to 12 carbon atoms include 2-butanone, 2-heptanone, 2-octanone, 2-nonanone, 2-decanone, 4-methyl-2-pentanone, 5-methyl-2-hexanone, 2,6-dimethyl-4-heptanone, 5-methyl-2-octanone, 5-nonanone, cyclopentanone, cyclohexanone, cycloheptanone, cyclooctanone, methylcyclohexanone, 4-hydroxy-4-methyl-2-pentanone, methyl n-propyl ketone, methyl n-butyl ketone, diethyl ketone, methyl iso-butyl ketone, methyl n-amyl ketone, ethyl n-butyl ketone, methyl n-hexyl ketone, di-iso-butyl ketone, trimethylnonanone, and 3,3,5-trimethylcyclohexanone. Among these, especially preferred are 2-butanone, 2-heptanone, 2-octanone, 2-nonanone, 2-decanone, 4-methyl-2-pentanone, 5-methyl-2-hexanone, 2,6-dimethyl-4-heptanone, 5-methyl-2-octanone, 5-nonanone, cyclopentanone, and 3,3,5-trimethylcyclohexanone.

These ketone compounds can be used alone or in combination.

The upper limit of the amount of the ketone compound is preferably 13% by mass, more preferably 10% by mass, based on a total mass of the solvent contained in the composition of the present invention. When the amount of the ketone compound is 13% by mass or more, the resultant resist upper-layer film would cause mixing with the underlying resist layer (mixing of the layers), disadvantageously causing a film thickness reduction of the resist film after removing the resist upper-layer film.

The lower limit of the amount of the ketone compound is 1% by mass, more preferably 3% by mass. When the amount of the ketone compound is less than 1% by mass, the solubility of the polymer would become poor, making it difficult to produce a composition containing the components of the composition completely dissolved. Moreover, it may be disadvantageously impossible to prevent a phenomenon in which the upper portions of the resist pattern are partially connected together (bridging).

Furthermore, when an aging treatment is performed by heating, application defects disadvantageously may be increased.

(a) Polymer (P) in the present invention preferably comprises two or more types of repeating units and comprises all of the groups selected from the following (a1) to (a3):

(a1) an alkyl group having 1 to 10 carbon atoms and hydrogen atoms, wherein part or all of the hydrogen atoms may be substituted by a fluorine atom, (a2) a hydroxyl group and/or a carboxyl group, and (a3) an organic group having an aromatic ring.

The number of the types of repeating units contained in (a) polymer (P) in the present invention is preferably 2 to 5, more preferably 2 to 4, most preferably 2 or 3.

Examples of alkyl groups having 1 to 10 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-i-methyl-cyclopropyl group, a 2-ethyl-2-methyl-cyclopropyl group, a 2-ethyl-3-methyl-cyclopropyl group, a cyclohexyl group, a cycloheptyl group, a cyclooctyl group, a cyclononyl group, a cyclodecanyl group, a norbornyl group, an adamantyl group, a bicyclo[2.1.0]pentyl group, a bicyclo[3.2.1]octyl group, and a tricyclo[3.2.1.0$^{2,7}$]octyl group.

Part of or all of the hydrogen atoms of the above alkyl group may be substituted by a fluorine atom.

Preferred is an alkyl group having 1 to 5 carbon atoms and hydrogen atoms, wherein part or all of the hydrogen atoms may be substituted by a fluorine atom, more preferred is an alkyl group having 1 to 3 carbon atoms and hydrogen atoms, wherein part or all of the hydrogen atoms may be substituted by a fluorine atom, still more preferred is a methyl group, an ethyl group, a n-propyl group, an i-propyl group, a n-butyl group, an i-butyl group, a s-butyl group, or a t-butyl group, wherein part or all of the hydrogen atoms may be substituted by a fluorine atom, and most preferred is a trifluoromethyl group.

Organic groups (a3) containing an aromatic ring include those containing an aromatic hydrocarbon ring or an aromatic heterocycle.

Examples of aromatic hydrocarbon rings in the present invention include benzene, naphthalene, anthracene, phenanthrene, naphthacene, triphenylene, pyrene, and chrysene, and preferred is benzene, naphthalene, anthracene, or pyrene.

Examples of aromatic heterocycles in the present invention include furan, thiophene, pyrrole, imidazole, pyran, pyridine, pyrimidine, pyrazine, indole, purine, quinoline, isoquinoline, quinuclidine, chromene, thianthrene, phenothiazine, phenoxazine, xanthene, acridine, phenazine, and carbazole, and preferred is carbazole.

Further, in the present invention, it is desired that (a) polymer (P) comprises repeating units represented by any of the following formulae (1-1) to (1-4).

[Chemical formula 18]

(1-1)

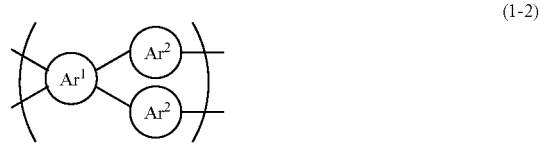

(1-2)

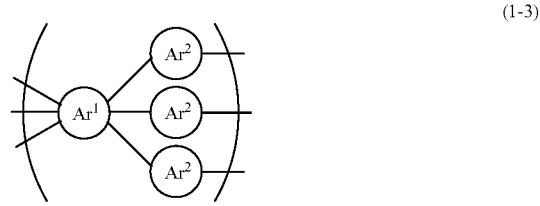

(1-3)

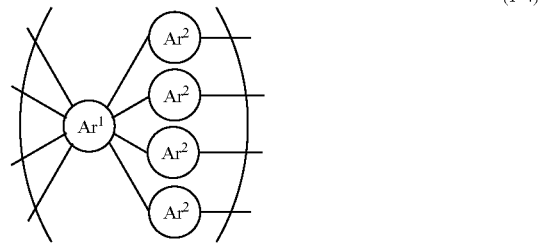

(1-4)

In formulae (1-1) to (1-4), $Ar^1$ is an organic group having an aromatic ring of 6 to 18 carbon atoms, and $Ar^2$ represents an organic group having an aromatic ring of 6 to 18 carbon atoms and being linked with $Ar^1$ through a methylene group or a tertiary carbon atom. The organic group containing an aromatic ring in $Ar^1$ or $Ar^2$ comprises alkyl group (a1) having 1 to 10 carbon atoms and hydrogen atoms, wherein part or all of the hydrogen atoms may be substituted by a fluorine atom, preferably comprises an alkyl group having 1 to 3 carbon atoms, wherein all of the hydrogen atoms are substituted by a fluorine atom, and a number of substitution is an integer of 1 to 10, preferably an integer of 1 to 6, more preferably an integer of 1 to 4. Any of the hydrogen atoms of the aromatic ring in $Ar^1$ or $Ar^2$ is substituted by a hydroxyl group and/or a carboxyl group, preferably by a hydroxyl group, and may be substituted by a halogen atom, a nitro group, a cyano group, a methylenedioxy group, an acetoxy group, a methylthio group, an alkoxy group having 1 to 9 carbon atoms, an amino group having hydrogen atoms that may be substituted by a linear alkyl group having 1 to 3 carbon atoms, an alkyl group having 1 to 6 carbon atoms and having hydrogen atoms that may be substituted by a hydroxyl group, a halogenated alkyl group having 1 to 6 carbon atoms, or a combination thereof, and a number of substitution is an integer of 1 to 10.

With respect to the above-mentioned substituents, especially preferred is a bromine atom, an amino group having the hydrogen atom substituted by a linear alkyl group having 1 to 3 carbon atoms, or a methylenedioxy group, and the number of the substitution is an integer of 1 to 3.

Among formulae (1-1) to (1-4), the structure of formula (1-1) is especially preferred.

Examples of halogen atoms include a fluorine atom, a chlorine atom, a bromine atom, and an iodine atom.

Examples of alkoxy groups having 1 to 9 carbon atoms include a methoxy group, an ethoxy group, a n-propoxy group, an i-propoxy group, a n-butoxy group, an i-butoxy group, a s-butoxy group, a t-butoxy group, a n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2,-trimethyl-n-propoxy group, a 1-ethyl-1-methyl-n-propoxy group, a 1-ethyl-2-methyl-n-propoxy group, a n-heptyloxy group, a n-octyloxy group, and a n-nonyloxy group.

The maximum of a number of substitution may be an integer of 9 or less depending on the type of the aromatic ring contained in $Ar^1$ or $Ar^2$. For example, when both $Ar^1$ and $Ar^2$ are an anthracene ring in formula (1-2), the number of substitution that $Ar^1$ can have is at most 6 and the number of substitution that $Ar^2$ can have is at most 8. When both $Ar^1$ and $Ar^2$ are an anthracene ring in formula (1-4), the number of substitution that $Ar^1$ can have is at most 2 and the number of substitution that $Ar^2$ can have is at most 8.

The preferred number of substitution for $Ar^1$ and $Ar^2$ is an integer of 1 to 4.

$Ar^1$ preferably represents an organic group represented by formulae (2-1) to (2-5) below or a combination thereof, and the aromatic ring in $Ar^1$ is appropriately linked with $Ar^2$, and $Ar^2$ represents a methylene group or an organic group represented by formula (3-1) or formula (3-2) below.

[Chemical formula 2]

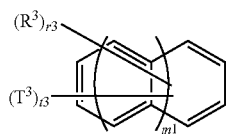

(2-1)

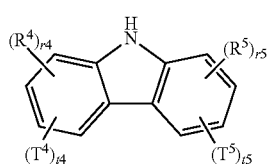

(2-2)

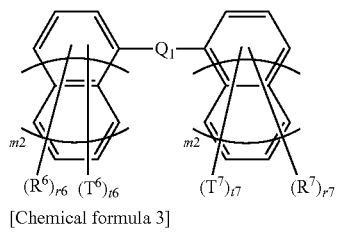

(2-3)

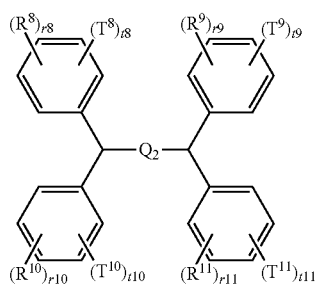

(2-4)

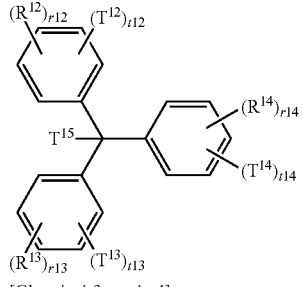

(2-5)

[Chemical formula 4]

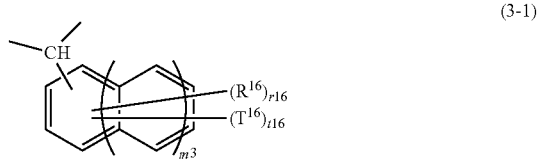

(3-1)

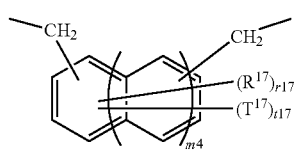

(3-2)

In formulae (2-1) to (2-5) and formula (3-1) or formula (3-2), each of $R_3$ to $R_{14}$, $R_{16}$, and $R_{17}$ independently represents alkyl group (a1) having 1 to 10 carbon atoms and hydrogen atoms, wherein part or all of the hydrogen atoms may be substituted by a fluorine atom, preferably an alkyl group having 1 to 3 carbon atoms, wherein all of the hydrogen atoms are substituted by a fluorine atoms. Each of $T_3$ to $T_{17}$ independently comprises a hydroxyl group and/or a carboxyl group, preferably a hydroxyl group, and represents a hydrogen atom, a halogen atom, a nitro group, a cyano group, a methylenedioxy group, an acetoxy group, a methylthio group, an alkoxy group having 1 to 9 carbon atoms, an amino group having hydrogen atoms that may be substituted by an alkyl group having 1 to 3 carbon atoms, an alkyl group having 1 to 6 carbon atoms and having hydrogen atoms that may be substituted by a hydroxyl group, a halogenated alkyl group having 1 to 6 carbon atoms, or a combination thereof.

With respect to the above-mentioned substituents, especially preferred is a bromine atom, an amino group having the hydrogen atom substituted by a linear alkyl group having 1 to 3 carbon atoms, or a methylenedioxy group.

Each of $Q_1$ and $Q_2$ represents a single bond, an oxygen atom, a sulfur atom, a sulfonyl group, a carbonyl group, an imino group, an arylene group having 6 to 40 carbon atoms, an alkylene group having 1 to 10 carbon atoms and having hydrogen atoms that may be substituted by a halogen atom, or a combination thereof. Preferred $Q_1$ and $Q_2$ are a single bond. The alkylene group may form a ring. Each of m1 to m4, r4, r5, r8 to r14, t4, t5, and t8 to t14 independently represents an integer of 0 to 2. m1 to m4 are preferably 1 or 0. Each of r3, r6, r7, r17, t3, t6, t7, and t17 independently represents an integer of 0 to 8, preferably an integer of 0 to 4. Each of r16 and t16 independently represents an integer of 0 to 9, preferably an integer of 0 to 4. Each of the total of r3 to r14, r16, and r17 and the total of t3 to t14, t16, and t17 is independently an integer of 1 to 10, preferably each independently an integer of 1 to 5.

The tertiary carbon atom shown in formula (3-1) and the two methylene groups shown in formula (3-2) are a portion taking part in bonding to the above-mentioned $Ar^1$, respectively.

Examples of the arylene groups having 6 to 40 carbon atoms include a phenylene group, an o-methylphenylene group, a m-methylphenylene group, a p-methylphenylene group, an o-chlorophenylene group, a m-chlorophenylene group, a p-chlorophenylene group, an o-fluorophenylene group, a p-fluorophenylene group, an o-methoxyphenylene group, a p-methoxyphenylene group, a p-nitrophenylene group, a p-cyanophenylene group, an c-naphthylene group, a 0-naphthylene group, an o-biphenylylene group, a m-biphenylylene group, a p-biphenylylene group, a 1-anthrylene group, a 2-anthrylene group, a 9-anthrylene group, a 1-phenanthrylene group, a 2-phenanthrylene group, a 3-phenanthrylene group, a 4-phenanthrylene group, and a 9-phenanthrylene group.

Examples of alkylene groups having 1 to 10 carbon atoms include a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, 2,2-dimethyl-n-propylene, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, a n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-i-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-i-methyl-cyclopropylene group, a 2-ethyl-2-methyl-cyclopropylene group, a 2-ethyl-3-methyl-cyclopropylene group, a n-heptylene group, a n-octylene group, a n-nonylene group, and a n-decanylene group.

The alkylene group having 1 to 10 carbon atoms may form a ring, and, for example, may be a cycloalkylene group or a cycloalkylidene group, such as a 1,2-cyclopentylene group, a 1,3-cyclopentylene group, a 1,2-cyclohexylene group, a 1,3-cyclohexylene group, a 1,4-cyclohexylene group, a cyclopentylidene group, a cyclohexylidene group, or a cycloheptylidene group, or an alicyclic hydrocarbon having 1 to 10 carbon atoms.

Part of or all of the hydrogen atoms of the alkylene group having 1 to 10 carbon atoms may be substituted by a halogen atom.

Especially preferred specific examples of monomers constituting $Ar^1$ are represented by the following (formula 3-1-1) to (formula 3-1-26), (formula 4-1-1) to (formula 4-1-10), (formula 4-13) to (formula 4-40), and (formula 5-1) to (formula 5-22).

[Chemical formula 22]

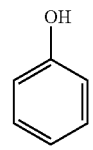

(Formula 3-1-1)

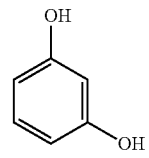

(Formula 3-1-2)

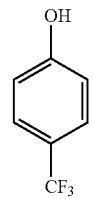

(Formula 3-1-3)

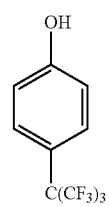

(Formula 3-1-4)

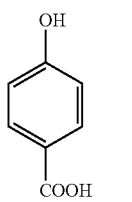
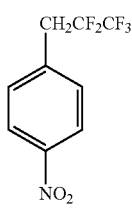
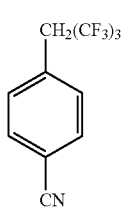
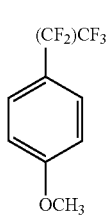
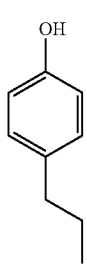
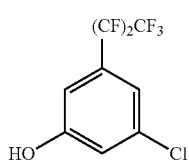
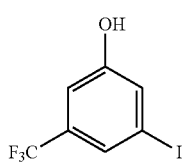
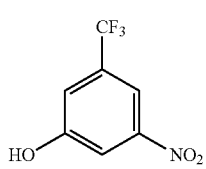
(Formula 3-1-5)
(Formula 3-1-6)
(Formula 3-1-7)
(Formula 3-1-8)
(Formula 3-1-9)
(Formula 3-1-10)
(Formula 3-1-11)
(Formula 3-1-12)
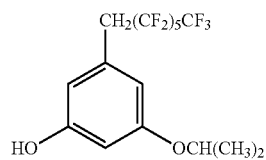
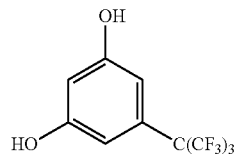
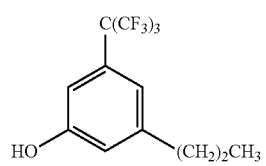
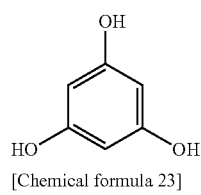
(Formula 3-1-13)
(Formula 3-1-14)
(Formula 3-1-15)
(Formula 3-1-16)
[Chemical formula 23]
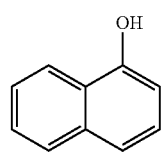
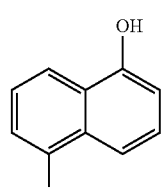
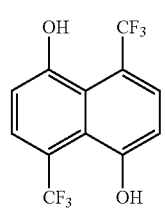
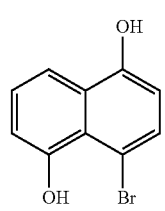
(Formula 3-1-17)
(Formula 3-1-18)
(Formula 3-1-19)
(Formula 3-1-20)

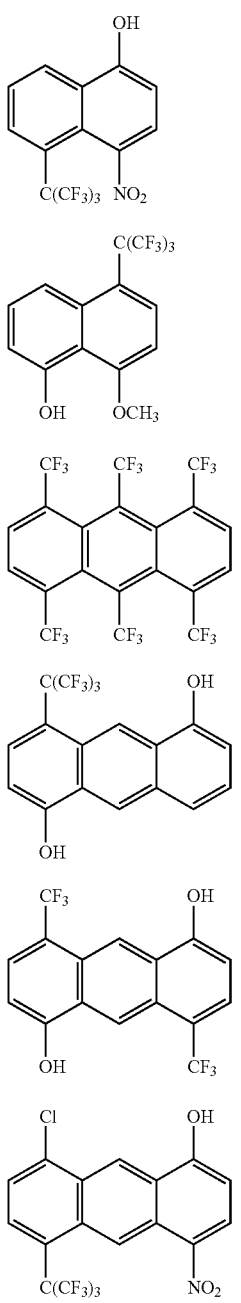
[Chemical formula 24]
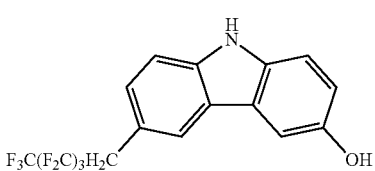 (Formula 4-1-3)
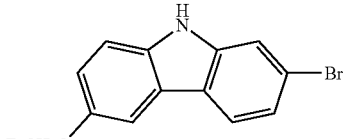 (Formula 4-1-4)
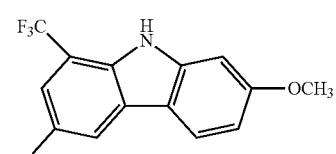 (Formula 4-1-5)
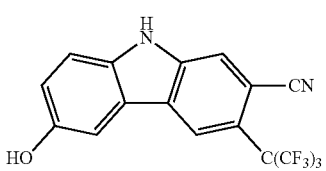 (Formula 4-1-6)
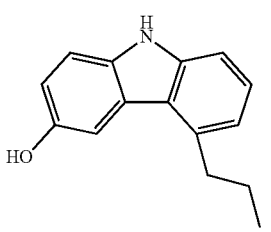 (Formula 4-1-7)
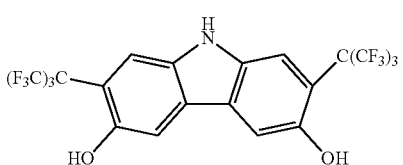 (Formula 4-1-8)
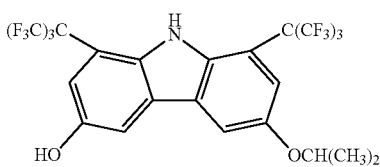 (Formula 4-1-9)
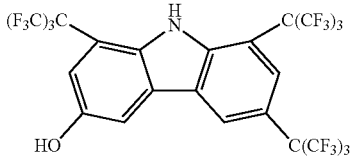 (Formula 4-1-10)
[Chemical formula 25]
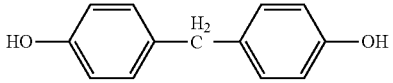 (Formula 5-1)
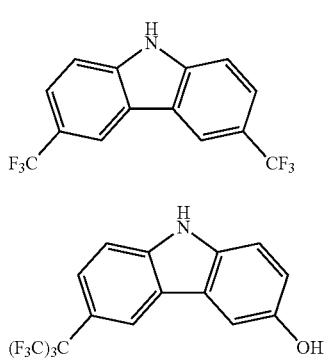

(Formula 5-2)
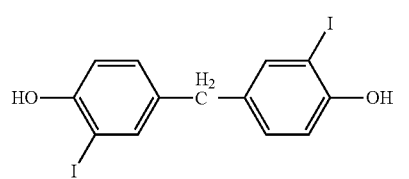
(Formula 5-3)
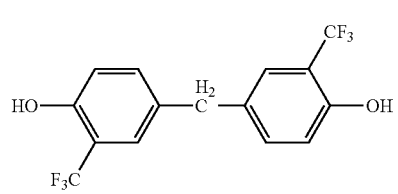
(Formula 5-4)
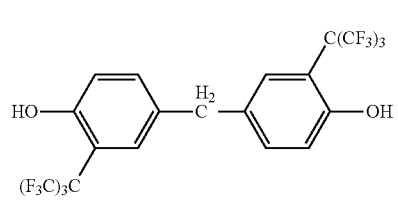
(Formula 5-5)
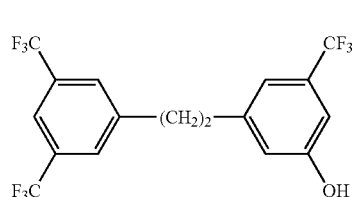
(Formula 5-6)
(Formula 5-7)
(Formula 5-8)
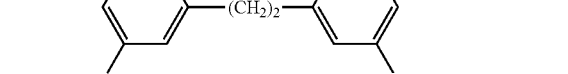
[Chemical formula 26]
(Formula 5-9)
(Formula 5-10)
(Formula 5-11)
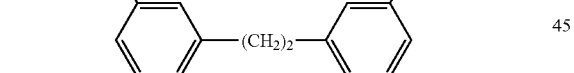
(Formula 5-12)
(Formula 5-13)
(Formula 5-14)
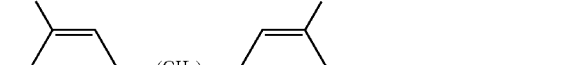
(Formula 5-15)
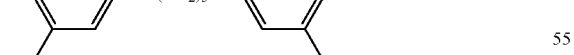
(Formula 5-16)
(Formula 5-17)
(Formula 5-18)
(Formula 5-19)

(Formula 5-20)
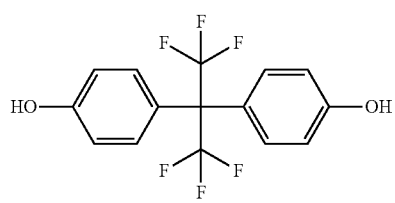
[Chemical formula 27]
(Formula 5-21)
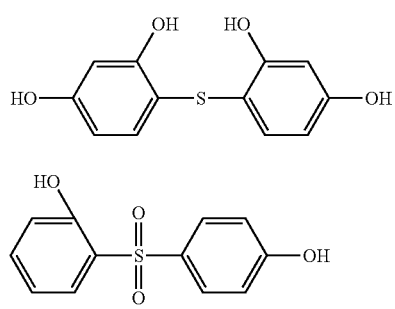
(Formula 5-22)
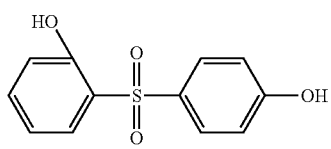
[Chemical formula 28]
(Formula 4-13)
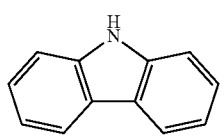
(Formula 4-14)
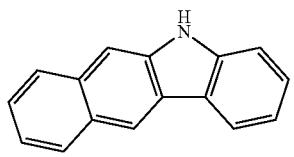
(Formula 4-15)
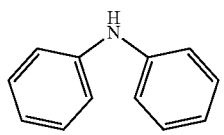
(Formula 4-16)
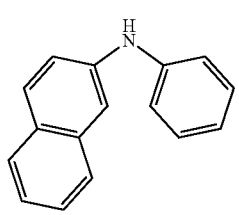
(Formula 4-17)
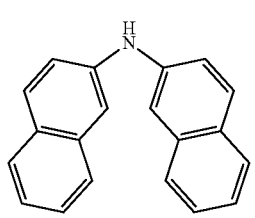
(Formula 4-18)
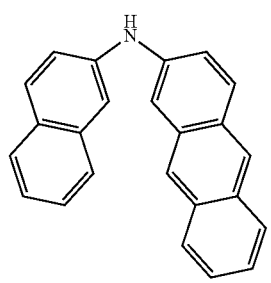
(Formula 4-19)
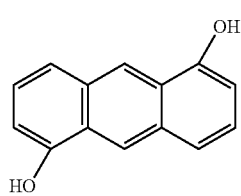
(Formula 4-20)
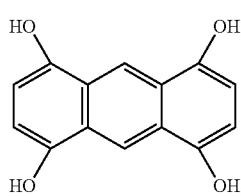
[Chemical formula 29]
(Formula 4-21)
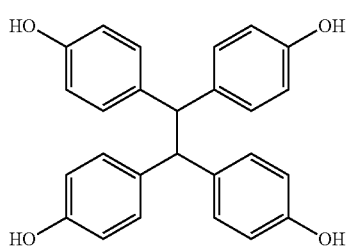
(Formula 4-22)
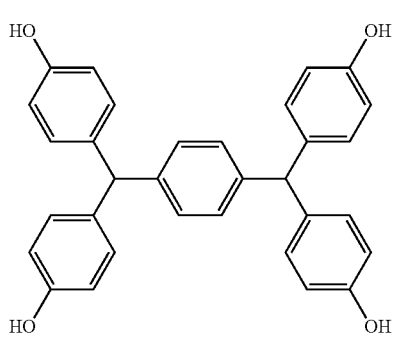
(Formula 4-23)
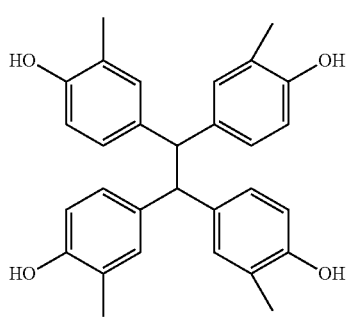

-continued
(Formula 4-24)
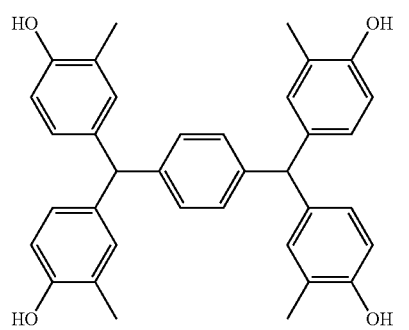
(Formula 4-25)
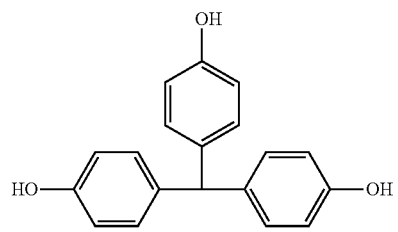
(Formula 4-25-1)
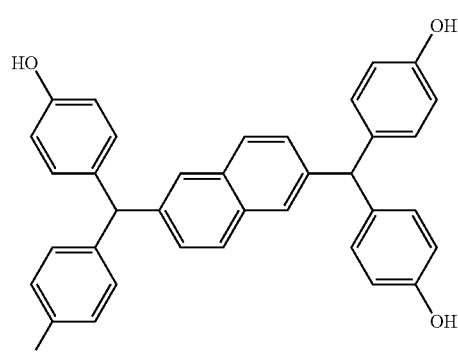
[Chemical formula 30]
(Formula 4-26)
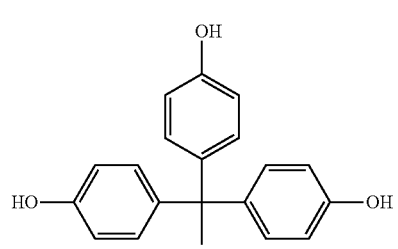
(Formula 4-27)
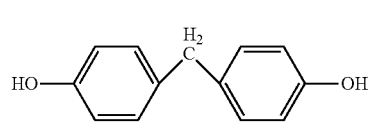
(Formula 4-28)
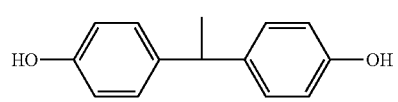
(Formula 4-29)
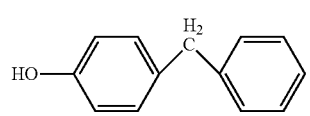
(Formula 4-30)
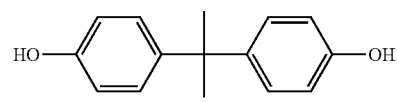
(Formula 4-31)
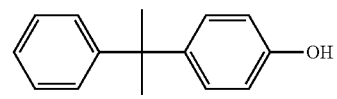
(Formula 4-32)
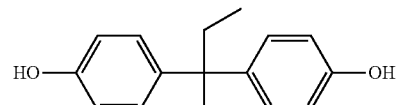
(Formula 4-33)
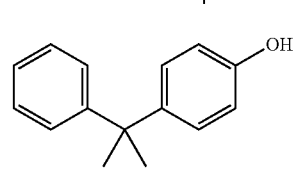
(Formula 4-34)
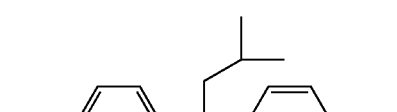
(Formula 4-35)
(Formula 4-36)
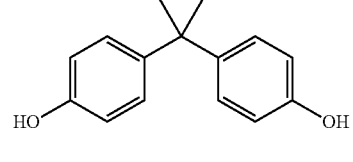
(Formula 4-37)
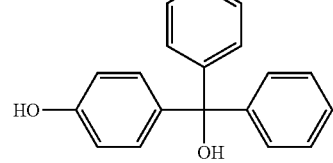
(Formula 4-38)
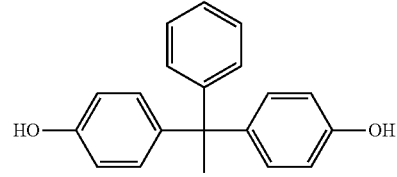

(Formula 4-39)

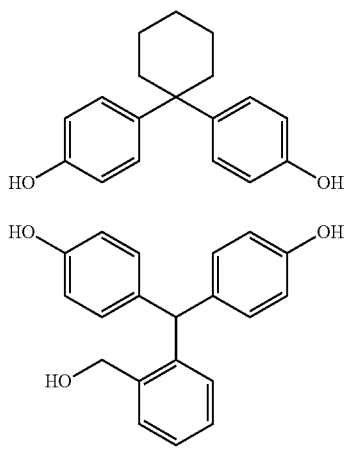

(Formula 4-40)

Especially preferred specific examples of monomers constituting Ar² include compounds having an aldehyde group of the following (formula 6-1) to (formula 6-18) and (formula 5-25) to (formula 5-46) and compounds having a methylol group of the following (formula 7-1) to (formula 7-15).

[Chemical formula 31]

(Formula 6-1)

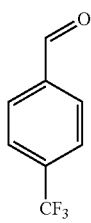

(Formula 6-2)

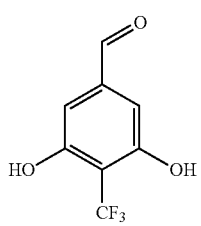

(Formula 6-3)

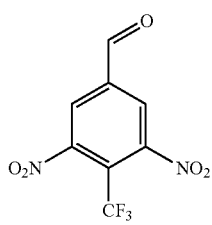

(Formula 6-4)

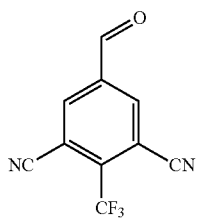

(Formula 6-5)

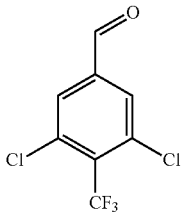

(Formula 6-6)

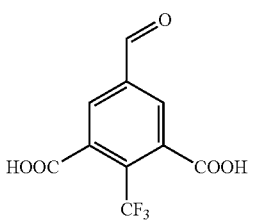

(Formula 6-7)

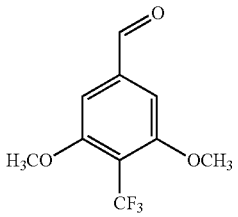

(Formula 6-8)

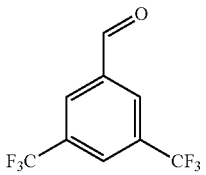

(Formula 6-9)

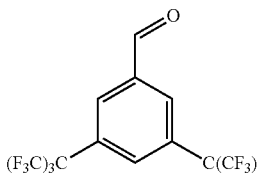

(Formula 6-10)

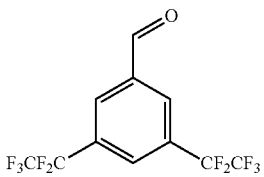

(Formula 6-10)

(Formula 6-11)

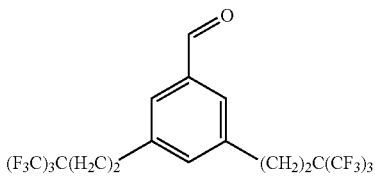

[Chemical formula 32]

(Formula 6-12)

(Formula 6-13)

(Formula 6-14)

(Formula 6-15)

(Formula 6-16)

(Formula 6-17)

(Formula 6-18)

[Chemical formula 33]

(Formula 5-25)

(Formula 5-26)

(Formula 5-27)

(Formula 5-28)

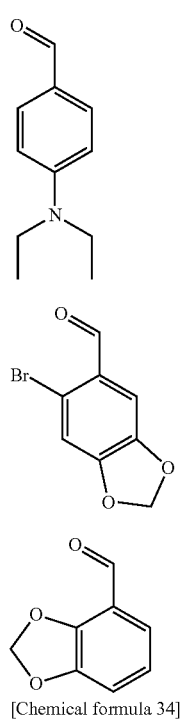
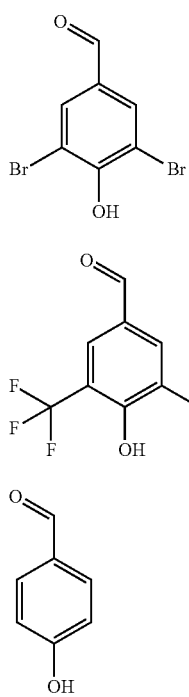
(Formula 5-29)
(Formula 5-30)
[Chemical formula 34]
(Formula 5-31)
(Formula 5-32)
(Formula 5-33)
(Formula 5-34)
(Formula 5-35)
(Formula 5-37)
(Formula 5-38)
(Formula 5-39)
(Formula 5-40)
(Formula 5-41)
(Formula 5-42)
(Formula 5-43)

(Formula 5-44)
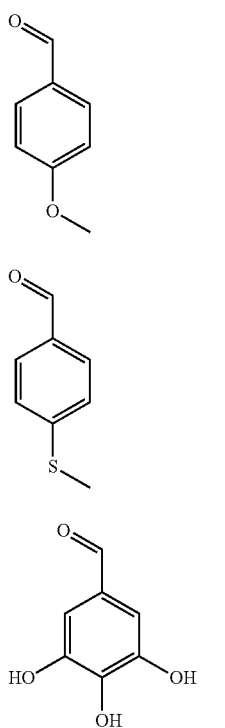
(Formula 5-45)
(Formula 5-46)
[Chemical formula 35]
(Formula 7-1)
(Formula 7-2)
(Formula 7-3)
(Formula 7-4)
(Formula 7-5)
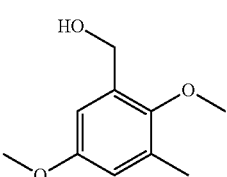
(Formula 7-6)
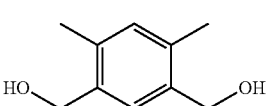
(Formula 7-7)
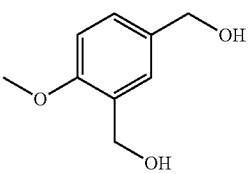
(Formula 7-8)
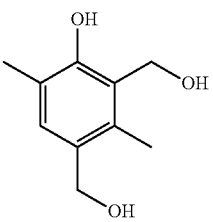
(Formula 7-9)
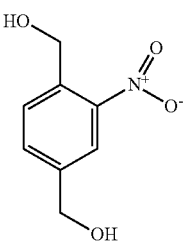
(Formula 7-10)
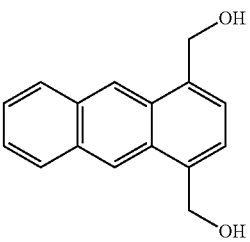
(Formula 7-11)
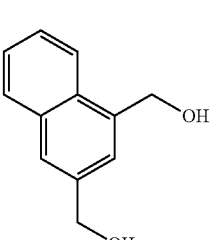

-continued
(Formula 7-12)
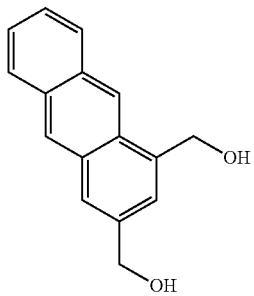
[Chemical formula 36]
(Formula 7-13)
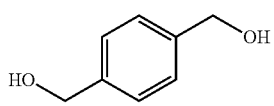
(Formula 7-14)
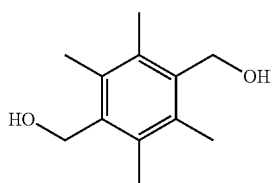
(Formula 7-15)
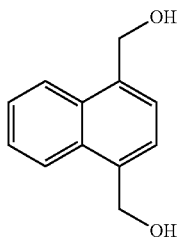
Examples of the unit structures of the novolak polymer in the present invention include (formula 10-1) to (formula 10-37) shown below, but it is not limited to these structures.
[Chemical formula 37]
(Formula 10-1)
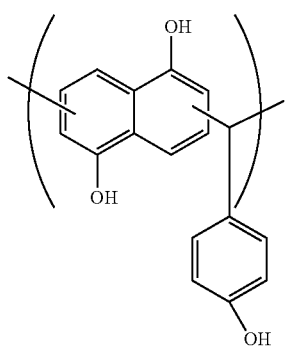
(Formula 10-2)
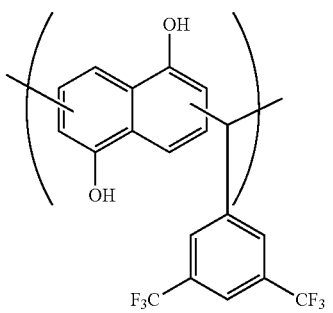
(Formula 10-3)
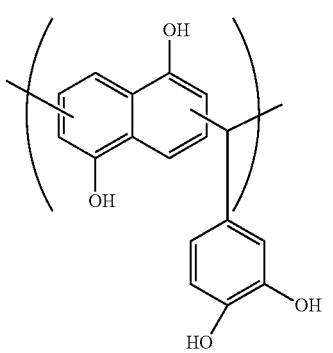
(Formula 10-4)
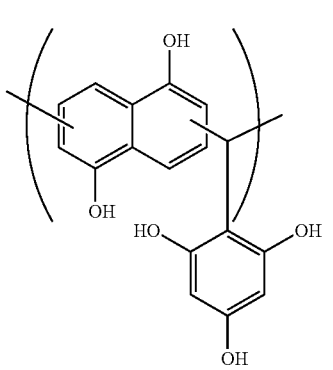
(Formula 10-5)
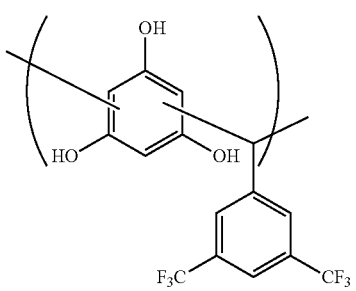

[Chemical formula 38]
(Formula 10-6)
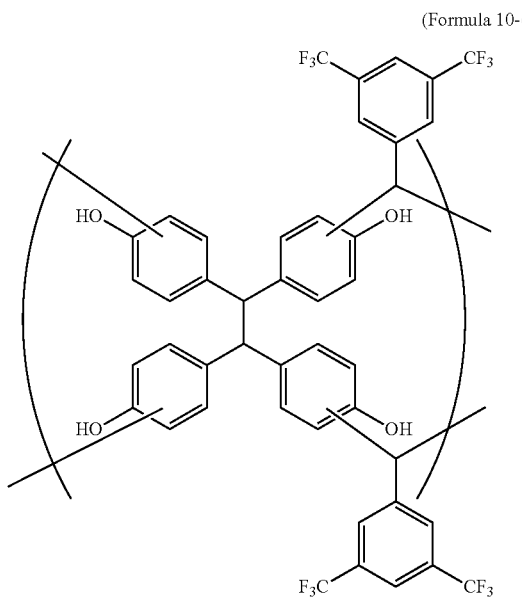
[Chemical formula 39]
(Formula 10-8)
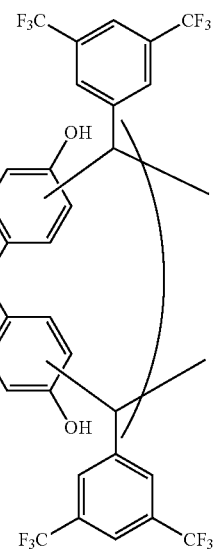
(Formula 10-7)
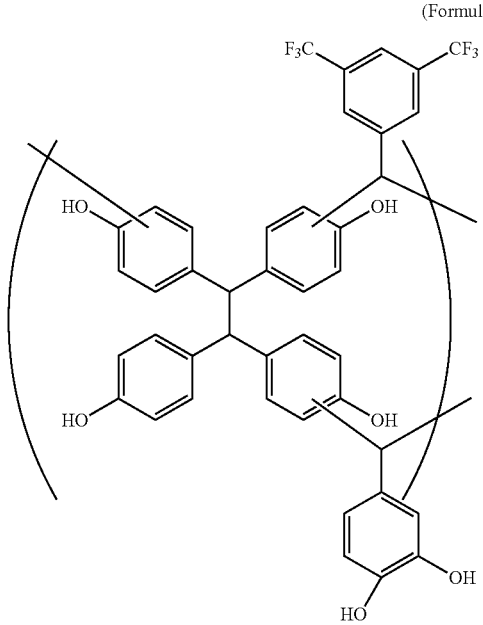
(Formula 10-9)
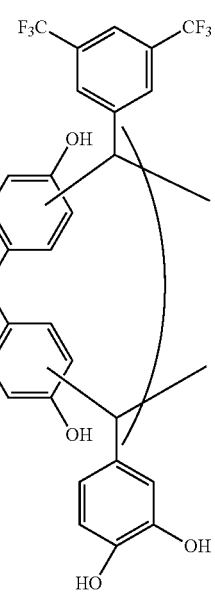

[Chemical formula 40]
(Formula 10-10)
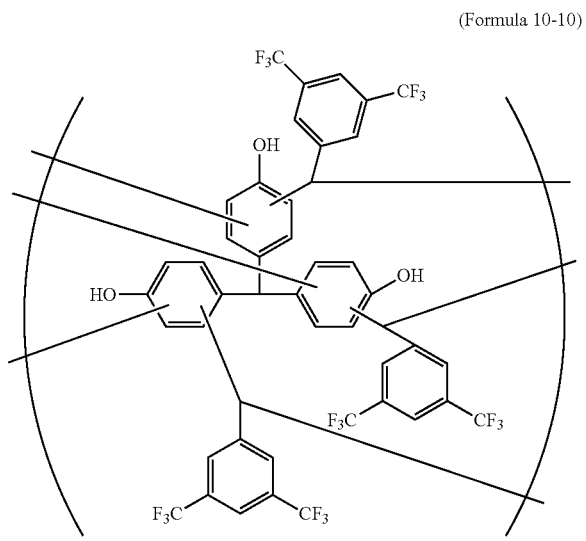
(Formula 10-11)
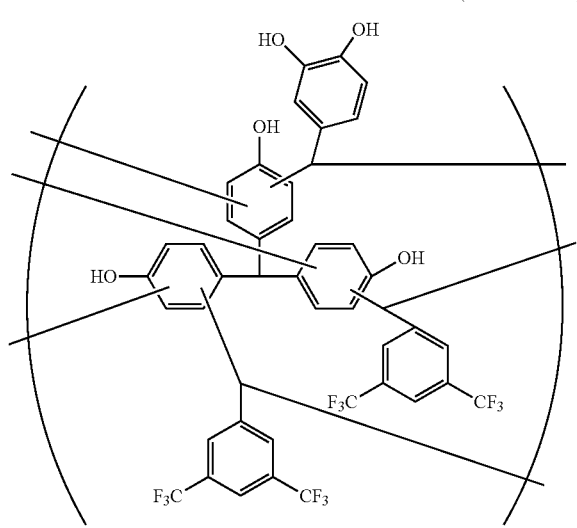
[Chemical formula 41]
(Formula 10-12)
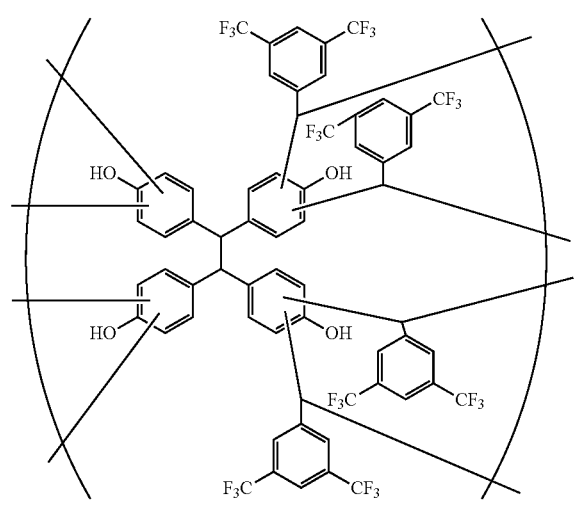
[Chemical formula 42]
(Formula 10-13)
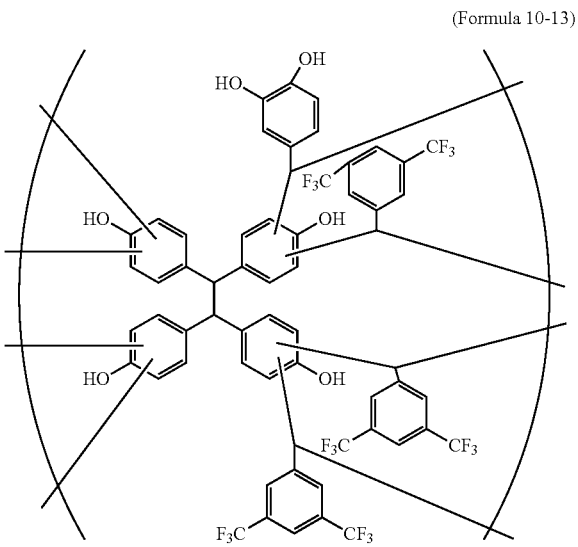
[Chemical formula 43]
(Formula 10-14)
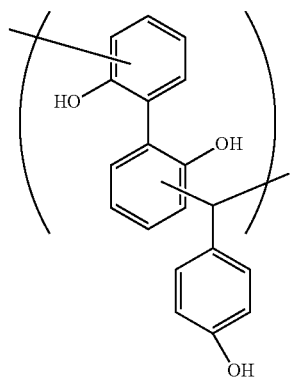
(Formula 10-15)
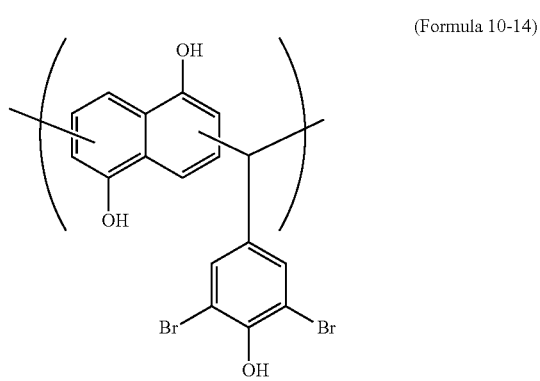

(Formula 10-16)
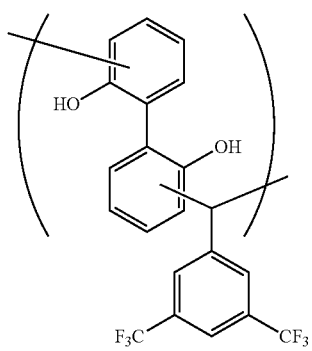
(Formula 10-17)
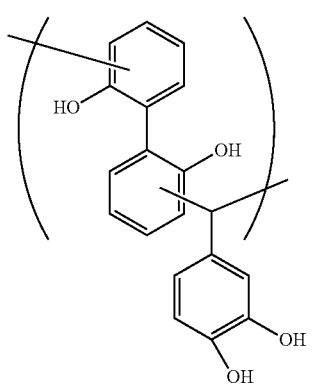
(Formula 10-18)
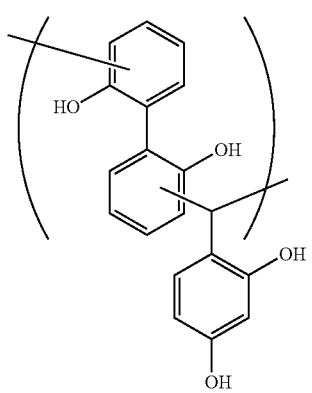
[Chemical formula 44]
(Formula 10-19)
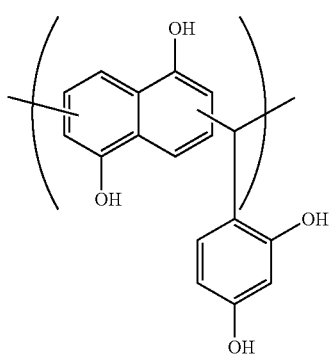
(Formula 10-20)
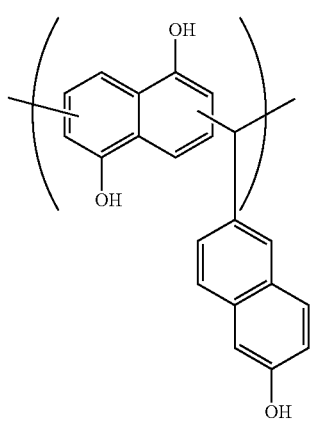
(Formula 10-21)
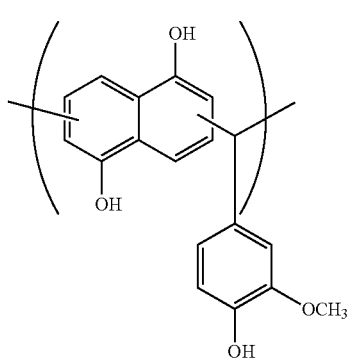
(Formula 10-22)
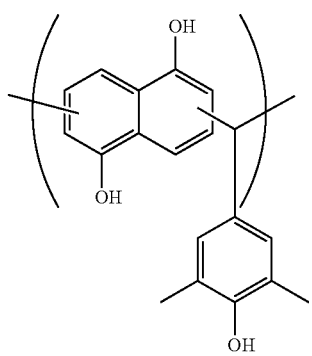
(Formula 10-23)
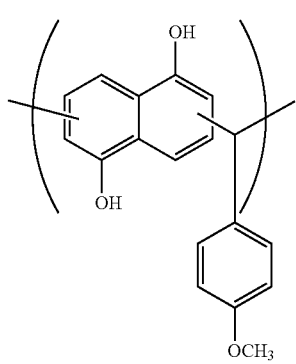

(Formula 10-24)
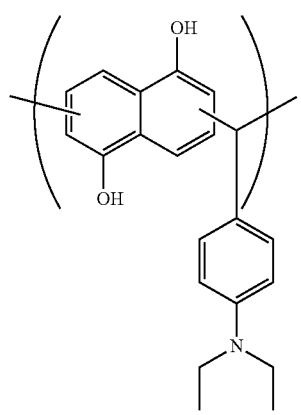
[Chemical formula 45]
(Formula 10-25)
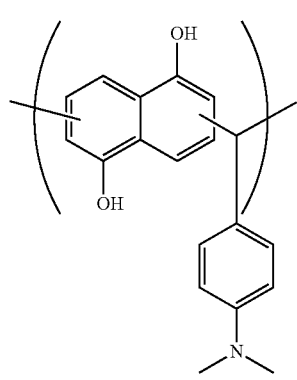
(Formula 10-26)
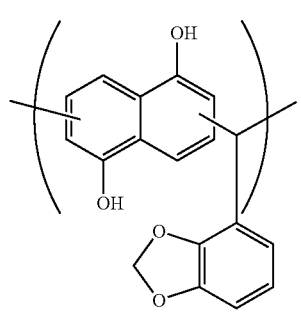
(Formula 10-27)
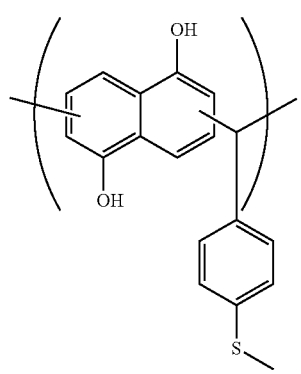
(Formula 10-28)
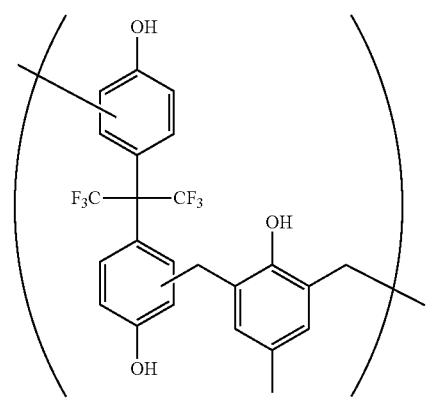
[Chemical formula 46]
(Formula 10-29)
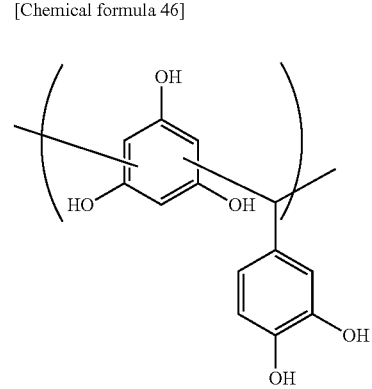
(Formula 10-30)
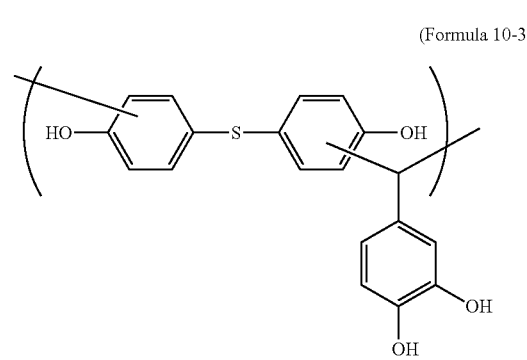
(Formula 10-31)
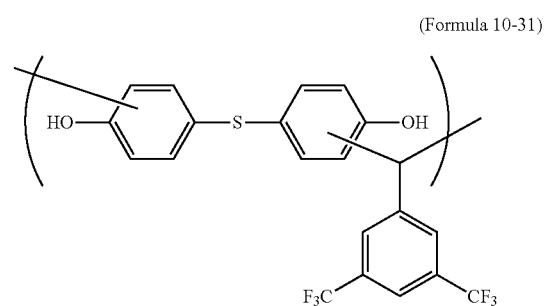

[Chemical formula 47]

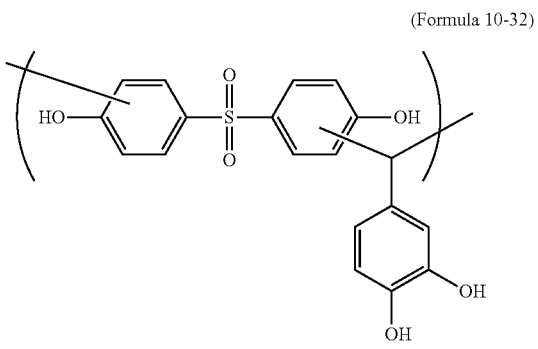
(Formula 10-32)

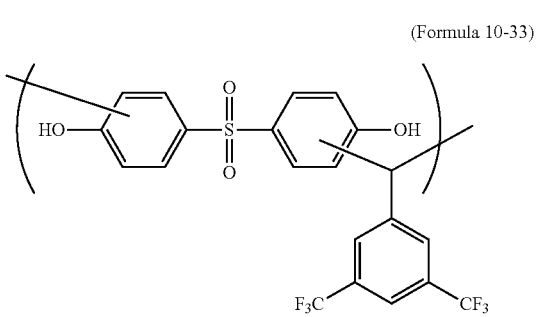
(Formula 10-33)

[Chemical formula 48]

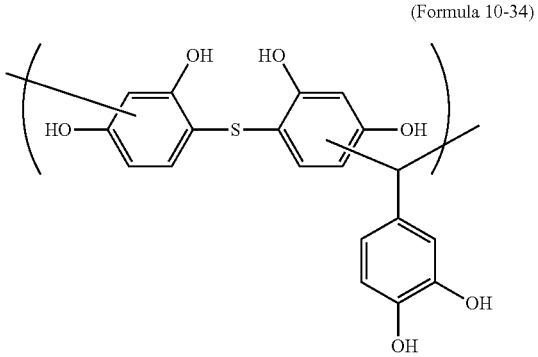
(Formula 10-34)

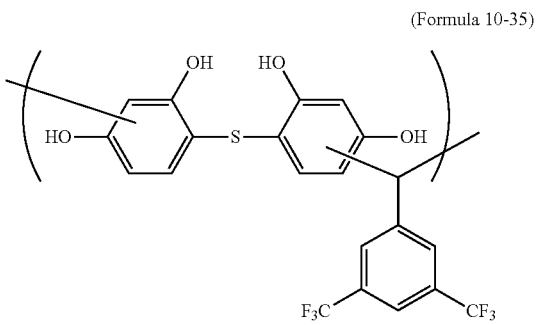
(Formula 10-35)

[Chemical formula 49]

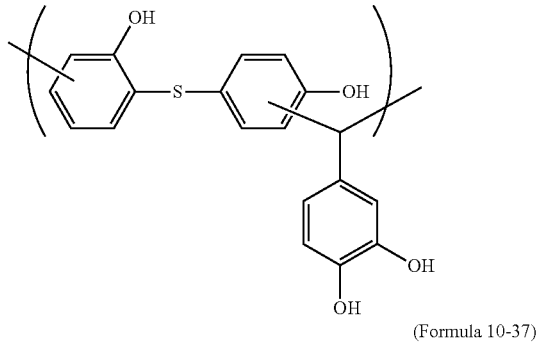
(Formula 10-36)

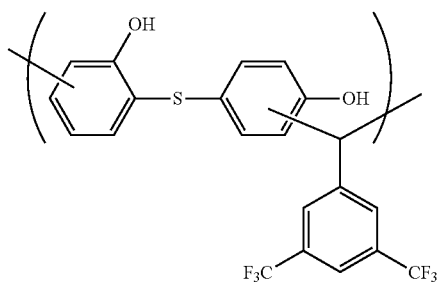
(Formula 10-37)

With respect to the synthesis method for the novolak polymer used in the present invention, it is general to subject "monomer A group", which is a monomer group constituting the above $Ar^1$, and "monomer B group", which is a monomer group constituting the above $Ar^2$, to condensation polymerization in the presence of an acid catalyst.

The monomer A group or monomer B group consists of one type or two or more types of monomers, preferably three types or less, more preferably two types or less of monomers, respectively. The molar ratio of the monomer A group to the monomer B group charged for the synthesis of the polymer, i.e., the monomer A group/monomer B group ratio can be 20/100 to 80/20, more preferably 20/80 to 70/30.

When the monomer A group or monomer B group consists of two or more types of monomers, the molar ratio of charged, fluorine organic group-containing monomers in each of the monomer groups ranges 1/10 to 1, more preferably 1/5 to 1.

Further, the molar ratio of each charged monomer to the monomer A group or monomer B group can be at least 1/20 or more, more preferably 1/10 or more.

In the production of the novolak polymer containing a fluorine organic group in the present invention, the reaction between the monomer A group and the monomer B group is desirably conducted in a nitrogen atmosphere. As the reaction temperature, any temperature can be selected from the range of 50 to 200° C., preferably the range of 80 to 180° C. A novolak polymer having a high molecular weight can be obtained by a reaction for 1 to 48 hours. For obtaining a novolak polymer having a low molecular weight and having high storage stability, a reaction at 80 to 150° C. for 1 to 24 hours is more preferred.

Further, for example, for controlling the absorption wavelength for OOB, the novolak polymer in the present invention may be copolymerized with a cycloalkane compound having 4 to 8 carbon atoms (for example, cyclohexane) or a compound having a structure of, for example, adamantane or norbornene as a third component.

Examples of compounds copolymerizable with the novolak polymer in the present invention include compounds of the following (formula 8-1) to (formula 8-6).

[Chemical formula 50]

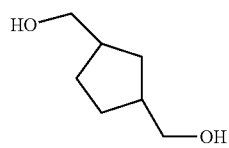
(Formula 8-1)

(Formula 8-2)

(Formula 8-3)

(Formula 8-4)

(Formula 8-5)

(Formula 8-6)

Further, the polymer (P) in the present invention may be (a)an (meth)acrylic polymer comprising repeating units represented by any of the following formulae (4-1) and (4-2).

[Chemical formula 51]

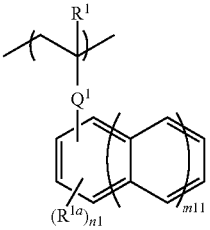
(4-1)

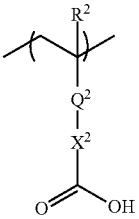
(4-2)

In formulae (4-1) and (4-2), $R^1$ and $R^2$ are the same or different and represent a hydrogen atom or an alkyl group having 1 to 10 carbon atoms, $Q^1$ and $Q^2$ are the same or different and represent a single bond, an ester linkage (—C(=O)—O— or —O—C(=O)—), or an amide linkage (—NH—CO— or —CO—NH—), $X^2$ represents a single bond, an alkylene group having 1 to 6 carbon atoms, or an arylene group having 6 to 14 carbon atoms, $R^{1a}$ represents alkyl group (a1) having 1 to 10 carbon atoms and hydrogen atoms, wherein part or all of the hydrogen atoms may be substituted by a fluorine atom, n1 represents an integer of 1 to 3, and m11 represents an integer of 0 to 2.

Desirably, the respective molar ratios of the unit structures represented by formulae (4-1) and (4-2) to the polymer (P) are as follows:

structure unit of formula (4-1): 30 to 70 mol %,
structure unit of formula (4-2): 20 to 50 mol %.

The aromatic group in formula (4-1) absorbs the DUV light contained in the EUV exposure light. By virtue of the presence of $R^{1a}$, the solubility of the polymer in an ether solvent is improved. When an aqueous alkaline solution is used in the development after exposure for the resist, the carboxyl group in formula (4-2) makes the polymer (P) to be soluble in the aqueous alkaline solution.

Examples of arylene groups having 6 to 14 carbon atoms include a phenylene group, a naphthylene group, an anthracenylene group, and a biphenylene group.

$Q^1$ and $Q^2$ are preferably the same or different and a single bond or an ester linkage (—C(=O)—O— or —O—C(=O)—).

$R^1$ and $R^2$ are preferably selected from a hydrogen atom, a methyl group, an ethyl group, a n-propyl group, an i-propyl group, a n-butyl group, an i-butyl group, a s-butyl group, a t-butyl group, and a 1,1-diethyl-n-propyl group, more preferably selected from a hydrogen atom, a methyl group, and an ethyl group.

$X^2$ is preferably a single bond, a methylene group, an ethylene group, a n-propylene group, a n-butylene group, a phenylene group, or a biphenylene group, most preferably a single bond.

$R^{1a}$ is preferably a methyl group, an ethyl group, a n-propyl group, an i-propyl group, a n-butyl group, an i-butyl group, a s-butyl group, a t-butyl group, a n-pentyl group, a n-hexyl group, a 1-methyl-n-hexyl group, a n-heptyl group, a n-octyl group, a n-nonyl group, a n-decanyl group, a 1,1-diethyl-n-propyl group, a 2-methyl-n-propyl group, or a 2,2'-dimethyl-n-propyl group, most preferably a t-butyl group.

m11 is preferably 0 from the viewpoint of preventing excessive activation of the photo-acid generator present in the resist for the above-mentioned reason to form an excellent resist pattern, and from the viewpoint of the production cost of the polymer (P).

The polymer (P) may further contain a unit structure represented by formula (3) shown below, in addition to the unit structures of formulae (4-1) and (4-2).

[Chemical formula 52]

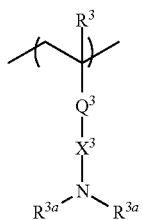

(3)

In formula (3), $R^3$ represents a hydrogen atom or an alkyl group having 1 to 10 carbon atoms, $Q^3$ represents a single bond, an ester linkage (—C(=O)—O— or —O—C(=O)—), or an amide linkage (—NH—CO— or —CO—NH—), $X^3$ represents a single bond, an alkylene group having 1 to 6 carbon atoms, or an arylene group having 6 to 14 carbon atoms, and $R^{3a}$'s are the same or different and represent a hydrogen atom, an alkyl group having 1 to 10 carbon atoms, or an acyl group having 1 to 4 carbon atoms.

Examples of alkyl groups having 1 to 10 carbon atoms include the above-mentioned alkyl groups.

Examples of alkylene groups having 1 to 6 carbon atoms include the above-mentioned alkylene groups.

Examples of arylene groups having 6 to 14 carbon atoms include the above-mentioned arylene groups.

Examples of acyl groups having 1 to 4 carbon atoms include a methanoyl group, an ethanoyl group, a propanoyl group, and a butanoyl group.

$R^3$ is preferably a hydrogen atom, a methyl group, an ethyl group, a n-propyl group, an i-propyl group, a n-butyl group, an i-butyl group, a s-butyl group, or a t-butyl group, especially preferably a hydrogen atom, a methyl group, or an ethyl group.

$Q^3$ is preferably a single bond or an ester linkage (—C(=O)—O— or —O—C(=O)—).

$X^3$ is preferably a single bond, a methylene group, an ethylene group, a n-propylene group, or a n-butylene group.

$R^{3a}$ is preferably a combination of groups selected from a hydrogen atom, a methyl group, an ethyl group, a n-propyl group, an i-propyl group, a n-butyl group, an i-butyl group, a s-butyl group, a t-butyl group, a 1-methyl-n-butyl group, a 2-methyl-n-butyl group, a 3-methyl-n-butyl group, a 1-methyl-n-propyl group, a 2-methyl-n-propyl group, a methanoyl group, and an ethanoyl group.

The polymer (P) having the unit structure of formula (3) can control the shape of the resist due to the basic properties of the side chain of the polymer. Specifically, the interaction of the unit structure with an acid present in the resist used under the composition of the present invention makes it possible to control the shape of the resist after the exposure and development (the shape of the resist obtained after the exposure and development is preferably rectangular). The composition of the present invention containing the polymer (P) having the unit structure of formula (3) can make excellent control of the shape of the resist when the composition is used as such without adding thereto the below-mentioned basic compound, but, if necessary, the composition containing the polymer (P) having the unit structure of formula (3) may further contain a basic compound.

Therefore, the molar ratio of the unit structure of formula (3) to the polymer (P) need not be large, and the molar ratio of the unit structure of formula (3) to the polymer (P) is 0.1 to 50 mol %, more preferably 0.1 to 30 mol %, more preferably 0.1 to 20 mol %, more preferably 0.1 to 10 mol %.

Desirably, the polymer (P), if necessary, further comprises a unit structure represented by formula (4) shown below, in addition to the unit structures of formula (1) and formula (2).

[Chemical Formula 53]

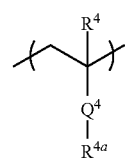

(4)

In formula (4), $R^4$ represents a hydrogen atom or an alkyl group having 1 to 10 carbon atoms, $Q^4$ represents a single bond, an ester linkage (—C(=O)—O— or —O—C(=O)—) or an amide linkage (—NH—CO— or —CO—NH—), and $R^{4a}$ represents an alkyl group having 1 to 10 carbon atoms and hydrogen atoms, wherein part or all of the hydrogen atoms may be substituted by a fluorine atom, or an aryl group having 6 to 14 carbon atoms and hydrogen atoms, wherein part or all of the hydrogen atoms may be substituted by the above-mentioned alkyl group.

The term "the above-mentioned alkyl group" used herein means "an alkyl group having 1 to 10 carbon atoms and hydrogen atoms, wherein part or all of the hydrogen atoms may be substituted by a fluorine atom".

Examples of alkyl groups having 1 to 10 carbon atoms include the above-mentioned alkyl groups, and the alkyl group may have hydrogen atoms, wherein part of or all of the hydrogen atoms may be substituted by a fluorine atom.

Examples of aryl groups having 6 to 14 carbon atoms include a phenyl group, a benzyl group, a naphthyl group, an anthracenyl group, and a biphenyl group.

$R^4$ is preferably a hydrogen atom, a methyl group, an ethyl group, a n-propyl group, an i-propyl group, a n-butyl group, an i-butyl group, a s-butyl group, or a t-butyl group, especially preferably a hydrogen atom, a methyl group, or an ethyl group.

$Q^4$ is preferably a single bond or an ester linkage (—C(=O)—O— or —O—C(=O)—).

$R^{4a}$ is preferably a monovalent organic group structure containing a fluorine atom and being represented by formula (5) below, a mono(trifluoromethyl)phenyl group, or a bis(trifluoromethyl)phenyl group.

The alkyl group having 1 to 10 carbon atoms and hydrogen atoms, wherein part or all of the hydrogen atoms may be substituted by a fluorine atom is preferably the following formula (5):

[Chemical formula 54]

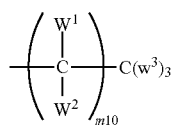
(5)

wherein, in formula (5), each of $W^1$ and $W^2$ independently represents a hydrogen atom, a fluorine atom, a trifluoromethyl group, a difluoromethyl group, or a monofluoromethyl group, $w^3$ represents a hydrogen atom, a fluorine atom, or a combination thereof, wherein at least one of $W^1$, $W^2$, and $w^3$ is a fluorine atom or the fluorine-containing organic group as defined above, and m10 represents an integer of 0 to 9, wherein a number of the carbon atoms contained in formula (5) is at most 10.

Specific examples of the structures represented by formula (5) are represented by any of the following formulae (5-1) to (5-20).

[Chemical formula 55]

| | |
|---|---|
| —$CF_3$ | (5-1) |
| —$C(CF_3)_3$ | (5-2) |
| —$CH_2CF_3$ | (5-3) |
| —$CH(CF_3)_2$ | (5-4) |
| —$CH_2CF_2CF_3$ | (5-5) |
| —$(CH_2)_2(CF_2)_2CF_3$ | (5-6) |
| —$CH_2(CF_2)_2CF_3$ | (5-7) |
| —$(CH_2)_2(CF_2)_4CF_3$ | (5-8) |
| —$(CH_2)_2(CF_2)_6CF_3$ | (5-9) |
| —$(CH_2)_2(CF_2)_6CF_3$ | (5-10) |
| —$C(CF_3)_2(CF_2)_2CF_3$ | (5-11) |
| —$C(CF_3)_2(CF_2)_2CHF_2$ | (5-12) |
| —$C(CF_3)_2(CF_2)_2CH_2F$ | (5-13) |
| —$C(CH_3)(CF_3)(CF_2)_2CF_3$ | (5-14) |
| —$CF_2CF_3$ | (5-15) |
| —$(CF_2)_2CF_3$ | (5-16) |
| —$(CF_2)_3CF_3$ | (5-17) |
| —$(CF_2)_4CF_3$ | (5-18) |
| —$(CF_2)_5CF_3$ | (5-19) |
| —$(CF_2)_9CF_3$ | (5-20) |

Of these, preferred are structures represented by formulae (5-1) to (5-7) or formulae (5-15) to (5-17), and especially preferred is a structure represented by formula (5-4).

The unit structure represented by formula (4) is introduced for controlling the shape of the resist and improving the solubility of the polymer (P) in an ether compound or a ketone compound. Particularly, in the case of a negative resist, the present inventors have found that secondary electrons generated from the side chain represented by $R^{4a}$ due to irradiation with an EUV light or an electron beam are effective in controlling the shape of the resist.

When the composition of the present invention is used as an EUV resist upper-layer film, the unit structure represented by formula (4) contains fluorine atoms, which are known to absorb an EUV light. For this reason, it is not desirable that the polymer (P) contains the unit structure of formula (4) in a large amount. The molar ratio of the unit structure of formula (4) to the polymer (P) is 0.1 to 40 mol %, preferably 0.1 to 30 mol %, more preferably 0.1 to 20 mol %, and still more preferably 0.1 to 10 mol %.

Further, for the above-mentioned reason in connection with the composition of the present invention, if necessary, the polymer (P) desirably further contains the unit structures represented by formulae (3) and (4) above, in addition to the unit structures of formulae (4-1) and (4-2).

The acrylic polymer in the present invention may be further copolymerized with (a)an (meth)acrylic compound other than those mentioned above.

(Method for Producing (a)an (Meth)Acrylic Polymer (P))

A method for producing the polymer (P) having the above-mentioned unit structures is described below in detail.

The method for producing the polymer (P) in the present invention comprises the step of reacting compounds represented by formulae (4-1-a) and (4-2-a) below in a solvent for reaction, wherein the amounts of the respective compounds, based on the mole of the polymer (P), are preferably as follows:

compound represented by formula (4-1-a): 30 to 70 mol %, compound represented by formula (4-2-a): 20 to 50 mol %.

[Chemical formula 56]

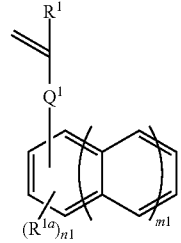
(4-1-a)

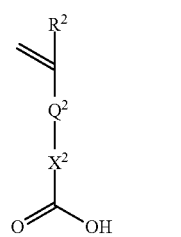
(4-2-a)

In formula (4-1-a) or formula (4-2-a), the definitions and preferred ranges of $R^1$, $R^2$, $X^2$, $R^{1a}$, n1, and m1 are as described above.
Preferred specific examples of the compounds represented by formula (1-a) above include the following formulae (1-1-1) to (1-1-33).
[Chemical formula 57]
(1-1-1)
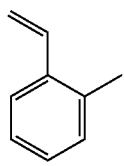
(1-1-2)
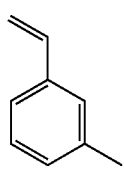
(1-1-3)
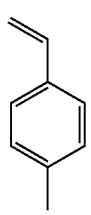
(1-1-4)
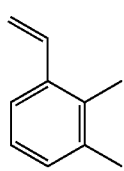
(1-1-5)
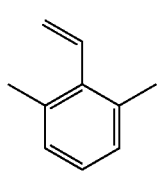
(1-1-6)
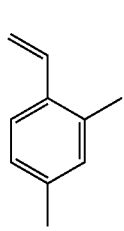
(1-1-7)
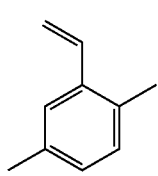
-continued
(1-1-8)
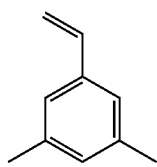
(1-1-9)
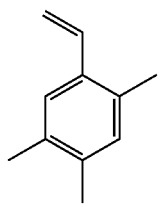
(1-1-10)
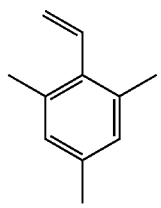
(1-1-11)
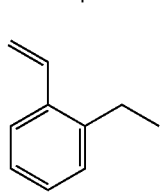
(1-1-12)
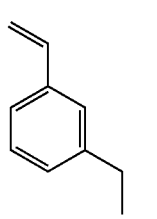
(1-1-13)
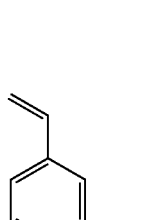
(1-1-14)
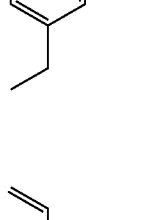
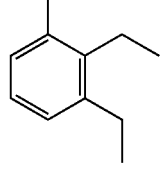

(1-1-15)
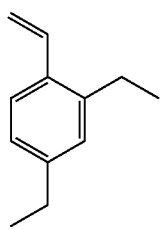
(1-1-16)
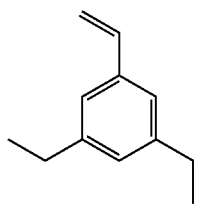
(1-1-17)
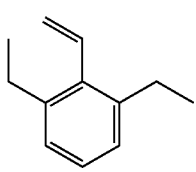
(1-1-18)
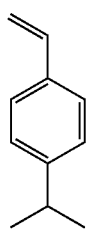
(1-1-19)
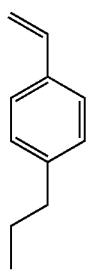
(1-1-20)
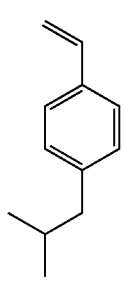
(1-1-21)
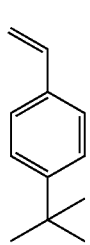
(1-1-22)
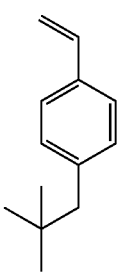
(1-1-23)
(1-1-24)
(1-1-25)

(1-1-26)
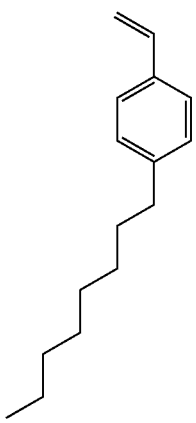
(1-1-27)
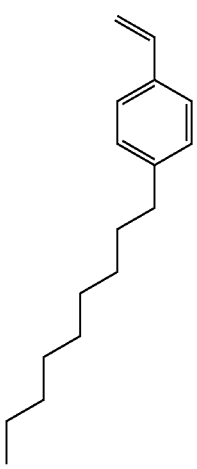
[Chemical formula 58]
(1-1-28)
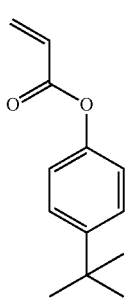
(1-1-29)
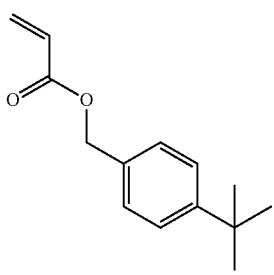
(1-1-30)
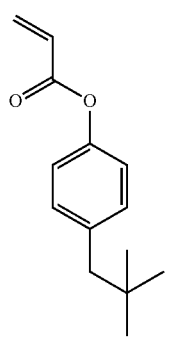
(1-1-31)
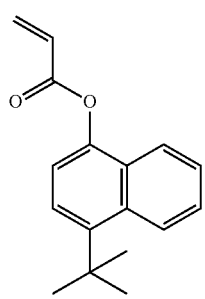
(1-1-32)
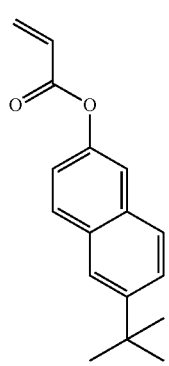
(1-1-33)
Preferred specific examples of the compounds represented by formula (2-a) above include the following formulae (2-1-1) to (2-1-4).
[Chemical formula 59]
(2-1-1)
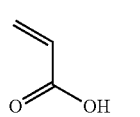

(2-1-2)

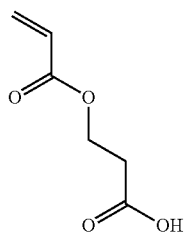

(2-1-3)

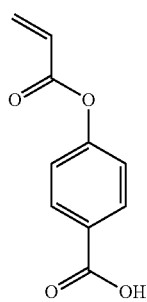

(2-1-4)

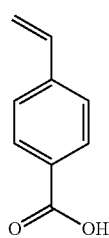

The method for producing the polymer (P) comprises the step of reacting, if necessary, compounds represented by formula (3-a) or/and formula (4-a) below in addition to the compounds of formula (1-a) and formula (2-a) above in a solvent for reaction, wherein the amounts of the respective compounds, based on the mole of the polymer (P), are preferably as follows:

compound represented by formula (4-1-a): 30 to 70 mol %, compound represented by formula (4-2-a): 20 to 50 mol %, compounds represented by formula (3-a) or/and formula (4-a): 0.1 to 40 mol %.

[Chemical formula 60]

(3-a)

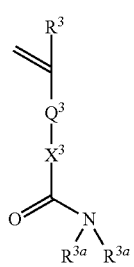

(4-a)

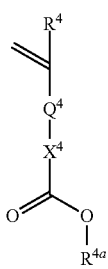

In formula (3-a) or formula (4-a), the definitions and preferred ranges of $R^3$, $R^4$, $X^3$, $X^4$, $R^{3a}$, and $R^{4a}$ are as described above.

Preferred specific examples of the compounds represented by formula (3-a) above include the following formulae (3-2-1) to (3-2-20).

[Chemical formula 61]

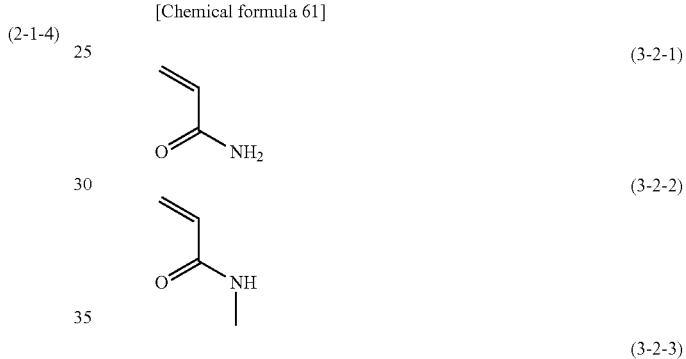

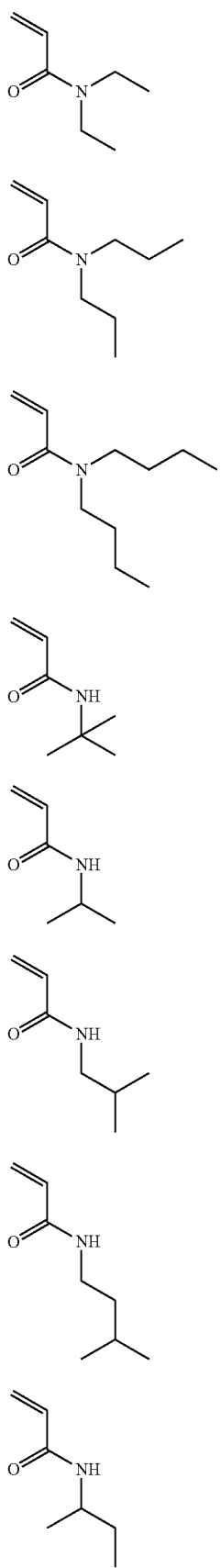
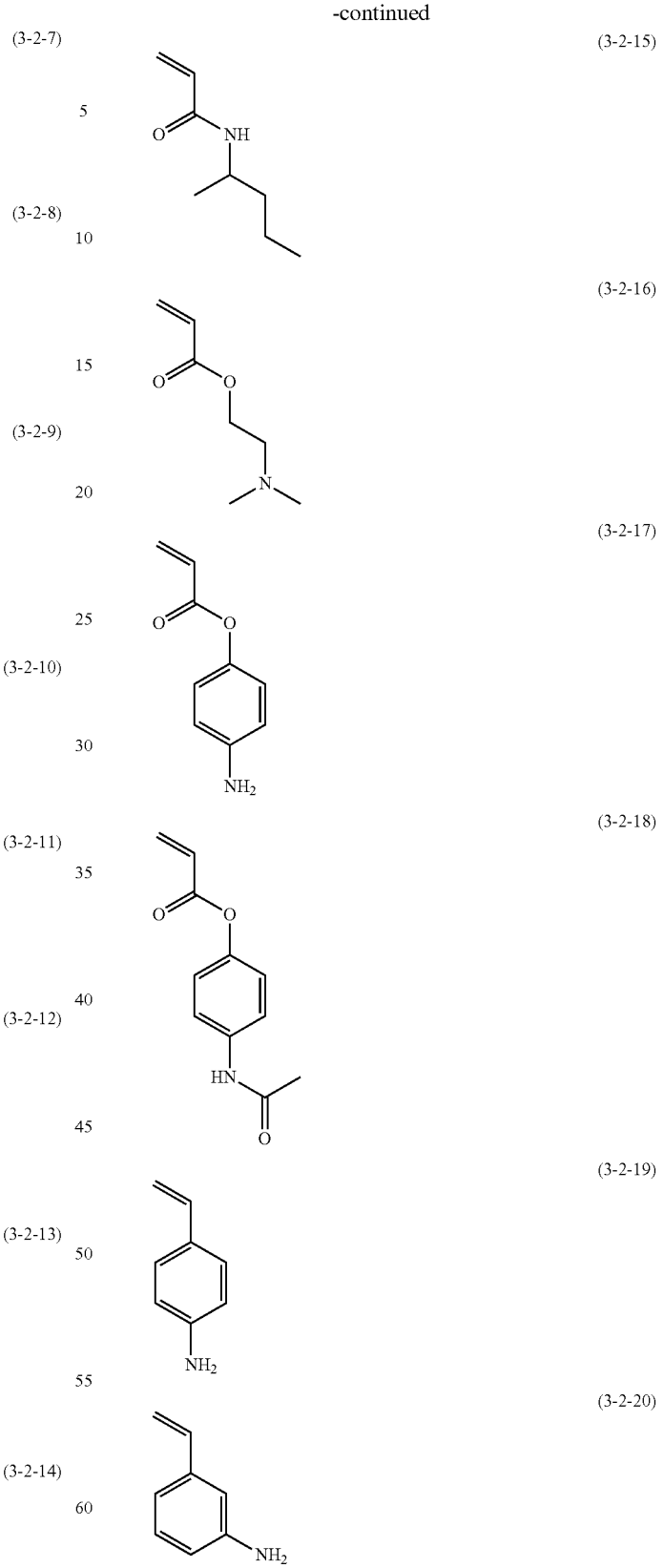
Preferred specific examples of the compounds represented by formula (4-a) above include the following formulae (4-2-1) to (4-2-11).

[Chemical formula 62]

(4-2-1) 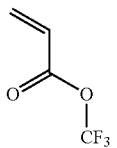

(4-2-2) 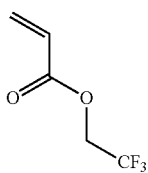

(4-2-3) 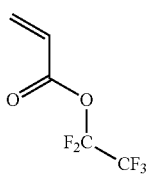

(4-2-4) 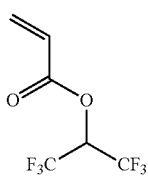

(4-2-5) 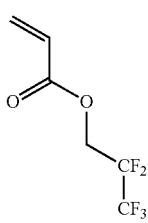

(4-2-6) 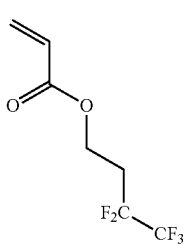

(4-2-7) 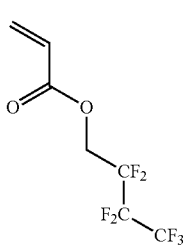

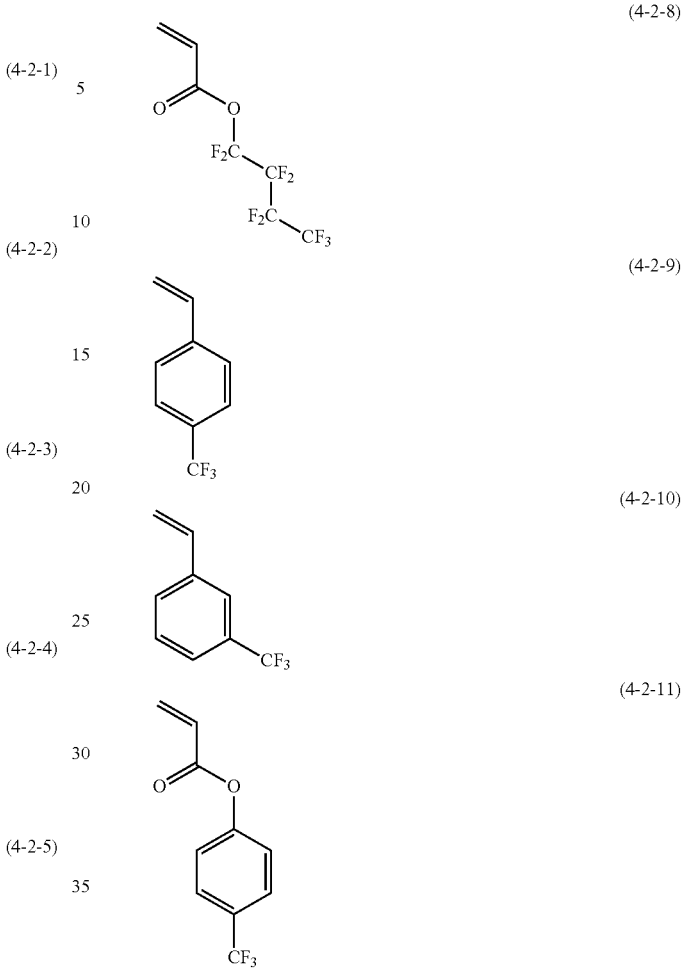

The synthesis method for the above-mentioned acrylic or methacrylic polymer containing a fluorine organic group can be a general synthesis method for an acrylic polymer or a methacrylic polymer. It includes a radical polymerization, anionic polymerization, or cationic polymerization method. Polymerization methods in various forms, such as solution polymerization, suspension polymerization, emulsion polymerization, and bulk polymerization, can be employed.

As a polymerization initiator to be used in the polymerization, for example, 2,2'-azobis(isobutyronitrile), 2,2'-azobis(2-methylbutyronitrile), 2,2'-azobis(2,4-dimethylvaleronitrile), 4,4'-azobis(4-cyanovaleric acid), 2,2'-azobis(2,4-dimethylvaleronitrile), 2,2'-azobis(4-methoxy-2,4-dimethylvaleronitrile), 2,2'-azobis(isobutyronitrile), 1,1'-azobis(cyclohexane-1-carbonitrile), 1-[(1-cyano-1-methylethyl)azo]formamide, 2,2'-azobis[2-(2-imidazolin-2-yl)propane] dihydrochloride, 2,2'-azobis[2-(2-imidazolin-2-yl)propane], or 2,2'-azobis(2-methylpropionamidine) dihydrochloride is used.

As a solvent to be used in the polymerization, for example, dioxane, ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate can be used.

With respect to the reaction conditions, the (meth)acrylic polymer containing a fluorine organic group can be obtained by performing a reaction at 50 to 200° C. for 1 to 48 hours while stirring.

The weight average molecular weight of the polymer (P) used in the present invention, as measured by a GPC (gel permeation chromatography) method, varies depending on, for example, the solvent used for application or the viscosity of the solution, but is, for example, 800 to 10,000, preferably 900 to 8,000, in terms of a weight average molecular weight determined by polystyrene conversion. When the weight average molecular weight of the polymer is 800 or less, the resist upper-layer film using the polymer in the present invention would sometimes diffuse into the photoresist, causing the lithography performance to become poor. When the weight average molecular weight of the polymer is 10,000 or more, the resist upper-layer film formed would sometimes be unsatisfactory in the solubility in a developing agent for photoresist, causing a residue remaining after the development.

The content of the polymer (P) in the composition for forming a resist upper-layer film, in terms of a solid content, is 20% by mass or more, for example, 20 to 100% by mass, 30 to 100% by mass, 50 to 90% by mass, or 60 to 80% by mass.

The solid content of the composition for forming a resist upper-layer film of the present invention is 0.1 to 50% by mass, preferably 0.3 to 30% by mass. The solid content means a content of the components except the solvent component in the composition for forming a resist upper-layer film.

The thus obtained solution containing the polymer (P) can be used as such in preparing the composition for forming a resist upper-layer film. Alternatively, the polymer having a fluorine organic group can be used after being isolated by precipitation in a poor solvent, such as methanol, ethanol, ethyl acetate, hexane, toluene, acetonitrile, or water, or a mixed solvent thereof, and recovered.

The isolated polymer having a fluorine organic group may be re-dissolved as such in a solvent to be used for the composition of the present invention, or may be dried and then used. When the polymer is dried, the conditions for drying are desirably such that the drying is performed using, for example, an oven at 40 to 100° C. for 6 to 48 hours. After the polymer having a fluorine organic group is recovered, the polymer can be re-dissolved in a solvent containing a ketone compound having 4 to 12 carbon atoms, and the resultant solution can be used as a composition for a resist upper-layer film.

It is desirable that the composition for forming a resist upper-layer film of the present invention further comprises an ether compound having 8 to 16 carbon atoms as a solvent.

In such a case, the maximum of the amount of the above-mentioned ketone compound is 13% by mass, based on a total mass of the solvent (b) in the composition of the present invention. Therefore, the maximum of the amount of the ether compound is 87% by mass, based on a total mass of the solvent (b).

The ether compound is represented by a general formula, for example, the following formula (S-2).

[Chemical formula 63]

$$A_1\text{-O-}A_2 \quad (S\text{-}2)$$

In formula (S-2), each of $A_1$ and $A_2$ independently represents an alkyl group having 1 to 15 carbon atoms and optionally being substituted.

Examples of alkyl groups having 1 to 15 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a n-hexyl group, a n-heptyl group, a n-octyl group, a n-nonyl group, a n-decanyl group, a n-undecanyl group, a n-dodecanyl group, a n-tridecanyl group, a n-tetradecanyl group, a n-pentadecanyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group. The alkyl group having 1 to 15 carbon atoms and optionally being substituted means that part of or all of the hydrogen atoms of the hydrocarbon group may be substituted by a halogen atom (a fluorine atom, a chlorine atom, a bromine atom, or an iodine atom).

Of these, preferred examples of ether compounds having 8 to 16 carbon atoms include dibutyl ether, diisobutyl ether, di-tert-butyl ether, dipentyl ether, diisoamyl ether, dihexyl ether, dioctyl ether, and cyclopentyl methyl ether, and further preferred solvents are dibutyl ether, diisobutyl ether, and diisoamyl ether, and most preferred is diisoamyl ether.

These ether compounds can be used alone or in combination.

Further, examples of the solvents used in the composition of the present invention include the following saturated alkyl alcohols and aromatic alcohols.

Examples of saturated alkyl alcohols include 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-i-propanol, 2-methyl-1-butanol, 2-methyl-2-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-i-pentanol, 2-methyl-2-pentanol, 2-methyl-3-pentanol, 3-methyl-1-pentanol, 3-methyl-2-pentanol, 3-methyl-3-pentanol, 4-methyl-i-pentanol, 4-methyl-2-pentanol, 4-methyl-3-pentanol, 1-butoxy-2-propanol, and cyclohexanol.

Examples of aromatic alcohols include 1-phenylpropanol, 2-phenylpropanol, 3-phenylpropanol, 2-phenoxyethanol, phenethyl alcohol, and styrallyl alcohol.

Further, for the convenience of the synthesis of the polymer in the present invention, the organic solvent shown below may be mixed, together with the above-mentioned ether compound having 8 to 16 carbon atoms. As the organic solvent, for example, ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate can be used. These organic solvents are used alone or in combination.

When the above solvent is contained in the composition of the present invention, the total amount of the ether solvent and the above solvent is 87% by mass at most, based on a total mass of the solvent (b).

The composition for forming a resist upper-layer film contains the above-mentioned polymer (P) and ketone compound, and can further contain, for example, an acid compound, a basic compound, a crosslinking agent, a crosslinking catalyst, a surfactant, or a rheology modifier.

The composition for forming a resist upper-layer film of the present invention can further contain an acid compound for achieving the same degree of acidity as that of the underlying resist in the lithography step. As an acid compound, a sulfonic acid compound or a sulfonic acid ester compound can be used. Examples of such compounds include bis(4-hydroxyphenyl) sulfone, p-toluenesulfonic acid, trifluoromethanesulfonic acid, pyridinium p-toluenesulfonate, dodecylbenzenesulfonic acid, and nonafluoro-1-butanesulfonic acid. In addition, an acid compound, such as salicylic acid, sulfosalicylic acid, citric acid, benzoic acid, or hydroxybenzoic acid, and/or a thermal acid generator, such as 2,4,4,6-tetrabromocyclohexadienone, benzoin tosylate, or 2-nitrobenzyl tosylate, can be incorporated into the composition. Of these, from the viewpoint of the solubility in the composition of the present invention, more preferred are dodecylbenzenesulfonic acid and nonafluoro-1-butanesulfonic acid. The amount of the acid compound incorporated is generally 0.02 to 10% by mass, preferably 0.04 to 5% by mass, per 100% by mass of the total solid content.

In the composition for forming a resist upper-layer film of the present invention, for achieving the same degree of acidity as that of the underlying resist in the lithography step, there can be used an acid generator that generates an acid upon exposure (for example, EUV irradiation or electron beam irradiation). Preferred examples of acid generators include onium salt acid generators, such as bis(4-tert-butylphenyl)iodonium trifluoromethanesulfonate and triphenylsulfonium trifluoromethanesulfonate; halogen-containing compound acid generators, such as phenyl-bis(trichloromethyl)-s-triazine; and sulfonic acid-based acid generators, such as benzoin tosylate and N-hydroxysuccinimide trifluoromethanesulfonate. The amount of the acid generator added is generally 0.02 to 10% by mass, preferably 0.04 to 5% by mass, per 100% by mass of the total solid content.

The composition for forming a resist upper-layer film of the present invention can contain a basic compound. By adding a basic compound to the composition, it is possible to control the sensitivity of the resist upon exposure. Specifically, a basic compound, such as an amine, is reacted with an acid generated from a photo-acid generator upon exposure to decrease the sensitivity of the resist lower-layer film, making it possible to control the shape of the upper portion of the resist after the exposure and development (the shape of the resist obtained after the exposure and development is preferably rectangular).

Examples of basic compounds include amines.

Examples of amine compounds include ammonia, tetramethylammonium hydroxide, tetraethylammonium hydroxide, tetrapropylammonium hydroxide, tetrabutylammonium hydroxide, 2-aminophenol, 3-aminophenol, 4-aminophenol, benzyltrimethylammonium hydroxide, benzyltriethylammonium hydroxide, benzyltripropylammonium hydroxide, benzyltributylammonium hydroxide, N-benzyldimethylamine, N-benzyldiethylamine, N-benzylmethylamine, N-benzylethylamine, N-benzylisopropylamine, N-tert-butylbenzylamine, pyridine, 4-methylpyridine, 4-ethylpyridine, 4-isopropylpyridine, 3-fluoropyridine, 4-bromopyridine, 4-fluoropyridine, 4-iodopyridine, 4-aminopyridine, 4-(bromomethyl)pyridine, 4-cyanopyridine, 4-methoxypyridine, N-(4-pyridyl)dimethylamine, 3,4-dimethylpyridine, 4-(methylamino)pyridine, 2-bromo-5-iodopyridine, 2-chloro-4-iodopyridine, 4-(aminomethyl)pyridine, 2,4,6-trimethylpyridine, 2,6-diaminopyridine, 1,5-naphthyridine, diethylamine, dibutylamine, N-tert-butylethylamine, N,N-diethylmethylamine, N-ethylisopropylamine, N-ethylmethylamine, diisopropylamine, N,N-dimethylethylamine, triethylamine, N-diisopropylethylamine, N,N-diethylethylenediamine, ethylamine, 2-(dimethylamino)ethanol, N-methyldiethanolamine, 2-(methylamino)ethanol, triethanolamine, 2-diethylaminoethanol, N-ethyldiethanolamine, diethanolamine, N-tert-butyldiethanolamine, 1-dimethylamino-2-propanol, 2-(diisopropylamino)ethanol, 2-(dimethylamino)isobutanol, 2-(ethylamino)ethanol, 2,2,2-trifluoroethylamine, trifluoroacetamide, N-methyltrifluoroacetamide, bistrifluoroacetamide, N,N-bis(trifluoroacetyl)methylamine, N-methyl-N-trimethylsilyltrifluoroacetamide, pentadecafluorotriethylamine, 4-methylmorpholine, 4-ethylmorpholine, bis(2-morpholinoethyl) ether, 4-(2-aminoethyl)morpholine, N-cyanomethylmorpholine, 4-(2-hydroxyethyl)morpholine, 4-isobutylmorpholine, 4-acetylmorpholine, N-(2-cyanoethyl)morpholine, N-(3-aminopropyl)morpholine, 4-(3-chloropropyl)morpholine, N-(2-hydroxypropyl)morpholine, 4-(3-hydroxypropyl)morpholine, 3-morpholino-1,2-propanediol, 1-morpholino-1-cyclohexene, ethylenediamine, 1,2-propanediamine, 1,3-propanediamine, 2-methyl-1,2-propanediamine, 2,2-dimethyl-1,3-propanediamine, 1,3-butanediamine, 1,4-butanediamine, 1,3-pentanediamine (DAMP), 1,5-pentanediamine, 1,5-diamino-2-methylpentane (MPMD), 2-butyl-2-ethyl-1,5-pentanediamine (C11-neodiamine), 1,6-hexanediamine, 2,5-dimethyl-1,6-hexanediamine, 2,2,4-trimethylhexamethylenediamine (TMD), 2,4,4- trimethylhexamethylenediamine (TMD), 1,7-heptanediamine, 1,8-octanediamine, 1,9-nonanediamine, 1,10-decanediamine, 1,11-undecanediamine, 1,12-dodecanediamine, 1,2-diaminocyclohexane, 1,3-diaminocyclohexane, 1,4-diaminocyclohexane, bis(4-aminocyclohexyl)methane (H12-MDA), bis(4-amino-3-methylcyclohexyl)methane, bis(4-amino-3-ethylcyclohexyl)methane, bis(4-amino-3,5-dimethylcyclohexyl)methane, bis(4-amino-3-ethyl-5-methylcyclohexyl)methane (M-MECA), 1-amino-3-aminomethyl-3,5,5-trimethylcyclohexane (isophoronediamine or IPDA), 2-methyl-1,3-diaminocyclohexane, 4-methyl-1,3-diaminocyclohexane, 1,3-bis(aminomethyl)cyclohexane, 1,4-bis(aminomethyl)cyclohexane, 2,5(2,6)-bis(aminomethyl)bicyclo[2.2.1]heptane (NBDA), 3(4),8(9)-bis(aminomethyl)tricyclo[5.2.1.02,6]decane, 1,4-diamino-2,2,6-trimethylcyclohexane (TMCDA), 1,8-menthanediamine, 3,9-bis(3-aminopropyl)-2,4,8,10-tetraoxaspiro[5.5]undecane, 1,3-xylylenediamine, 1,4-xylylenediamine, bis(2-aminoethyl) ether, 3,6-dioxaoctane-1,8-diamine, 4,7-dioxadecane-1,10-diamine, 4,7-dioxadecane-2,9-diamine, 4,9-dioxadodecane-1,12-diamine, 5,8-dioxadodecane-3,10-diamine, 4-aminomethyl-1,8-octanediamine, 1,3,5-tris(aminomethyl)benzene, 1,3,5-tris(aminomethyl)-cyclohexane, tris(2-aminoethyl)amine, tris(2-aminopropyl)amine, tris(3-aminopropyl)amine, diethylenetriamine (DETA), triethylenetetramine (TETA), tetraethylenepentamine (TEPA), pentaethylenehexamine (PEHA), dipropylenetriamine (DPTA), bishexamethylenetriamine (BHMT), 3-(2-aminoethyl)aminopropylamine (N3-amine), N,N'-bis(3-aminopropyl)ethylenediamine (N4-amine), N3-(3-aminopentyl)-1,3-pentanediamine, N5-(3-aminopropyl)-2-methyl-1,5-pentanediamine, N5-(3-amino-1-ethylpropyl)-2-methyl-1,5-pentanediamine, N,N'-bis(aminopropyl)piperazine, N,N-bis(3-aminopropyl)methylamine, N,N-bis(3-aminopropyl)ethylamine, N,N-bis(3-aminopropyl)propylamine, N,N-bis(3-aminopropyl)cyclohexylamine, N,N-bis(3-aminopropyl)-2-ethylhexylamine, N,N-bis(3-aminopropyl)dodecylamine, N,N-bis(3-aminopropyl)tallowalkylamine, methylamine, ethylamine, 1-propylamine, 2-propylamine, 1-butylamine, 2-butylamine, tert-butylamine, 3-methyl-1-butylamine, 3-methyl-2-butylamine, cyclopentylamine, hexylamine, cyclohexylamine, octylamine, 2-ethyl-i-hexylamine, benzylamine, 1-phenylethylamine, 2-phenylethylamine, decylamine, dodecylamine, tetradecylamine, hexadecylamine, octadecylamine, eicosylamine, docosylamine, cocoalkylamine, C16-C22-alkylamine, soyaalkylamine, oleylamine, tallowalkylamine, 2-methoxyethylamine, 2-ethoxyethylamine, 3-methoxypropylamine, 3-ethoxypropylamine, 3-(2-ethylhexyloxy)propylamine, 3-(2-methoxyethoxy)propylamine, 2(4)-methoxyphenylethylamine, N-methyl-1,2-ethanediamine, N-ethyl-1,2-ethanediamine, N-butyl-1,2-ethanediamine, N-hexyl-1,2-ethanediamine, N-butyl-1,6-hexanediamine, N-cyclohexyl-1,2-ethanediamine, 4-aminomethylpiperidine, 3-(4-aminobutyl)piperidine, N-(2-aminoethyl)piperazine (N-AEP), N-(2-aminopropyl)piperazine, N-methyl-1,3-propanediamine, N-ethyl-1,3-propanediamine, N-butyl-1,3-propanediamine, N-hexyl-1,3-propanediamine, N-(2-ethylhexyl)-1,3-propanediamine, N-dodecyl-1,3-propanediamine, N-cyclohexyl-1,3-propanediamine, 3-methylamino-1-pentylamine, 3-ethylamino-1-pentylamine, 3-butylamino-1-pentylamine, 3-hexylamino-1-pentylamine, 3-(2-ethylhexyl)amino-1-pentylamine, 3-dodecylamino-1-pentylamine, 3-cyclohexylamino-1-pentylamine, N-cocoalkyl-1,3-propanediamine, N-oleyl-1,3-propanediamine, N-soyaalkyl-1,3-propanediamine, N-tallowalkyl-1,3-propanediamine, cocoalkyldipropylenetriamine, oleyldipropylenetriamine, tallowalkyldipropylenetriamine, oleyltripropylenetetramine, tallowalkyltripropylenetetramine, N,N-diethyl-1,2-ethanediamine, N,N-dimethyl-1,3-propanediamine, N,N-diethyl-1,3-propanediamine, N,N-diethyl-1,4-pentanediamine, butylamine, pentylamine, hexylamine, cyclohexylamine, octylamine, decylamine, dodecylamine, tetradecylamine, hexadecylamine, octadecylamine, eicosylamine, docosylamine, 2-ethyl-i-hexylamine, benzylamine, 1-phenylethylamine, 2-phenylethylamine, N-hexyl-1,2-ethanediamine, N-(2-ethylhexyl)-1,2-ethanediamine, N-cyclohexyl-1,2-ethanediamine, N-butyl-1,3-propanediamine, N-hexyl-1,3-propanediamine, N-(2-ethylhexyl)-1,3-propanediamine, N-dodecyl-1,3-propanediamine, N-cyclohexyl-1,3-propanediamine, cocoalkylamine, soyaalkylamine, oleylamine, N-cocoalkyl-1,3-propanediamine, N-oleyl-1,3-propanediamine, and N-soyaalkyl-1,3-propanediamine. More preferred examples include ammonia, tetramethylammonium hydroxide, tetraethylammonium hydroxide, tetrapropylammonium hydroxide, tetrabutylammonium hydroxide, 2-(dimethylamino)ethanol, 2,2,2-trifluoroethylamine, pyridine, and 4-methylmorpholine.

Of these, from the viewpoint of the solubility of the basic compound in the solvent used in the composition of the present invention, preferred is diethylamine, dibutylamine, or triethylamine.

Further, for example, an aminobenzene compound represented by formula (13-1) should be mentioned.

[Chemical formula 64]

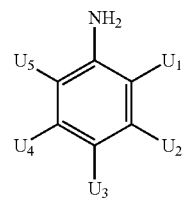

(13-1)

In formula (13-1), each of $U_1$ to $U_5$ is a hydrogen atom, an alkyl group having 1 to 10 carbon atoms, or an amino group.

Examples of the alkyl groups include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-i-methyl-cyclopropyl group, a 2-ethyl-2-methyl-cyclopropyl group, and a 2-ethyl-3-methyl-cyclopropyl group.

Of these, preferred are linear alkyl groups or branched alkyl groups having 1 to 5 carbon atoms, and, preferred examples thereof include a methyl group, an ethyl group, and an isopropyl group.

Examples of the above compounds include the following formulae (13-2) to (13-46).

[Chemical formula 65]

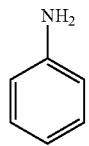

(13-2)

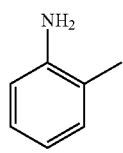

(13-3)

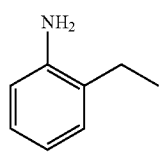

(13-4)

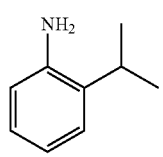

(13-5)

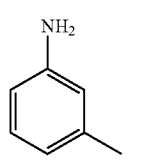

(13-6)

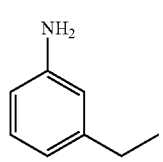

(13-7)

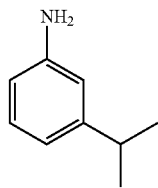

(13-8)

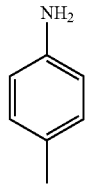

(13-9)

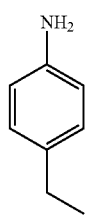

(13-10)

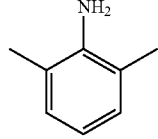

(13-11)

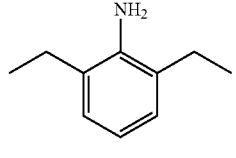

(13-12)

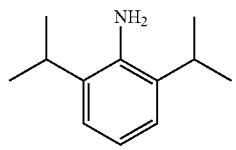

(13-13)

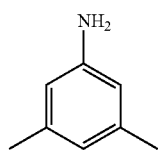

(13-14)

(13-15)

(13-16)

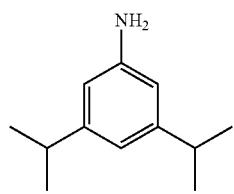 (13-17)
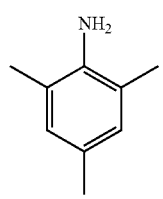 (13-18)
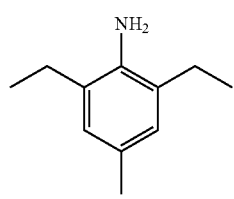 (13-19)
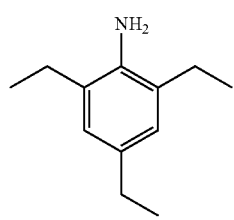 (13-20)
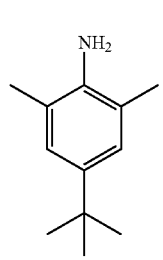 (13-21)
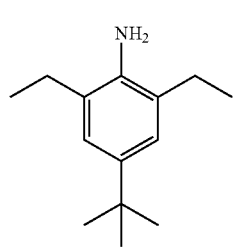 (13-22)
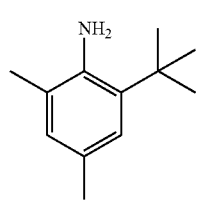 (13-23)
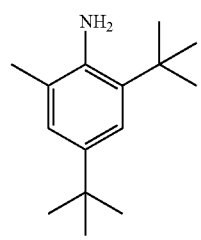 (13-24)
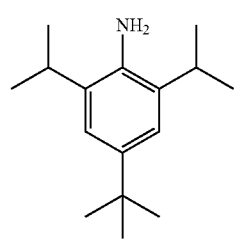 (13-25)
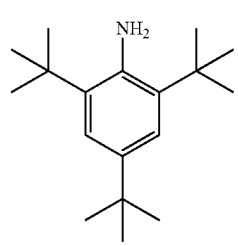 (13-26)
[Chemical formula 66]
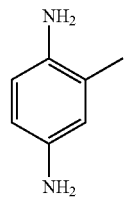 (13-27)
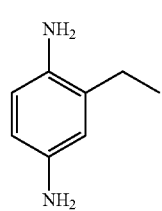 (13-28)
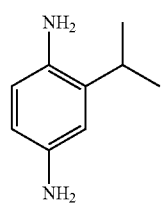 (13-29)
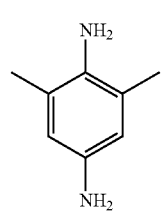 (13-30)

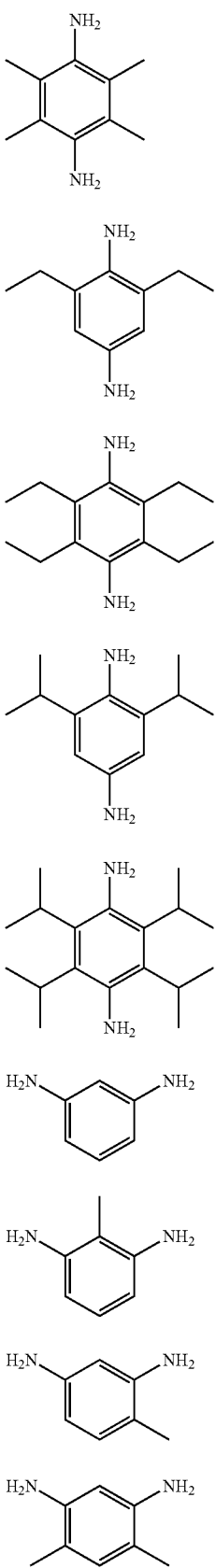
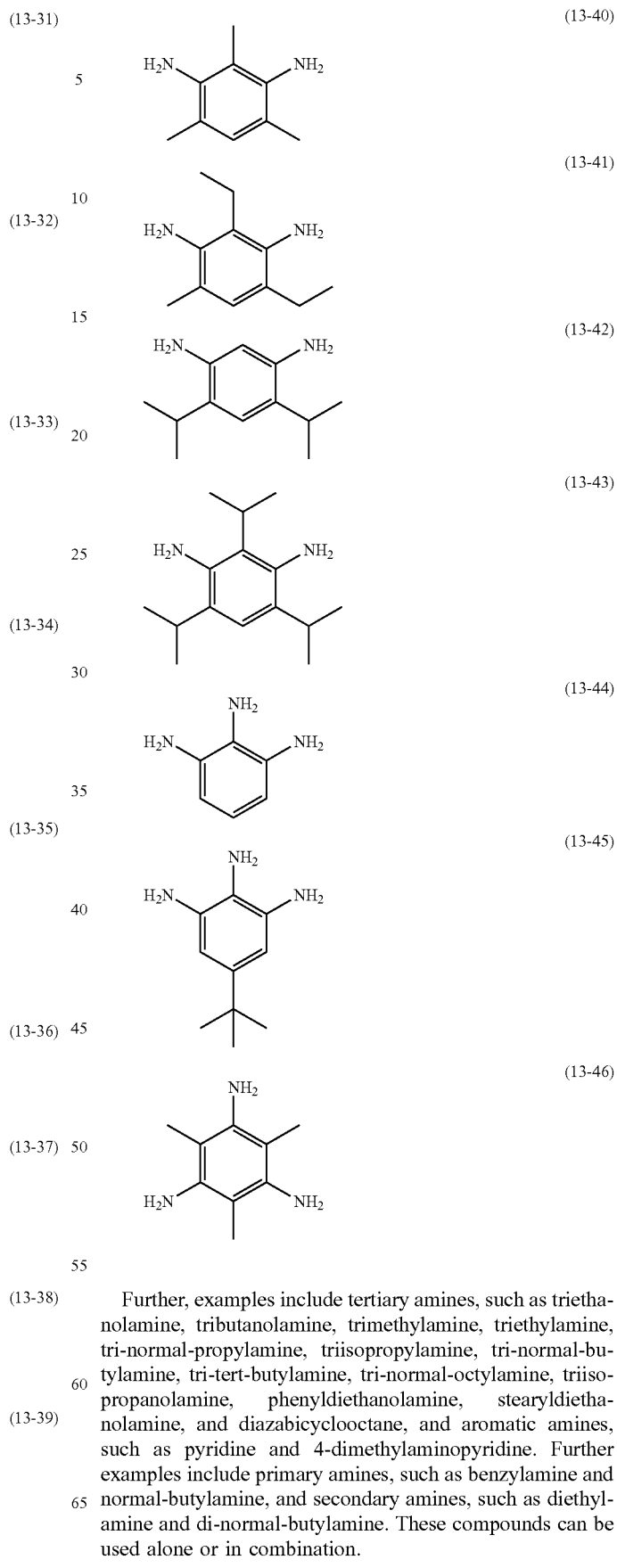

Further, examples include tertiary amines, such as triethanolamine, tributanolamine, trimethylamine, triethylamine, tri-normal-propylamine, triisopropylamine, tri-normal-butylamine, tri-tert-butylamine, tri-normal-octylamine, triisopropanolamine, phenyldiethanolamine, stearyldiethanolamine, and diazabicyclooctane, and aromatic amines, such as pyridine and 4-dimethylaminopyridine. Further examples include primary amines, such as benzylamine and normal-butylamine, and secondary amines, such as diethylamine and di-normal-butylamine. These compounds can be used alone or in combination.

In the composition for forming a resist upper-layer film of the present invention, in addition to the above components, if necessary, for example, a rheology modifier or a surfactant can be further added.

A rheology modifier is added mainly for the purpose of improving the fluidity of the composition for forming a resist upper-layer film. Specific examples of rheology modifiers include phthalic acid derivatives, such as dimethyl phthalate, diethyl phthalate, diisobutyl phthalate, dihexyl phthalate, and butylisodecyl phthalate; adipic acid derivatives, such as di-normal-butyl adipate, diisobutyl adipate, diisooctyl adipate, and octyldecyl adipate; maleic acid derivatives, such as di-normal-butyl maleate, diethyl maleate, and dinonyl maleate; oleic acid derivatives, such as methyl oleate, butyl oleate, and tetrahydrofurfuryl oleate; and stearic acid derivatives, such as normal-butyl stearate and glyceryl stearate. The rheology modifier is generally incorporated into the composition for forming a resist upper-layer film in an amount of less than 30% by mass, per 100% by mass of the composition.

In the composition for forming a resist upper-layer film of the present invention, a surfactant can be incorporated for further improving the application properties so as not to cause surface unevenness and to prevent the occurrence of, for example, pinholes or striation. Examples of surfactants include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP EF301, EF303, EF352 (manufactured by Tohchem Products Co., Ltd.), MEGAFACE F171, F173 (manufactured by DIC Corporation), Fluorad FC430, FC431 (manufactured by Sumitomo 3M), AsahiGuard AG710, Surflon S-382, SC101, SC102, SC103, SC104, SC105, SC106 (manufactured by Asahi Glass Co., Ltd.), and Ftergent series (manufactured by NEOS Co., Ltd.), and organosiloxane polymer KP341 (manufactured by Shin-Etsu Chemical Co., Ltd.). The amount of the surfactant incorporated into the composition for forming a resist upper-layer film of the present invention is generally 0.2% by mass or less, preferably 0.1% by mass or less, per 100% by mass of the composition. These surfactants may be added alone or in combination.

In the present invention, an EUV resist can be used. As the EUV resist applied as a layer underlying the resist upper-layer film in the present invention, any of a negative resist and a positive resist can be used. Examples of EUV include a chemically amplified resist comprising an acid generator and a binder having a functionality that decomposes by an acid to change the alkali dissolution rate, a chemically amplified resist comprising an alkali-soluble binder, an acid generator, and a low molecular-weight compound that decomposes by an acid to change the alkali dissolution rate of the resist, a chemically amplified resist comprising an acid generator, a binder having a functionality that decomposes by an acid to change the alkali dissolution rate, and a low molecular-weight compound that decomposes by an acid to change the alkali dissolution rate of the resist, a non-chemically amplified resist comprising a binder having a functionality that decomposes by an EUV light to change the alkali dissolution rate, and a non-chemically amplified resist comprising a binder having a moiety that cleaves by an EUV light to change the alkali dissolution rate.

For example, materials for the EUV resist include methacrylate materials, PHS materials, and hybrid materials containing both methacrylate and hydroxystyrene (HS). When the above EUV resist is used, a resist pattern can be formed in the same manner as in the case using the resist and using an electron beam as an irradiation source.

In the present invention, an EB (electron beam) resist can be used. With respect to the electron beam resist applied as a layer underlying the resist upper-layer film in the present invention, any of a negative photoresist and a positive photoresist can be used. Examples of electron beam resists include a chemically amplified resist comprising an acid generator and a binder having a functionality that decomposes by an acid to change the alkali dissolution rate, a chemically amplified resist comprising an alkali-soluble binder, an acid generator, and a low molecular-weight compound that decomposes by an acid to change the alkali dissolution rate of the resist, a chemically amplified resist comprising an acid generator, a binder having a functionality that decomposes by an acid to change the alkali dissolution rate, and a low molecular-weight compound that decomposes by an acid to change the alkali dissolution rate of the resist, a non-chemically amplified resist comprising a binder having a functionality that decomposes by an electron beam to change the alkali dissolution rate, and a non-chemically amplified resist comprising a binder having a moiety that cleaves by an electron beam to change the alkali dissolution rate.

As a developing agent for a positive resist having a resist upper-layer film formed using the composition for forming a resist upper-layer film of the present invention, there can be used an aqueous solution of an alkali, for example, an inorganic alkali, such as sodium hydroxide, potassium hydroxide, sodium carbonate, sodium silicate, sodium metasilicate, or aqueous ammonia, a primary amine, such as ethylamine or N-propylamine, a secondary amine, such as diethylamine or di-N-butylamine, a tertiary amine, such as triethylamine or methyldiethylamine, an alcoholamine, such as dimethylethanolamine or triethanolamine, a quaternary ammonium salt, such as tetramethylammonium hydroxide, tetraethylammonium hydroxide, or cholin, or a cyclic amine, such as pyrrole or piperidine. Further, an aqueous solution of the above alkali having added an appropriate amount of an alcohol, such as isopropyl alcohol, or a nonionic surfactant can be used. Of these, preferred developing agents are quaternary ammonium salts, and further preferred are tetramethylammonium hydroxide and cholin.

In the present invention, a semiconductor device can be produced by, for example, a method which comprises the steps of: forming, on a substrate having a film which is to be processed to form a transfer pattern in the film, an EUV resist film using or without using an EUV resist lower-layer film; applying the composition for forming an EUV resist upper-layer film to the resist film and calcining the applied composition to form an EUV resist upper-layer film; subjecting the semiconductor substrate covered with the resist upper-layer film and the resist film to exposure; and subjecting the substrate obtained after the exposure to development to remove the resist upper-layer film and the resist film. The exposure is conducted using an EUV light (wavelength: 13.5 nm).

The formation of the resist upper-layer film is generally conducted by a spin coating method as in, for example, the formation of the resist film. For example, a substrate to be processed (for example, a silicon/silicon dioxide-covered substrate, glass substrate, or ITO substrate) is set in a spin coater, manufactured by Tokyo Electron Limited, and a resist film is formed on the substrate to be processed, and the composition for forming a resist upper-layer film (varnish) is applied to the substrate at the number of spin revolutions of 700 to 3,000 rpm, and then calcined on a hotplate at 50 to 150° C. for 30 to 300 seconds, so that the resist upper-layer film is formed. The thickness of the resist upper-layer film formed is 3 to 100 nm, 5 to 100 nm, or 5 to 50 nm.

Then, a pattern is formed using an appropriate exposure light, and then subjected to development using a resist developing agent to remove an unnecessary portion of the resist and resist upper-layer film, forming a resist pattern. The dissolution rate of the formed resist upper-layer film in a photoresist developing agent is generally 1 nm or more per second, preferably 3 nm or more per second, more preferably 10 nm or more per second. When the dissolution rate of the resist upper-layer film is smaller than the above range, it is likely that a prolonged period of time is required for removing the resist upper-layer film, causing the productivity to lower.

A semiconductor device to which the composition for forming an EUV resist upper-layer film of the present invention is applied has a construction in which a film to be processed to which a pattern is transferred, a resist film, and a resist upper-layer film are successively formed on a substrate. The resist upper-layer film reduces an adverse effect by the base substrate or an EUV light to form an excellent resist pattern having a straight form, so that a satisfactory margin for the EUV irradiation dose can be obtained.

Further, the resist upper-layer film has a wet etching rate equivalent to or larger than that of the underlying resist film, and can be easily removed, together with the unnecessary portion of the resist film after the exposure, using, for example, an alkaline developing agent.

Further, the substrate to be processed for the semiconductor device can be processed by any step of dry etching and wet etching, and an excellent form can be transferred to the substrate by dry etching or wet etching using as a mask a resist pattern advantageously formed using the resist upper-layer film.

In the present invention, a semiconductor device can be produced by, for example, a method which comprises the steps of: forming, on a substrate having a film which is to be processed to form a transfer pattern in the film, an electron beam resist film using or without using an electron beam resist lower-layer film; applying the composition for forming an electron beam resist upper-layer film to the resist film and calcining the applied composition to form an electron beam resist upper-layer film; subjecting the semiconductor substrate covered with the resist upper-layer film and the resist film to exposure; and subjecting the substrate obtained after the exposure to development to remove the resist upper-layer film and the resist film. The exposure is conducted using an electron beam. The formation of the resist upper-layer film is conducted in the same manner as in the case using the above-mentioned EUV exposure.

Further, the composition of the present invention is produced through the step of mixing the polymer (P) and a ketone compound having 4 to 12 carbon atoms as a solvent. The polymer (P) is synthesized, and then a ketone compound having 4 to 12 carbon atoms as a solvent is added to the polymer (P), and the resultant mixture is stirred and mixed by a known method, and subjected to filtration using a microfilter (for example, a polyethylene microfilter with a pore size of 0.05 μm), to produce the composition.

EXAMPLES

The weight average molecular weight (Mw) of the polymer shown in the following Synthesis Examples 1 to 11 of the present specification is the result of the measurement made by a GPC (gel permeation chromatography) method. In the measurement, a GPC apparatus, manufactured by Tosoh Corp., is used, and the conditions for the measurement are as shown below. Further, the polydispersity index shown in the following Synthesis Examples of the present specification is calculated from the measured weight average molecular weight and number average molecular weight.

Measurement apparatus: HLC-8320GPC (trade name) (manufactured by Tosoh Corp.)

GPC column: TSKgel SuperMultipore HZ-N(P0009) (trade name) (manufactured by Tosoh Corp.)

TSKgel SuperMultipore HZ-N(P0010) (trade name) (manufactured by Tosoh Corp.)

Column temperature: 40° C.

Solvent: Tetrahydrofuran (THF)

Flow rate: 0.35 ml/minute

Standard sample: Polystyrene (manufactured by Tosoh Corp.)

Synthesis Example 1

In a reaction vessel, 3.5 g of 1,5-dihydroxynaphthalene (manufactured by Tokyo Chemical Industry Co., Ltd.), 1.2 g of 3,4-dihydroxybenzaldehyde (manufactured by Tokyo Chemical Industry Co., Ltd.), 3.6 g of 3,5-bis(trifluoromethyl)benzaldehyde (manufactured by Tokyo Chemical Industry Co., Ltd.), and 0.43 g of p-toluenesulfonic acid monohydrate were added to and dissolved in 33.2 g of propylene glycol monomethyl ether. The reaction vessel was purged with nitrogen gas, and then the mixture in the vessel was subjected to reaction at 140° C. for 4 hours to obtain a polymer solution. The resultant reaction solution was subjected to precipitation in a water/methanol mixed solvent to obtain brown polymer (P-1). A GPC analysis was made, and the result of the analysis showed that the obtained polymer had a weight average molecular weight of 2,300.

Polymer (P-1) is presumed to have a structure of the following formula (P-1).

[Chemical formula 67]

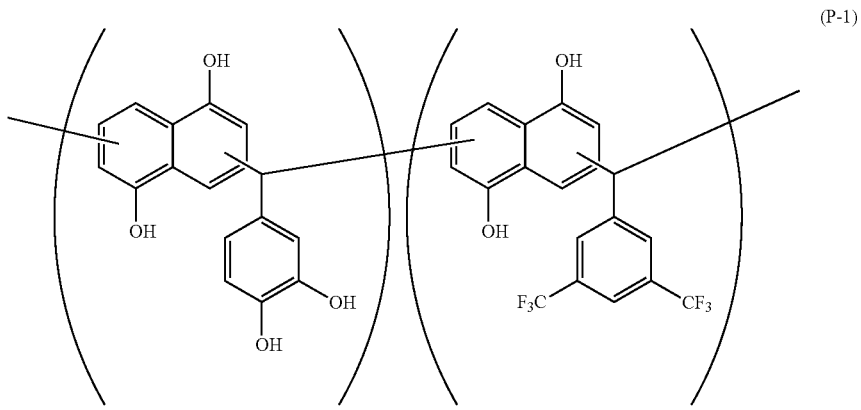

(P-1)

Synthesis Example 2

In a reaction vessel, 7.5 g of phloroglucinol (manufactured by Tokyo Chemical Industry Co., Ltd.), 3.6 g of 3,4-dihydroxybenzaldehyde (manufactured by Tokyo Chemical Industry Co., Ltd.), 7.2 g of 3,5-bis(trifluoromethyl)benzaldehyde (manufactured by Tokyo Chemical Industry Co., Ltd.), and 2.36 g of p-toluenesulfonic acid monohydrate were added to and dissolved in 31.05 g of propylene glycol monomethyl ether. The reaction vessel was purged with nitrogen gas, and then the mixture in the vessel was subjected to reaction at 140° C. for 6 hours to obtain a polymer solution. The resultant reaction solution was subjected to precipitation in a water/methanol mixed solvent to obtain brown polymer (P-2). A GPC analysis was made, and the result of the analysis showed that the obtained polymer had a weight average molecular weight of 1,700.

Polymer (P-2) is presumed to have a structure of the following formula (P-2).

Synthesis Example 3

In a reaction vessel, 5.0 g of 1,1,2,2-tetrakis(4-hydroxyphenyl)ethane (product name: TEP-DF; manufactured by Asahi Organic Chemicals Industry Co., Ltd.), 0.34 g of 3,4-dihydroxybenzaldehyde (manufactured by Tokyo Chemical Industry Co., Ltd.), 5.46 g of 3,5-bis(trifluoromethyl)benzaldehyde (manufactured by Tokyo Chemical Industry Co., Ltd.), and 1.0 g of p-toluenesulfonic acid monohydrate were added to and dissolved in 17.7 g of propylene glycol monomethyl ether. The reaction vessel was purged with nitrogen gas, and then the mixture in the vessel was subjected to reaction at 140° C. for 4 hours to obtain a polymer solution. The resultant reaction solution was subjected to precipitation in a water/methanol mixed solvent to obtain yellow polymer (P-3). A GPC analysis was made, and the result of the analysis showed that the obtained polymer had a weight average molecular weight of 4,800.

Polymer (P-3) is presumed to have a structure of the following formula (P-3).

[Chemical formula 68]

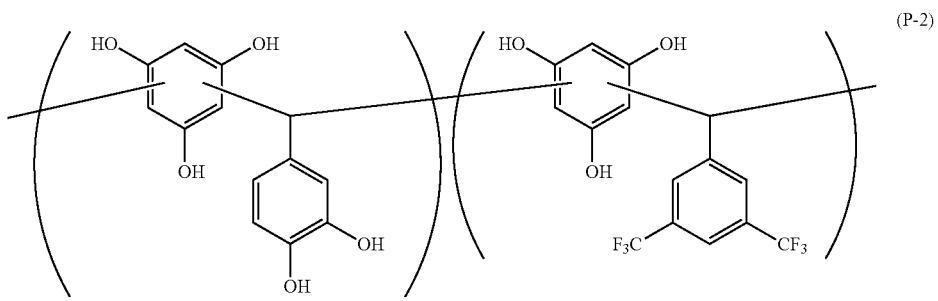

(P-2)

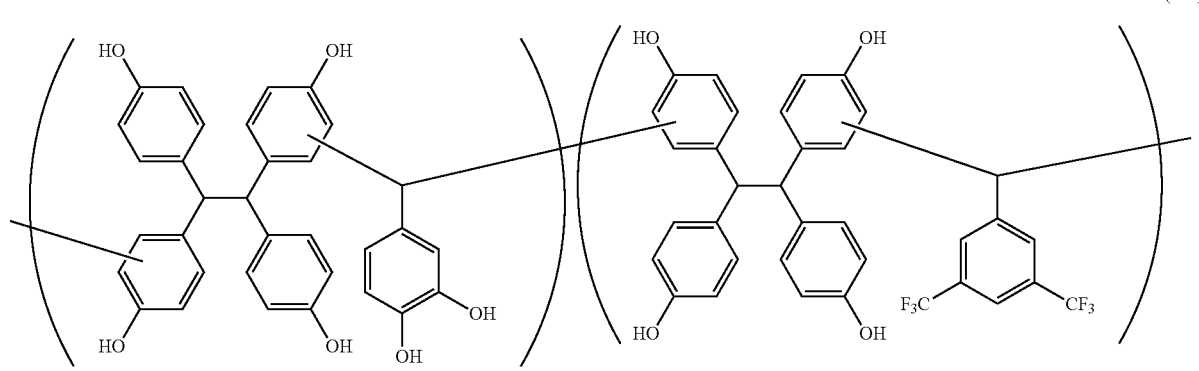

(P-3)

Synthesis Example 4

In a reaction vessel, 5.0 g of 1,1,1-tris(4-hydroxyphenyl) ethane (manufactured by Tokyo Chemical Industry Co., Ltd.), 0.34 g of 3,4-dihydroxybenzaldehyde (manufactured by Tokyo Chemical Industry Co., Ltd.), 5.33 g of 3,5-bis (trifluoromethyl)benzaldehyde (manufactured by Tokyo Chemical Industry Co., Ltd.), and 0.5 g of p-toluenesulfonic acid monohydrate were added to and dissolved in 44.8 g of propylene glycol monomethyl ether acetate. The reaction vessel was purged with nitrogen gas, and then the mixture in the vessel was subjected to reaction at 140° C. for 4 hours to obtain a polymer solution. The resultant reaction solution was subjected to precipitation in a water/methanol mixed solvent to obtain black polymer (P-4). A GPC analysis was made, and the result of the analysis showed that the obtained polymer had a weight average molecular weight of 2,449.

Polymer (P-4) is presumed to have a structure of the following formula (P-4).

Synthesis Example 5

20.00 g of 4-tert-butylstyrene (manufactured by Tokyo Chemical Industry Co., Ltd.) and 7.16 g of methacrylic acid (manufactured by Tokyo Chemical Industry Co., Ltd.) were dissolved in 182 g of ethyl lactate and the resultant solution was heated under reflux. To the solution obtained after heating under reflux was dropwise added slowly a solution prepared by dissolving 1.71 g of azobisisobutyronitrile in 78.0 g of ethyl lactate. After completion of the dropwise addition, the resultant mixture was subjected to reaction at 160° C. for 24 hours while heating under reflux to obtain a solution containing a polymer. The resultant reaction solution was subjected to precipitation in a water/methanol mixed solvent to obtain white polymer (P-5). A GPC analysis was made, and the result of the analysis showed that the obtained polymer had a weight average molecular weight of 1,800.

[Chemical formula 70]

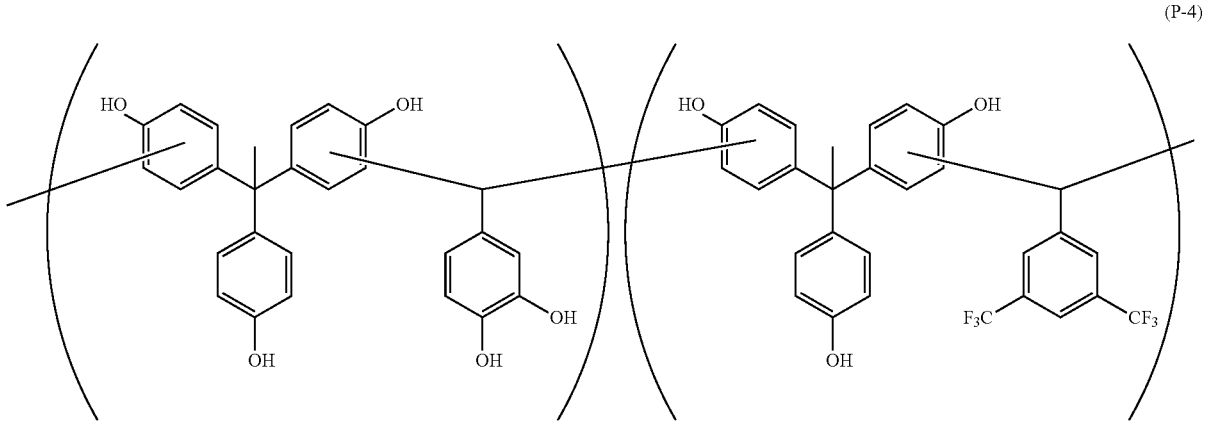

(P-4)

Polymer (P-5) is presumed to have a structure of the following formula (P-5).

[Chemical formula 71]

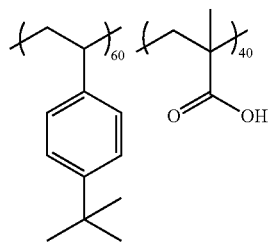

(P-5)

Synthesis Example 6

20.00 g of 4-tert-butylstyrene (manufactured by Tokyo Chemical Industry Co., Ltd.), 8.60 g of methacrylic acid (manufactured by Tokyo Chemical Industry Co., Ltd.), and 2.82 g of N-isopropylacrylamide (manufactured by Tokyo Chemical Industry Co., Ltd.) were dissolved in 211 g of ethyl lactate and the resultant solution was heated under reflux. To the solution obtained after heating under reflux was dropwise added slowly a solution prepared by dissolving 2.05 g of azobisisobutyronitrile in 90.4 g of ethyl lactate. After completion of the dropwise addition, the resultant mixture was subjected to reaction at 160° C. for 24 hours while heating under reflux to obtain a solution containing a polymer. The resultant reaction solution was subjected to precipitation in a water/methanol mixed solvent to obtain yellowish white polymer (P-6). A GPC analysis was made, and the result of the analysis showed that the obtained polymer had a weight average molecular weight of 2,500.

Polymer (P-6) is presumed to have a structure of the following formula (P-6).

[Chemical formula 72]

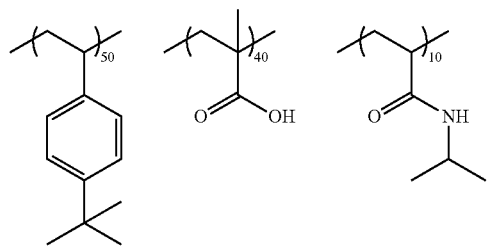

(P-6)

Synthesis Example 7

20.00 g of 4-tert-butylstyrene (manufactured by Tokyo Chemical Industry Co., Ltd.), 8.60 g of methacrylic acid (manufactured by Tokyo Chemical Industry Co., Ltd.), and 5.89 g of 1,1,1,3,3,3-hexafluoroisopropyl methacrylate (manufactured by Tokyo Chemical Industry Co., Ltd.) were dissolved in 230 g of ethyl lactate and the resultant solution was heated under reflux. To the solution obtained after heating under reflux was dropwise added slowly a solution prepared by dissolving 2.05 g of azobisisobutyronitrile in 98.7 g of ethyl lactate. After completion of the dropwise addition, the resultant mixture was subjected to reaction at 160° C. for 24 hours while heating under reflux to obtain a solution containing a polymer. The resultant reaction solution was subjected to precipitation in a water/methanol mixed solvent to obtain white polymer (P-7). A GPC analysis was made, and the result of the analysis showed that the obtained polymer had a weight average molecular weight of 2,600.

Polymer (P-7) is presumed to have a structure of the following formula (P-7).

[Chemical formula 73]

Synthesis Example 8

In a reaction vessel, 5.0 g of 1,5-dihydroxynaphthalene (manufactured by Tokyo Chemical Industry Co., Ltd.), 6.99 g of 3,5-dibromo-4-hydroxybenzaldehyde (manufactured by Tokyo Chemical Industry Co., Ltd.), 1.5 g of 3,5-bis(trifluoromethyl)benzaldehyde (manufactured by Tokyo Chemical Industry Co., Ltd.), and 0.62 g of p-toluenesulfonic acid monohydrate were added to and dissolved in 42.37 g of propylene glycol monomethyl ether. The reaction vessel was purged with nitrogen gas, and then the mixture in the vessel was subjected to reaction at 140° C. for 4 hours to obtain a polymer solution. The resultant reaction solution was subjected to precipitation in a water/methanol mixed solvent to obtain black polymer (P-8). A GPC analysis was made, and the result of the analysis showed that the obtained polymer had a weight average molecular weight of 4,750.

Polymer (P-8) is presumed to have a structure of the following formula (P-8).

[Chemical formula 74]

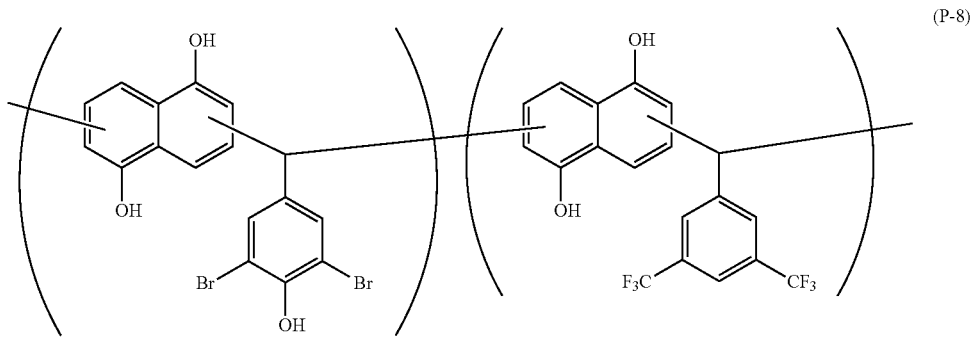

(P-8)

Synthesis Example 9

In a reaction vessel, 4.0 g of 1,5-dihydroxynaphthalene (manufactured by Tokyo Chemical Industry Co., Ltd.), 1.20 g of 3,4-dihydroxybenzaldehyde (manufactured by Tokyo Chemical Industry Co., Ltd.), 3.6 g of 3,5-bis(trifluoromethyl)benzaldehyde (manufactured by Tokyo Chemical Industry Co., Ltd.), 0.21 g of 4-diethylaminobenzaldehyde (manufactured by Tokyo Chemical Industry Co., Ltd.), and 0.49 g of p-toluenesulfonic acid monohydrate were added to and dissolved in 22.29 g of propylene glycol monomethyl ether. The reaction vessel was purged with nitrogen gas, and then the mixture in the vessel was subjected to reaction at 140° C. for 4 hours to obtain a polymer solution. The resultant reaction solution was subjected to precipitation in a water/methanol mixed solvent to obtain black polymer (P-9). A GPC analysis was made, and the result of the analysis showed that the obtained polymer had a weight average molecular weight of 2,400.

Polymer (P-9) is presumed to have a structure of the following formula (P-9).

Synthesis Example 10

In a reaction vessel, 4.0 g of 1,5-dihydroxynaphthalene (manufactured by Tokyo Chemical Industry Co., Ltd.), 1.20 g of 3,4-dihydroxybenzaldehyde (manufactured by Tokyo Chemical Industry Co., Ltd.), 3.6 g of 3,5-bis(trifluoromethyl)benzaldehyde (manufactured by Tokyo Chemical Industry Co., Ltd.), 0.19 g of 2,3-(methylenedioxy)benzaldehyde (manufactured by Tokyo Chemical Industry Co., Ltd.), and 0.49 g of p-toluenesulfonic acid monohydrate were added to and dissolved in 22.21 g of propylene glycol monomethyl ether. The reaction vessel was purged with nitrogen gas, and then the mixture in the vessel was subjected to reaction at 140° C. for 4 hours to obtain a polymer solution. The resultant reaction solution was subjected to precipitation in a water/methanol mixed solvent to obtain black polymer (P-10). A GPC analysis was made, and the result of the analysis showed that the obtained polymer had a weight average molecular weight of 3,300.

Polymer (P-10) is presumed to have a structure of the following formula (P-10).

[Chemical formula 75]

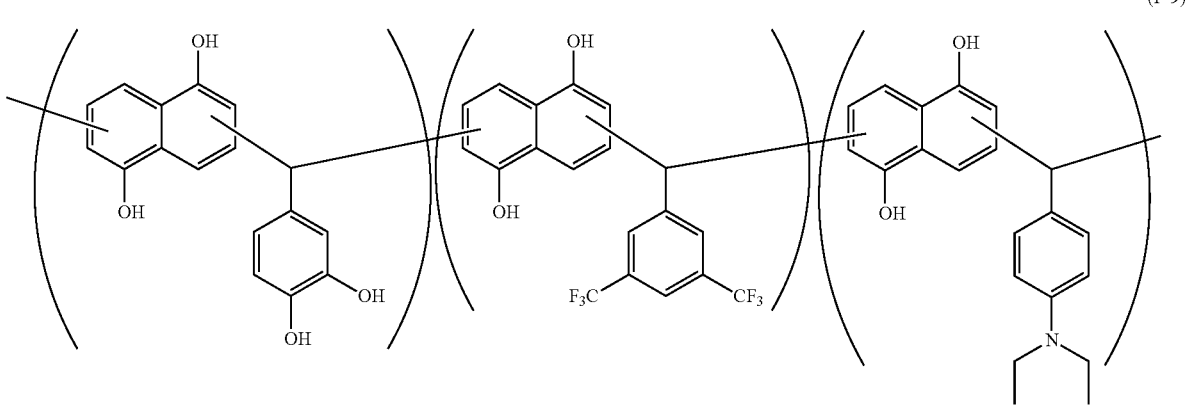

(P-9)

[Chemical formula 76]

(P-10)

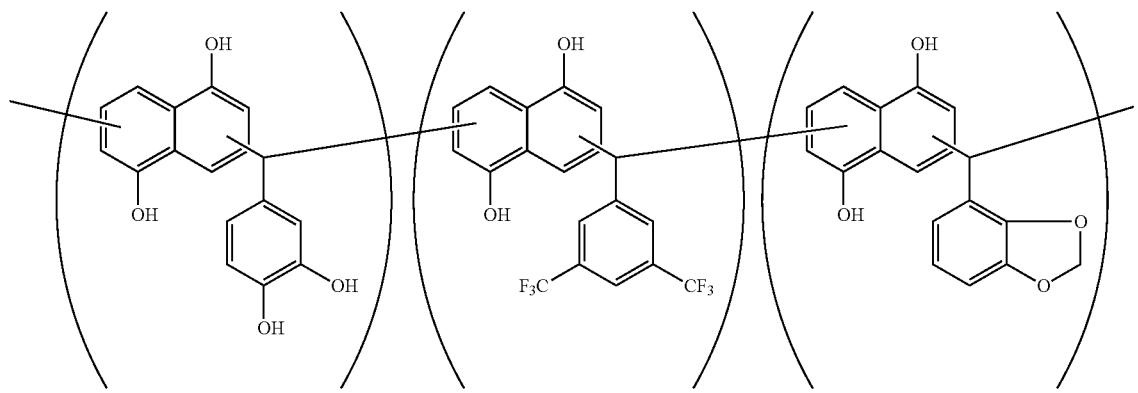

Synthesis Example 11

20.00 g of 4-tert-butylstyrene (manufactured by Tokyo Chemical Industry Co., Ltd.) and 7.16 g of methacrylic acid (manufactured by Tokyo Chemical Industry Co., Ltd.) were dissolved in 182 g of ethyl lactate and the resultant solution was heated under reflux. To the solution obtained after heating under reflux was dropwise added slowly a solution prepared by dissolving 0.85 g of azobisisobutyronitrile in 78.0 g of ethyl lactate. After completion of the dropwise addition, the resultant mixture was subjected to reaction at 160° C. for 24 hours while heating under reflux to obtain a solution containing a polymer. The resultant reaction solution was subjected to precipitation in a water/methanol mixed solvent to obtain white polymer (P-5). A GPC analysis was made, and the result of the analysis showed that the obtained polymer had a weight average molecular weight of 4,000.

Polymer (P-5) is presumed to have a structure of formula (P-5) above.

Example 1

18.43 g of diisoamyl ether and 0.97 g of 2-butanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 2

18.43 g of diisoamyl ether and 0.97 g of 2-heptanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 3

18.43 g of diisoamyl ether and 0.97 g of 2-octanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 4

18.43 g of diisoamyl ether and 0.97 g of 2-nonanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 5

18.43 g of diisoamyl ether and 0.97 g of 2-decanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 6

18.43 g of diisoamyl ether and 0.97 g of 4-methyl-2-pentanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 7

18.43 g of diisoamyl ether and 0.97 g of 5-methyl-2-hexanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 8

18.43 g of diisoamyl ether and 0.97 g of 2,6-dimethyl-4-heptanone were added to 0.6 g of the polymer obtained in Synthesis Example 1 above to dissolve the polymer. Then, the resultant solution was subjected to filtration using a

Example 9

18.43 g of diisoamyl ether and 0.97 g of 5-methyl-2-octanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 10

18.43 g of diisoamyl ether and 0.97 g of 5-nonanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 11

18.43 g of diisoamyl ether and 0.97 g of cyclopentanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 12

18.43 g of diisoamyl ether and 0.97 g of 3,3,5-trimethylcyclohexanone were added to 0.6 g of the polymer obtained in Synthesis Example 1 above to dissolve the polymer. Then, the resultant solution was subjected to filtration using a polyethylene microfilter having a pore size of 0.05 μm to prepare a composition for forming a resist upper-layer film.

Example 13

18.43 g of diisoamyl ether and 0.97 g of 2-butanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 14

18.43 g of diisoamyl ether and 0.97 g of 2-heptanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 15

18.43 g of diisoamyl ether and 0.97 g of 2-octanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 16

18.43 g of diisoamyl ether and 0.97 g of 2-nonanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 17

18.43 g of diisoamyl ether and 0.97 g of 2-decanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 18

18.43 g of diisoamyl ether and 0.97 g of 4-methyl-2-pentanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 19

18.43 g of diisoamyl ether and 0.97 g of 5-methyl-2-hexanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 20

18.43 g of diisoamyl ether and 0.97 g of 2,6-dimethyl-4-heptanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 21

18.43 g of diisoamyl ether and 0.97 g of 5-methyl-2-octanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 22

18.43 g of diisoamyl ether and 0.97 g of 5-nonanone were added to 0.6 g of the polymer obtained in Synthesis Example 2 above to dissolve the polymer. Then, the resultant solution was subjected to filtration using a polyethylene microfilter having a pore size of 0.05 μm to prepare a composition for forming a resist upper-layer film.

Example 23

18.43 g of diisoamyl ether and 0.97 g of cyclopentanone were added to 0.6 g of the polymer obtained in Synthesis Example 2 above to dissolve the polymer. Then, the resultant solution was subjected to filtration using a polyethylene microfilter having a pore size of 0.05 µm to prepare a composition for forming a resist upper-layer film.

Example 24

18.43 g of diisoamyl ether and 0.97 g of 3,3,5-trimethylcyclohexanone were added to 0.6 g of the polymer obtained in Synthesis Example 2 above to dissolve the polymer. Then, the resultant solution was subjected to filtration using a polyethylene microfilter having a pore size of 0.05 µm to prepare a composition for forming a resist upper-layer film.

Example 25

18.43 g of diisoamyl ether and 0.97 g of 2-butanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 26

18.43 g of diisoamyl ether and 0.97 g of 2-heptanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 27

18.43 g of diisoamyl ether and 0.97 g of 2-octanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 28

18.43 g of diisoamyl ether and 0.97 g of 2-nonanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 29

18.43 g of diisoamyl ether and 0.97 g of 2-decanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 30

18.43 g of diisoamyl ether and 0.97 g of 4-methyl-2-pentanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 31

18.43 g of diisoamyl ether and 0.97 g of 5-methyl-2-hexanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 32

18.43 g of diisoamyl ether and 0.97 g of 2,6-dimethyl-4-heptanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 33

18.43 g of diisoamyl ether and 0.97 g of 5-methyl-2-octanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 34

18.43 g of diisoamyl ether and 0.97 g of 5-nonanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 35

18.43 g of diisoamyl ether and 0.97 g of cyclopentanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 36

18.43 g of diisoamyl ether and 0.97 g of 3,3,5-trimethylcyclohexanone were added to 0.6 g of the polymer obtained in Synthesis Example 3 above to dissolve the polymer. Then, the resultant solution was subjected to filtration using a polyethylene microfilter having a pore size of 0.05 µm to prepare a composition for forming a resist upper-layer film.

Example 37

18.43 g of diisoamyl ether and 0.97 g of 2-butanone were added to 0.6 g of the polymer obtained in Synthesis Example 4 above to dissolve the polymer. Then, the resultant solution was subjected to filtration using a polyethylene microfilter having a pore size of 0.05 µm to prepare a composition for forming a resist upper-layer film.

Example 38

18.43 g of diisoamyl ether and 0.97 g of 2-heptanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 39

18.43 g of diisoamyl ether and 0.97 g of 2-octanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 40

18.43 g of diisoamyl ether and 0.97 g of 2-nonanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 41

18.43 g of diisoamyl ether and 0.97 g of 2-decanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 42

18.43 g of diisoamyl ether and 0.97 g of 4-methyl-2-pentanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 43

18.43 g of diisoamyl ether and 0.97 g of 5-methyl-2-hexanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 44

18.43 g of diisoamyl ether and 0.97 g of 2,6-dimethyl-4-heptanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 45

18.43 g of diisoamyl ether and 0.97 g of 5-methyl-2-octanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 46

18.43 g of diisoamyl ether and 0.97 g of 5-nonanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 47

18.43 g of diisoamyl ether and 0.97 g of cyclopentanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 48

18.43 g of diisoamyl ether and 0.97 g of 3,3,5-trimethylcyclohexanone were added to 0.6 g of the polymer obtained in Synthesis Example 4 above to dissolve the polymer. Then, the resultant solution was subjected to filtration using a polyethylene microfilter having a pore size of 0.05 μm to prepare a composition for forming a resist upper-layer film.

Example 49

18.43 g of diisoamyl ether and 0.97 g of 2-butanone were added to 0.6 g of the polymer obtained in Synthesis Example 5 above to dissolve the polymer. Then, the resultant solution was subjected to filtration using a polyethylene microfilter having a pore size of 0.05 μm to prepare a composition for forming a resist upper-layer film.

Example 50

18.43 g of diisoamyl ether and 0.97 g of 2-heptanone were added to 0.6 g of the polymer obtained in Synthesis Example 5 above to dissolve the polymer. Then, the resultant solution was subjected to filtration using a polyethylene microfilter having a pore size of 0.05 μm to prepare a composition for forming a resist upper-layer film.

Example 51

18.43 g of diisoamyl ether and 0.97 g of 2-octanone were added to 0.6 g of the polymer obtained in Synthesis Example 5 above to dissolve the polymer. Then, the resultant solution was subjected to filtration using a polyethylene microfilter having a pore size of 0.05 μm to prepare a composition for forming a resist upper-layer film.

Example 52

18.43 g of diisoamyl ether and 0.97 g of 2-nonanone were added to 0.6 g of the polymer obtained in Synthesis Example 5 above to dissolve the polymer. Then, the resultant solution was subjected to filtration using a polyethylene microfilter having a pore size of 0.05 µm to prepare a composition for forming a resist upper-layer film.

Example 53

18.43 g of diisoamyl ether and 0.97 g of 2-decanone were added to 0.6 g of the polymer obtained in Synthesis Example 5 above to dissolve the polymer. Then, the resultant solution was subjected to filtration using a polyethylene microfilter having a pore size of 0.05 µm to prepare a composition for forming a resist upper-layer film.

Example 54

18.43 g of diisoamyl ether and 0.97 g of 4-methyl-2-pentanone were added to 0.6 g of the polymer obtained in Synthesis Example 5 above to dissolve the polymer. Then, the resultant solution was subjected to filtration using a polyethylene microfilter having a pore size of 0.05 µm to prepare a composition for forming a resist upper-layer film.

Example 55

18.43 g of diisoamyl ether and 0.97 g of 5-methyl-2-hexanone were added to 0.6 g of the polymer obtained in Synthesis Example 5 above to dissolve the polymer. Then, the resultant solution was subjected to filtration using a polyethylene microfilter having a pore size of 0.05 µm to prepare a composition for forming a resist upper-layer film.

Example 56

18.43 g of diisoamyl ether and 0.97 g of 2,6-dimethyl-4-heptanone were added to 0.6 g of the polymer obtained in Synthesis Example 5 above to dissolve the polymer. Then, the resultant solution was subjected to filtration using a polyethylene microfilter having a pore size of 0.05 µm to prepare a composition for forming a resist upper-layer film.

Example 57

18.43 g of diisoamyl ether and 0.97 g of 5-methyl-2-octanone were added to 0.6 g of the polymer obtained in Synthesis Example 5 above to dissolve the polymer. Then, the resultant solution was subjected to filtration using a polyethylene microfilter having a pore size of 0.05 µm to prepare a composition for forming a resist upper-layer film.

Example 58

18.43 g of diisoamyl ether and 0.97 g of 5-nonanone were added to 0.6 g of the polymer obtained in Synthesis Example 5 above to dissolve the polymer. Then, the resultant solution was subjected to filtration using a polyethylene microfilter having a pore size of 0.05 µm to prepare a composition for forming a resist upper-layer film.

Example 59

18.43 g of diisoamyl ether and 0.97 g of cyclopentanone were added to 0.6 g of the polymer obtained in Synthesis Example 5 above to dissolve the polymer. Then, the resultant solution was subjected to filtration using a polyethylene microfilter having a pore size of 0.05 µm to prepare a composition for forming a resist upper-layer film.

Example 60

18.43 g of diisoamyl ether and 0.97 g of 3,3,5-trimethylcyclohexanone were added to 0.6 g of the polymer obtained in Synthesis Example 5 above to dissolve the polymer. Then, the resultant solution was subjected to filtration using a polyethylene microfilter having a pore size of 0.05 µm to prepare a composition for forming a resist upper-layer film.

Example 61

18.43 g of diisoamyl ether and 0.97 g of 2-butanone were added to 0.6 g of the polymer obtained in Synthesis Example 6 above to dissolve the polymer. Then, the resultant solution was subjected to filtration using a polyethylene microfilter having a pore size of 0.05 µm to prepare a composition for forming a resist upper-layer film.

Example 62

18.43 g of diisoamyl ether and 0.97 g of 2-heptanone were added to 0.6 g of the polymer obtained in Synthesis Example 6 above to dissolve the polymer. Then, the resultant solution was subjected to filtration using a polyethylene microfilter having a pore size of 0.05 µm to prepare a composition for forming a resist upper-layer film.

Example 63

18.43 g of diisoamyl ether and 0.97 g of 2-octanone were added to 0.6 g of the polymer obtained in Synthesis Example 6 above to dissolve the polymer. Then, the resultant solution was subjected to filtration using a polyethylene microfilter having a pore size of 0.05 µm to prepare a composition for forming a resist upper-layer film.

Example 64

18.43 g of diisoamyl ether and 0.97 g of 2-nonanone were added to 0.6 g of the polymer obtained in Synthesis Example 6 above to dissolve the polymer. Then, the resultant solution was subjected to filtration using a polyethylene microfilter having a pore size of 0.05 µm to prepare a composition for forming a resist upper-layer film.

Example 65

18.43 g of diisoamyl ether and 0.97 g of 2-decanone were added to 0.6 g of the polymer obtained in Synthesis Example 6 above to dissolve the polymer. Then, the resultant solution was subjected to filtration using a polyethylene microfilter having a pore size of 0.05 µm to prepare a composition for forming a resist upper-layer film.

Example 66

18.43 g of diisoamyl ether and 0.97 g of 4-methyl-2-pentanone were added to 0.6 g of the polymer obtained in Synthesis Example 6 above to dissolve the polymer. Then, the resultant solution was subjected to filtration using a polyethylene microfilter having a pore size of 0.05 µm to prepare a composition for forming a resist upper-layer film.

Example 67

18.43 g of diisoamyl ether and 0.97 g of 5-methyl-2-hexanone were added to 0.6 g of the polymer obtained in Synthesis Example 6 above to dissolve the polymer. Then, the resultant solution was subjected to filtration using a

Example 68

18.43 g of diisoamyl ether and 0.97 g of 2,6-dimethyl-4-heptanone were added to 0.6 g of the polymer obtained in Synthesis Example 6 above to dissolve the polymer. Then, the resultant solution was subjected to filtration using a polyethylene microfilter having a pore size of 0.05 μm to prepare a composition for forming a resist upper-layer film.

Example 69

18.43 g of diisoamyl ether and 0.97 g of 5-methyl-2-octanone were added to 0.6 g of the polymer obtained in Synthesis Example 6 above to dissolve the polymer. Then, the resultant solution was subjected to filtration using a polyethylene microfilter having a pore size of 0.05 μm to prepare a composition for forming a resist upper-layer film.

Example 70

18.43 g of diisoamyl ether and 0.97 g of 5-nonanone were added to 0.6 g of the polymer obtained in Synthesis Example 6 above to dissolve the polymer. Then, the resultant solution was subjected to filtration using a polyethylene microfilter having a pore size of 0.05 μm to prepare a composition for forming a resist upper-layer film.

Example 71

18.43 g of diisoamyl ether and 0.97 g of cyclopentanone were added to 0.6 g of the polymer obtained in Synthesis Example 6 above to dissolve the polymer. Then, the resultant solution was subjected to filtration using a polyethylene microfilter having a pore size of 0.05 μm to prepare a composition for forming a resist upper-layer film.

Example 72

18.43 g of diisoamyl ether and 0.97 g of 3,3,5-trimethylcyclohexanone were added to 0.6 g of the polymer obtained in Synthesis Example 6 above to dissolve the polymer. Then, the resultant solution was subjected to filtration using a polyethylene microfilter having a pore size of 0.05 μm to prepare a composition for forming a resist upper-layer film.

Example 73

18.43 g of diisoamyl ether and 0.97 g of 2-butanone were added to 0.6 g of the polymer obtained in Synthesis Example 7 above to dissolve the polymer. Then, the resultant solution was subjected to filtration using a polyethylene microfilter having a pore size of 0.05 μm to prepare a composition for forming a resist upper-layer film.

Example 74

18.43 g of diisoamyl ether and 0.97 g of 2-heptanone were added to 0.6 g of the polymer obtained in Synthesis Example 7 above to dissolve the polymer. Then, the resultant solution was subjected to filtration using a polyethylene microfilter having a pore size of 0.05 μm to prepare a composition for forming a resist upper-layer film.

Example 75

18.43 g of diisoamyl ether and 0.97 g of 2-octanone were added to 0.6 g of the polymer obtained in Synthesis Example 7 above to dissolve the polymer. Then, the resultant solution was subjected to filtration using a polyethylene microfilter having a pore size of 0.05 μm to prepare a composition for forming a resist upper-layer film.

Example 76

18.43 g of diisoamyl ether and 0.97 g of 2-nonanone were added to 0.6 g of the polymer obtained in Synthesis Example 7 above to dissolve the polymer. Then, the resultant solution was subjected to filtration using a polyethylene microfilter having a pore size of 0.05 μm to prepare a composition for forming a resist upper-layer film.

Example 77

18.43 g of diisoamyl ether and 0.97 g of 2-decanone were added to 0.6 g of the polymer obtained in Synthesis Example 7 above to dissolve the polymer. Then, the resultant solution was subjected to filtration using a polyethylene microfilter having a pore size of 0.05 μm to prepare a composition for forming a resist upper-layer film.

Example 78

18.43 g of diisoamyl ether and 0.97 g of 4-methyl-2-pentanone were added to 0.6 g of the polymer obtained in Synthesis Example 7 above to dissolve the polymer. Then, the resultant solution was subjected to filtration using a polyethylene microfilter having a pore size of 0.05 μm to prepare a composition for forming a resist upper-layer film.

Example 79

18.43 g of diisoamyl ether and 0.97 g of 5-methyl-2-hexanone were added to 0.6 g of the polymer obtained in Synthesis Example 7 above to dissolve the polymer. Then, the resultant solution was subjected to filtration using a polyethylene microfilter having a pore size of 0.05 μm to prepare a composition for forming a resist upper-layer film.

Example 80

18.43 g of diisoamyl ether and 0.97 g of 2,6-dimethyl-4-heptanone were added to 0.6 g of the polymer obtained in Synthesis Example 7 above to dissolve the polymer. Then, the resultant solution was subjected to filtration using a polyethylene microfilter having a pore size of 0.05 μm to prepare a composition for forming a resist upper-layer film.

Example 81

18.43 g of diisoamyl ether and 0.97 g of 5-methyl-2-octanone were added to 0.6 g of the polymer obtained in Synthesis Example 7 above to dissolve the polymer. Then, the resultant solution was subjected to filtration using a polyethylene microfilter having a pore size of 0.05 μm to prepare a composition for forming a resist upper-layer film.

Example 82

18.43 g of diisoamyl ether and 0.97 g of 5-nonanone were added to 0.6 g of the polymer obtained in Synthesis Example 7 above to dissolve the polymer. Then, the resultant solution was subjected to filtration using a polyethylene microfilter having a pore size of 0.05 µm to prepare a composition for forming a resist upper-layer film.

Example 83

18.43 g of diisoamyl ether and 0.97 g of cyclopentanone were added to 0.6 g of the polymer obtained in Synthesis Example 7 above to dissolve the polymer. Then, the resultant solution was subjected to filtration using a polyethylene microfilter having a pore size of 0.05 µm to prepare a composition for forming a resist upper-layer film.

Example 84

18.43 g of diisoamyl ether and 0.97 g of 3,3,5-trimethylcyclohexanone were added to 0.6 g of the polymer obtained in Synthesis Example 7 above to dissolve the polymer. Then, the resultant solution was subjected to filtration using a polyethylene microfilter having a pore size of 0.05 µm to prepare a composition for forming a resist upper-layer film.

Example 85

17.46 g of diisoamyl ether and 1.94 g of 2-octanone were added to 0.6 g of the polymer obtained in Synthesis Example 1 above to dissolve the polymer. Then, the resultant solution was subjected to filtration using a polyethylene microfilter having a pore size of 0.05 µm to prepare a composition for forming a resist upper-layer film.

Example 86

18.43 g of diisoamyl ether and 0.97 g of 2-octanone were added to 0.59 g of the polymer obtained in Synthesis Example 1 above and 0.01 g of dodecylbenzenesulfonic acid to dissolve the polymer. Then, the resultant solution was subjected to filtration using a polyethylene microfilter having a pore size of 0.05 µm to prepare a composition for forming a resist upper-layer film.

Example 87

18.43 g of diisoamyl ether and 0.97 g of 2-octanone were added to 0.59 g of the polymer obtained in Synthesis Example 1 above and 0.01 g of nonafluoro-1-butanesulfonic acid to dissolve the polymer. Then, the resultant solution was subjected to filtration using a polyethylene microfilter having a pore size of 0.05 µm to prepare a composition for forming a resist upper-layer film.

Example 88

18.43 g of diisoamyl ether and 0.97 g of 2-octanone were added to 0.59 g of the polymer obtained in Synthesis Example 1 above and 0.01 g of triethylamine to dissolve the polymer. Then, the resultant solution was subjected to filtration using a polyethylene microfilter having a pore size of 0.05 µm to prepare a composition for forming a resist upper-layer film.

Example 89

19.21 g of diisoamyl ether and 0.19 g of 2-butanone were added to 0.6 g of the polymer obtained in Synthesis Example 11 above to dissolve the polymer. Then, the resultant solution was subjected to filtration using a polyethylene microfilter having a pore size of 0.05 µm to prepare a composition for forming a resist upper-layer film.

Comparative Example 1

18.43 g of diisoamyl ether and 0.97 g of 4-methyl-2-pentanol were added to 0.6 g of the polymer obtained in Synthesis Example 1 above to dissolve the polymer. Then, the resultant solution was subjected to filtration using a polyethylene microfilter having a pore size of 0.05 µm to prepare a composition for forming a resist upper-layer film.

Comparative Example 2

17.46 g of diisoamyl ether and 1.94 g of 4-methyl-2-pentanol were added to 0.6 g of the polymer obtained in Synthesis Example 1 above to dissolve the polymer. Then, the resultant solution was subjected to filtration using a polyethylene microfilter having a pore size of 0.05 µm to prepare a composition for forming a resist upper-layer film.

Comparative Example 3

16.49 g of diisoamyl ether and 2.91 g of 2-octanone were added to 0.6 g of the polymer obtained in Synthesis Example 1 above to dissolve the polymer. Then, the resultant solution was subjected to filtration using a polyethylene microfilter having a pore size of 0.05 µm to prepare a composition for forming a resist upper-layer film.

Comparative Example 4

0.6 g of a polyhydroxystyrene resin (commercially available product; weight average molecular weight: 8,000) was dissolved in 19.4 g of 4-methyl-2-pentanol to prepare a composition for forming a resist upper-layer film.

Comparative Example 5

19.40 g of diisoamyl ether was added to 0.6 g of the polymer obtained in Synthesis Example 2 above to dissolve the polymer. Then, the resultant solution was subjected to filtration using a polyethylene microfilter having a pore size of 0.05 µm to prepare a composition for forming a resist upper-layer film.

Comparative Example 6

19.40 g of diisoamyl ether was added to 0.6 g of the polymer obtained in Synthesis Example 4 above to dissolve the polymer. Then, the resultant solution was subjected to filtration using a polyethylene microfilter having a pore size of 0.05 µm to prepare a composition for forming a resist upper-layer film for lithography.

Comparative Example 7

19.40 g of diisoamyl ether was added to 0.6 g of the polymer obtained in Synthesis Example 11 above, and an attempt was made to dissolve the polymer. However, the polymer was not completely dissolved in diisoamyl ether, so that a composition for forming a resist upper-layer film could not be obtained.

Comparative Example 8

19.34 g of diisoamyl ether and 0.06 g of 2-butanone were added to 0.6 g of the polymer obtained in Synthesis Example 11 above, and an attempt was made to dissolve the polymer. However, the polymer was not completely dissolved in diisoamyl ether, so that a composition for forming a resist upper-layer film could not be obtained.

Comparative Example 9

19.26 g of diisoamyl ether and 0.14 g of 2-butanone were added to 0.6 g of the polymer obtained in Synthesis Example 11 above, and an attempt was made to dissolve the polymer. However, the polymer was not completely dissolved in diisoamyl ether, so that a composition for forming a resist upper-layer film could not be obtained.

Experimental Example 1

A composition for forming a resist lower-layer film containing a copolymer represented by the following formula (14) and further containing a crosslinking agent represented by the following formula (15) and pyridinium p-toluenesulfonate as additives was prepared.

[Chemical formula 77]

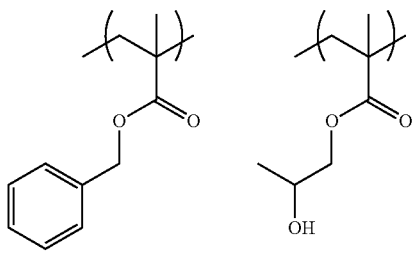

(14)

A/B = 50/50 (wt %)

[Chemical formula 78]

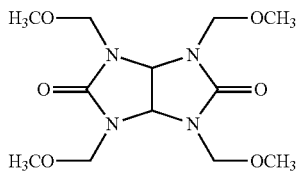

(15)

[Test for Checking Insolubility of the Resist in the Composition for Forming a Resist Upper-Layer Film]

An EUV resist solution (hydroxystyrene (HS)-containing resist) was applied using a spinner. The resist solution applied was heated on a hotplate at 100° C. for one minute to form a resist film, and a thickness of the resist film was measured. Each of the compositions for forming a resist upper-layer film in Examples 1 to 88 and Comparative Examples 1 to 3 was applied to the resist film using a spinner, and heated on a hotplate at 100° C. for one minute, and then a commercially available alkaline developing agent (product name: NMD-3; manufactured by Tokyo Ohka Kogyo Co., Ltd.) was applied in the state of liquid onto the above-formed resist upper-layer film and allowed to stand for 60 seconds, and rinsed with pure water for 30 seconds while rotating the film at 3,000 rpm. After rinsing, the resultant film was baked at 100° C. for 60 seconds, and a thickness of the film was measured.

The degree of film thickness reduction of the resist was evaluated as shown in Table 1. A rating "OK" indicates that the film thickness reduction of the resist is 10% or less of the initial thickness, and a rating "NG" indicates that the film thickness reduction of the resist is more than 10% of the initial thickness.

It has been found that when using the composition of the present invention, the resist underlying the resist upper-layer film has a small film thickness reduction. This is an important property as the applicability of the resist upper-layer film.

TABLE 1

| Test for checking insolubility of resist | |
|---|---|
| Example 1 | OK |
| Example 2 | OK |
| Example 3 | OK |
| Example 4 | OK |
| Example 5 | OK |
| Example 6 | OK |
| Example 7 | OK |
| Example 8 | OK |
| Example 9 | OK |
| Example 10 | OK |
| Example 11 | OK |
| Example 12 | OK |
| Example 13 | OK |
| Example 14 | OK |
| Example 15 | OK |
| Example 16 | OK |
| Example 17 | OK |
| Example 18 | OK |
| Example 19 | OK |
| Example 20 | OK |
| Example 21 | OK |
| Example 22 | OK |
| Example 23 | OK |
| Example 24 | OK |
| Example 25 | OK |
| Example 26 | OK |
| Example 27 | OK |
| Example 28 | OK |
| Example 29 | OK |
| Example 30 | OK |
| Example 31 | OK |
| Example 32 | OK |
| Example 33 | OK |
| Example 34 | OK |
| Example 35 | OK |
| Example 36 | OK |
| Example 37 | OK |
| Example 38 | OK |
| Example 39 | OK |
| Example 40 | OK |
| Example 41 | OK |
| Example 42 | OK |
| Example 43 | OK |
| Example 44 | OK |
| Example 45 | OK |
| Example 46 | OK |
| Example 47 | OK |
| Example 48 | OK |
| Example 49 | OK |
| Example 50 | OK |
| Example 51 | OK |
| Example 52 | OK |
| Example 53 | OK |
| Example 54 | OK |
| Example 55 | OK |
| Example 56 | OK |
| Example 57 | OK |
| Example 58 | OK |
| Example 59 | OK |
| Example 60 | OK |
| Example 61 | OK |
| Example 62 | OK |
| Example 63 | OK |
| Example 64 | OK |
| Example 65 | OK |
| Example 66 | OK |

TABLE 1-continued

Test for checking insolubility of resist

| | |
|---|---|
| Example 67 | OK |
| Example 68 | OK |
| Example 69 | OK |
| Example 70 | OK |
| Example 71 | OK |
| Example 72 | OK |
| Example 73 | OK |
| Example 74 | OK |
| Example 75 | OK |
| Example 76 | OK |
| Example 77 | OK |
| Example 78 | OK |
| Example 79 | OK |
| Example 80 | OK |
| Example 81 | OK |
| Example 82 | OK |
| Example 83 | OK |
| Example 84 | OK |
| Example 85 | OK |
| Example 86 | OK |
| Example 87 | OK |
| Example 88 | OK |
| Comparative Example 1 | NG |
| Comparative Example 2 | NG |
| Comparative Example 3 | NG |

[Test for Application to PTD Process]

Each of the composition solutions for forming a resist upper-layer film prepared in Examples 1 to 88 of the present invention was applied to a wafer using a spinner, and heated on a hotplate at 100° C. for one minute to form a resist upper-layer film, and a thickness of the film was measured (thickness A: thickness of the resist upper-layer film). A commercially available alkaline developing agent (product name: NMD-3; manufactured by Tokyo Ohka Kogyo Co., Ltd.) was applied in the state of liquid onto the above-formed resist upper-layer film and allowed to stand for 60 seconds, and rinsed with pure water for 30 seconds while rotating the film at 3,000 rpm. After rinsing, the resultant film was baked at 100° C. for 60 seconds, and a thickness of the film was measured (thickness B). When thickness B is 0 nm, it is considered that the resist upper-layer film has been removed by the developing agent. This result indicates that the composition of the present invention can be applied as a resist upper-layer film for a PTD process ([Table 2]).

TABLE 2

Measurement of thickness of film

| | Thickness A (nm) | Thickness B (nm) |
|---|---|---|
| Example 1 | 30 | 0 |
| Example 2 | 30 | 0 |
| Example 3 | 30 | 0 |
| Example 4 | 30 | 0 |
| Example 5 | 30 | 0 |
| Example 6 | 30 | 0 |
| Example 7 | 30 | 0 |
| Example 8 | 30 | 0 |
| Example 9 | 30 | 0 |
| Example 10 | 30 | 0 |
| Example 11 | 30 | 0 |
| Example 12 | 30 | 0 |
| Example 13 | 30 | 0 |
| Example 14 | 30 | 0 |
| Example 15 | 30 | 0 |
| Example 16 | 30 | 0 |
| Example 17 | 30 | 0 |
| Example 18 | 30 | 0 |
| Example 19 | 30 | 0 |
| Example 20 | 30 | 0 |
| Example 21 | 30 | 0 |
| Example 22 | 30 | 0 |
| Example 23 | 30 | 0 |
| Example 24 | 30 | 0 |
| Example 25 | 30 | 0 |
| Example 26 | 30 | 0 |
| Example 27 | 30 | 0 |
| Example 28 | 30 | 0 |
| Example 29 | 30 | 0 |
| Example 30 | 30 | 0 |
| Example 31 | 30 | 0 |
| Example 32 | 30 | 0 |
| Example 33 | 30 | 0 |
| Example 34 | 30 | 0 |
| Example 35 | 30 | 0 |
| Example 36 | 30 | 0 |
| Example 37 | 30 | 0 |
| Example 38 | 30 | 0 |
| Example 39 | 30 | 0 |
| Example 40 | 30 | 0 |
| Example 41 | 30 | 0 |
| Example 42 | 30 | 0 |
| Example 43 | 30 | 0 |
| Example 44 | 30 | 0 |
| Example 45 | 30 | 0 |
| Example 46 | 30 | 0 |
| Example 47 | 30 | 0 |
| Example 48 | 30 | 0 |
| Example 49 | 30 | 0 |
| Example 50 | 30 | 0 |
| Example 51 | 30 | 0 |
| Example 52 | 30 | 0 |
| Example 53 | 30 | 0 |
| Example 54 | 30 | 0 |
| Example 55 | 30 | 0 |
| Example 56 | 30 | 0 |
| Example 57 | 30 | 0 |
| Example 58 | 30 | 0 |
| Example 59 | 30 | 0 |
| Example 60 | 30 | 0 |
| Example 61 | 30 | 0 |
| Example 62 | 30 | 0 |
| Example 63 | 30 | 0 |
| Example 64 | 30 | 0 |
| Example 65 | 30 | 0 |
| Example 66 | 30 | 0 |
| Example 67 | 30 | 0 |
| Example 68 | 30 | 0 |
| Example 69 | 30 | 0 |
| Example 70 | 30 | 0 |
| Example 71 | 30 | 0 |
| Example 72 | 30 | 0 |
| Example 73 | 30 | 0 |
| Example 74 | 30 | 0 |
| Example 75 | 30 | 0 |
| Example 76 | 30 | 0 |
| Example 77 | 30 | 0 |
| Example 78 | 30 | 0 |
| Example 79 | 30 | 0 |
| Example 80 | 30 | 0 |
| Example 81 | 30 | 0 |
| Example 82 | 30 | 0 |
| Example 83 | 30 | 0 |
| Example 84 | 30 | 0 |
| Example 85 | 30 | 0 |
| Example 86 | 30 | 0 |
| Example 87 | 30 | 0 |
| Example 88 | 30 | 0 |

[Test for Application to NTD Process]

Each of the composition solutions for forming a resist upper-layer film prepared in Examples 1 to 88 of the present invention and Comparative Example 4 was applied to a wafer using a spinner, and heated on a hotplate at 100° C. for one minute to form a resist upper-layer film, and a thickness of the film was measured (thickness A: thickness of the resist upper-layer film). Butyl acetate (solvent developing agent) typically used in an NTD process was applied in the state of liquid onto the above-formed resist upper-layer film and allowed to stand for 60 seconds, and the film was rotated at 3,000 rpm. Then, the resultant film was baked at 100° C. for 60 seconds, and a thickness of the film was measured (thickness C). When thickness C is 0 nm, it is considered that the resist upper-layer film has been removed by the solvent developing agent. This result indicates that the composition of the present invention can be applied as a resist upper-layer film for an NTD process ([Table 3]).

TABLE 3

Measurement of thickness of film

|  | Thickness A (nm) | Thickness C (nm) |
|---|---|---|
| Example 1 | 30 | 0 |
| Example 2 | 30 | 0 |
| Example 3 | 30 | 0 |
| Example 4 | 30 | 0 |
| Example 5 | 30 | 0 |
| Example 6 | 30 | 0 |
| Example 7 | 30 | 0 |
| Example 8 | 30 | 0 |
| Example 9 | 30 | 0 |
| Example 10 | 30 | 0 |
| Example 11 | 30 | 0 |
| Example 12 | 30 | 0 |
| Example 13 | 30 | 0 |
| Example 14 | 30 | 0 |
| Example 15 | 30 | 0 |
| Example 16 | 30 | 0 |
| Example 17 | 30 | 0 |
| Example 18 | 30 | 0 |
| Example 19 | 30 | 0 |
| Example 20 | 30 | 0 |
| Example 21 | 30 | 0 |
| Example 22 | 30 | 0 |
| Example 23 | 30 | 0 |
| Example 24 | 30 | 0 |
| Example 25 | 30 | 0 |
| Example 26 | 30 | 0 |
| Example 27 | 30 | 0 |
| Example 28 | 30 | 0 |
| Example 29 | 30 | 0 |
| Example 30 | 30 | 0 |
| Example 31 | 30 | 0 |
| Example 32 | 30 | 0 |
| Example 33 | 30 | 0 |
| Example 34 | 30 | 0 |
| Example 35 | 30 | 0 |
| Example 36 | 30 | 0 |
| Example 37 | 30 | 0 |
| Example 38 | 30 | 0 |
| Example 39 | 30 | 0 |
| Example 40 | 30 | 0 |
| Example 41 | 30 | 0 |
| Example 42 | 30 | 0 |
| Example 43 | 30 | 0 |
| Example 44 | 30 | 0 |
| Example 45 | 30 | 0 |
| Example 46 | 30 | 0 |
| Example 47 | 30 | 0 |
| Example 48 | 30 | 0 |
| Example 49 | 30 | 0 |
| Example 50 | 30 | 0 |
| Example 51 | 30 | 0 |
| Example 52 | 30 | 0 |
| Example 53 | 30 | 0 |
| Example 54 | 30 | 0 |
| Example 55 | 30 | 0 |
| Example 56 | 30 | 0 |
| Example 57 | 30 | 0 |
| Example 58 | 30 | 0 |
| Example 59 | 30 | 0 |
| Example 60 | 30 | 0 |
| Example 61 | 30 | 0 |
| Example 62 | 30 | 0 |
| Example 63 | 30 | 0 |
| Example 64 | 30 | 0 |
| Example 65 | 30 | 0 |
| Example 66 | 30 | 0 |
| Example 67 | 30 | 0 |
| Example 68 | 30 | 0 |
| Example 69 | 30 | 0 |
| Example 70 | 30 | 0 |
| Example 71 | 30 | 0 |
| Example 72 | 30 | 0 |
| Example 73 | 30 | 0 |
| Example 74 | 30 | 0 |
| Example 75 | 30 | 0 |
| Example 76 | 30 | 0 |
| Example 77 | 30 | 0 |
| Example 78 | 30 | 0 |
| Example 79 | 30 | 0 |
| Example 80 | 30 | 0 |
| Example 81 | 30 | 0 |
| Example 82 | 30 | 0 |
| Example 83 | 30 | 0 |
| Example 84 | 30 | 0 |
| Example 85 | 30 | 0 |
| Example 86 | 30 | 0 |
| Example 87 | 30 | 0 |
| Example 88 | 30 | 0 |
| Comparative Example 4 | 30 | 30 |

[Optical Parameter Test]

Each of the composition solutions for forming a resist upper-layer film prepared in Examples 1 to 88 of the present invention and Comparative Example 4 was applied to a quartz substrate using a spinner. The applied composition solution was heated on a hotplate at 70° C. for one minute to form a resist upper-layer film (thickness: 30 nm). With respect to the formed resist upper-layer film, an absorbance at a wavelength of 200 to 260 nm was measured using a spectrophotometer. A transmittance at 13.5 nm was calculated by simulation from the relationship between the elemental composition and the film density. With respect to the cut-off property for a DUV light in a wavelength region of from 200 to 260 nm, the resist upper-layer film having a maximum absorbance of 65% or more was rated "Excellent", and the resist upper-layer film having a maximum absorbance of less than 65% was rated "Bad". With respect to the transmission property for an EUV light (13.5 nm), the resist upper-layer film having a transmittance of 80% or more was rated "Excellent", and the resist upper-layer film having a transmittance of less than 80% was "Bad". The results show that the resist upper-layer films obtained from the compositions for forming a resist upper-layer film in the Examples had better cut-off property for a DUV light than that of the resist upper-layer films obtained from the compositions for forming a resist upper-layer film in Comparative Examples 4 and 5. Further, the results show that the resist upper-layer films obtained from the compositions for forming a resist upper-layer film in the Examples had better transmission property for an EUV light than that of the resist upper-layer film obtained from the composition for forming a resist upper-layer film in Comparative Example 6 ([Table 4]).

TABLE 4

EUV transmission property and DUV cut-off property

| | Thickness (nm) | Transmission property for EUV light | Cut-off property for DUV light |
|---|---|---|---|
| Example 1 | 30 | Excellent | Excellent |
| Example 2 | 30 | Excellent | Excellent |
| Example 3 | 30 | Excellent | Excellent |
| Example 4 | 30 | Excellent | Excellent |
| Example 5 | 30 | Excellent | Excellent |
| Example 6 | 30 | Excellent | Excellent |
| Example 7 | 30 | Excellent | Excellent |
| Example 8 | 30 | Excellent | Excellent |
| Example 9 | 30 | Excellent | Excellent |
| Example 10 | 30 | Excellent | Excellent |
| Example 11 | 30 | Excellent | Excellent |
| Example 12 | 30 | Excellent | Excellent |
| Example 13 | 30 | Excellent | Excellent |
| Example 14 | 30 | Excellent | Excellent |
| Example 15 | 30 | Excellent | Excellent |
| Example 16 | 30 | Excellent | Excellent |
| Example 17 | 30 | Excellent | Excellent |
| Example 18 | 30 | Excellent | Excellent |
| Example 19 | 30 | Excellent | Excellent |
| Example 20 | 30 | Excellent | Excellent |
| Example 21 | 30 | Excellent | Excellent |
| Example 22 | 30 | Excellent | Excellent |
| Example 23 | 30 | Excellent | Excellent |
| Example 24 | 30 | Excellent | Excellent |
| Example 25 | 30 | Excellent | Excellent |
| Example 26 | 30 | Excellent | Excellent |
| Example 27 | 30 | Excellent | Excellent |
| Example 28 | 30 | Excellent | Excellent |
| Example 29 | 30 | Excellent | Excellent |
| Example 30 | 30 | Excellent | Excellent |
| Example 31 | 30 | Excellent | Excellent |
| Example 32 | 30 | Excellent | Excellent |
| Example 33 | 30 | Excellent | Excellent |
| Example 34 | 30 | Excellent | Excellent |
| Example 35 | 30 | Excellent | Excellent |
| Example 36 | 30 | Excellent | Excellent |
| Example 37 | 30 | Excellent | Excellent |
| Example 38 | 30 | Excellent | Excellent |
| Example 39 | 30 | Excellent | Excellent |
| Example 40 | 30 | Excellent | Excellent |
| Example 41 | 30 | Excellent | Excellent |
| Example 42 | 30 | Excellent | Excellent |
| Example 43 | 30 | Excellent | Excellent |
| Example 44 | 30 | Excellent | Excellent |
| Example 45 | 30 | Excellent | Excellent |
| Example 46 | 30 | Excellent | Excellent |
| Example 47 | 30 | Excellent | Excellent |
| Example 48 | 30 | Excellent | Excellent |
| Example 49 | 30 | Excellent | Excellent |
| Example 50 | 30 | Excellent | Excellent |
| Example 51 | 30 | Excellent | Excellent |
| Example 52 | 30 | Excellent | Excellent |
| Example 53 | 30 | Excellent | Excellent |
| Example 54 | 30 | Excellent | Excellent |
| Example 55 | 30 | Excellent | Excellent |
| Example 56 | 30 | Excellent | Excellent |
| Example 57 | 30 | Excellent | Excellent |
| Example 58 | 30 | Excellent | Excellent |
| Example 59 | 30 | Excellent | Excellent |
| Example 60 | 30 | Excellent | Excellent |
| Example 61 | 30 | Excellent | Excellent |
| Example 62 | 30 | Excellent | Excellent |
| Example 63 | 30 | Excellent | Excellent |
| Example 64 | 30 | Excellent | Excellent |
| Example 65 | 30 | Excellent | Excellent |
| Example 66 | 30 | Excellent | Excellent |
| Example 67 | 30 | Excellent | Excellent |
| Example 68 | 30 | Excellent | Excellent |
| Example 69 | 30 | Excellent | Excellent |
| Example 70 | 30 | Excellent | Excellent |
| Example 71 | 30 | Excellent | Excellent |
| Example 72 | 30 | Excellent | Excellent |
| Example 73 | 30 | Excellent | Excellent |
| Example 74 | 30 | Excellent | Excellent |
| Example 75 | 30 | Excellent | Excellent |
| Example 76 | 30 | Excellent | Excellent |
| Example 77 | 30 | Excellent | Excellent |
| Example 78 | 30 | Excellent | Excellent |
| Example 79 | 30 | Excellent | Excellent |
| Example 80 | 30 | Excellent | Excellent |
| Example 81 | 30 | Excellent | Excellent |
| Example 82 | 30 | Excellent | Excellent |
| Example 83 | 30 | Excellent | Excellent |
| Example 84 | 30 | Excellent | Excellent |
| Example 85 | 30 | Excellent | Excellent |
| Example 86 | 30 | Excellent | Excellent |
| Example 87 | 30 | Excellent | Excellent |
| Example 88 | 30 | Excellent | Excellent |
| Comparative Example 4 | 30 | Excellent | Bad |

[Storage Stability Test]

Each of the solutions of the compositions for forming a resist upper-layer film in Example 15 and Comparative Example 5, which were obtained immediately after being prepared, and each of the solutions of the above compositions, which had been stored at 35° C. for one month, was applied to a 12-inch silicon wafer using a spin coater CLEAN TRACK LITHIUS Pro, manufactured by Tokyo Electron Limited, and heated at 70° C. for one minute to form a resist upper-layer film on the silicon wafer. The number of defects of 80 nm or more in the formed resist upper-layer film was measured using a wafer surface inspecting apparatus Surfscan SP2XP, manufactured by KLA-Tencor Corporation. In the evaluation, a rating "OK" indicates that the number of defects is 500 or less, and a rating "NG" indicates that the number of defects is more than 500.

TABLE 5

Storage stability test

| | Solution immediately after prepared | Solution after stored at 35° C. for 1 month |
|---|---|---|
| Example 15 | OK | OK |
| Comparative Example 5 | OK | NG |

[Formation and Evaluation of a Resist Pattern (Evaluation of Inter-Pattern Bridge Critical Dimension)]

An EUV resist solution (hydroxystyrene (HS)-containing resist) was applied by spin coating to a 12-inch silicon wafer having applied thereto the resist lower-layer film prepared in Experimental Example 1, and heated to form a resist film having a thickness of 30 nm. Each of the compositions for forming a resist upper-layer film prepared in Examples 40, 43, and 44 of the present invention and Comparative Example 6 was applied to the above-formed resist film by spin coating, and heated at 70° C. for one minute to form a resist upper-layer film having a thickness of 30 nm. Then, using an EUV exposure system (EUV Micro Exposure Tool (MS-13), manufactured by Exitech Corporation), the formed film was subjected to exposure through a pattern mask under conditions at NA=0.35 and 6=0.36/0.68 [Quadrupole]. After the exposure, the resultant film was subjected to PEB (post exposure bake), and cooled to room temperature on a cooling plate, and subjected to development using an alkaline developing agent, and rinsed with water to form a resist pattern.

The intended line width of a resist pattern to be formed was set at 26 nm line-and-space, and, for making studies on the relationship at the optimum focus between the change of exposure energy and the generation of a bridge-like residue present in the resist inter-pattern space portion (resist inter-pattern bridge), a resist pattern dimension with the minimum exposure energy at which no resist pattern bridge is generated (inter-pattern bridge critical dimension) was confirmed by a critical dimension SEM {apparatus name: CG-4000 (manufactured by Hitachi High-Technologies Corporation)}. This measurement makes it possible to check whether or not the use of the composition for forming a resist upper-layer film of the present invention can prevent the generation of a resist inter-pattern bridge in a low exposure energy region to form a resist pattern having a wide process window. Further, the cross-sectional form of the resist pattern at a 26 nm line-and-space which is the intended line width was examined by an ultra-high resolution SEM (apparatus name: S-4800 (manufactured by Hitachi High-Technologies Corporation)). The deterioration of the resist pattern can be confirmed from the cross-sectional form of the resist pattern. The result that the cross-sectional form of the resist pattern is straight shows that the resist pattern has no deterioration.

The results of the measurement of the inter-pattern bridge critical dimension and the examination of the cross-sectional form of the pattern with respect to the obtained resist patterns are shown in Table 6 below. The larger the inter-pattern bridge critical dimension, the more preferred the resist pattern is. That is, this indicates that no inter-pattern bridge is generated even when the resist pattern width is large so that the space width is relatively narrow. The values of the inter-pattern bridge critical dimension in the Examples were larger than that in the Comparative Example.

TABLE 6

Results of evaluation for formation of resist pattern

| Composition for forming a resist upper-layer film | Critical dimension | Cross-sectional form of pattern |
| --- | --- | --- |
| Example 40 | 29.7 nm | Straight |
| Example 43 | 30.8 nm | Straight |
| Example 44 | 30.7 nm | Straight |
| Comparative Example 6 | 28.5 nm | Straight |

INDUSTRIAL APPLICABILITY

The composition of the present invention is a composition for forming an EUV resist upper-layer film for use in an EUV lithography process in the semiconductor device production step or a resist upper-layer film for a lithography process in the electron beam exposure, wherein the resist upper-layer film formed from the composition cuts off an exposure light unfavorably acting, for example, during the EUV exposure, for example, an UV light or a DUV light and selectively transmits only an EUV light without intermixing with the resist, and further can be developed using a developing agent after the exposure.

The invention claimed is:

1. A composition for forming an EUV or electron beam resist upper-layer film, the composition comprising:
   (a) a polymer (P), and
   (b) a solvent,
   wherein the solvent contains a ketone compound having 4 to 12 carbon atoms in an amount of 1 to 13% by mass, based on a total mass of the solvent, and
   wherein the composition further comprises an ether compound having 8 to 16 carbon atoms as a solvent.

2. The composition according to claim 1, wherein (a) polymer (P) comprises two or more types of repeating units and comprises all of the groups selected from the following (a1) to (a3):
   (a1) an alkyl group having 1 to 10 carbon atoms and hydrogen atoms, wherein part or all of the hydrogen atoms may be substituted by a fluorine atom,
   (a2) a hydroxyl group and/or a carboxyl group, and
   (a3) an organic group having an aromatic ring.

3. The composition according to claim 1, wherein (a) polymer (P) comprises repeating units represented by any of the following formulae (1-1) to (1-4):

(1-1)

(1-2)

(1-3)

(1-4)

wherein, in formulae (1-1) to (1-4), $Ar^1$ is an organic group having an aromatic ring of 6 to 18 carbon atoms, and $Ar^2$ represents an organic group having an aromatic ring of 6 to 18 carbon atoms and being linked with $Ar^1$ through a methylene group or a tertiary carbon atom;
wherein the organic group containing an aromatic ring in $Ar^1$ or $Ar^2$ comprises an alkyl group (a1) having 1 to 10 carbon atoms and hydrogen atoms, wherein part or all of the hydrogen atoms may be substituted by a fluorine atom, and a number of substitution is an integer of 1 to 10; wherein at least one of hydrogen atoms of the aromatic ring in $Ar^1$ or $Ar^2$ is substituted by a hydroxyl group and/or a carboxyl group, and is optionally substituted by a halogen atom, a nitro group, a cyano group, a methylenedioxy group, an acetoxy group, a methylthio group, an alkoxy group having 1 to 9 carbon atoms, an amino group having hydrogen atoms that may be substituted by an alkyl group having 1 to 3 carbon atoms, an alkyl group having 1 to 6 carbon atoms and hydrogen atoms that may be substituted by a hydroxyl group, a halogenated alkyl group having 1 to 6 carbon atoms, or a combination thereof, and a number of substitution is an integer of 1 to 10.

4. The composition according to claim 3, wherein $Ar^1$ represents an organic group represented by any of the following formulae (2-1) to (2-5) or a combination thereof, and the aromatic ring in $Ar^1$ is appropriately linked with $Ar^2$, and $Ar^2$ represents an organic group represented by the following formula (3-1) or formula (3-2):

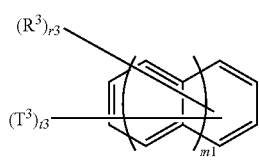

(2-1)

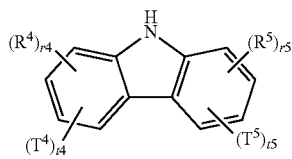

(2-2)

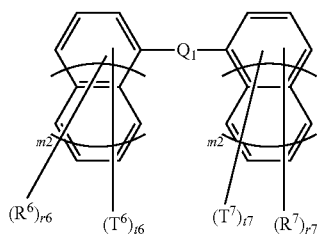

(2-3)

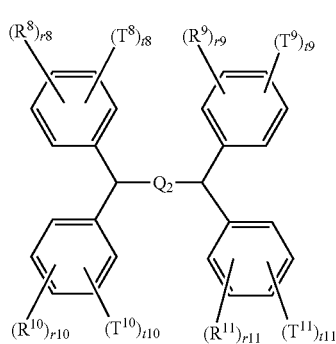

(2-4)

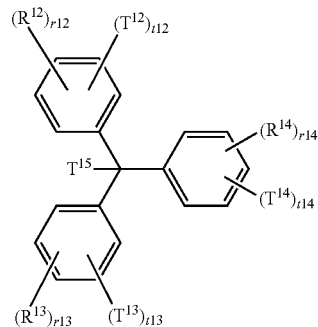

(2-5)

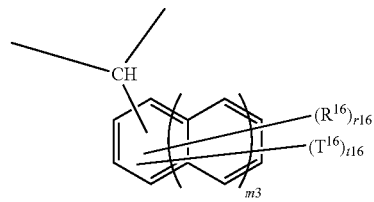

(3-1)

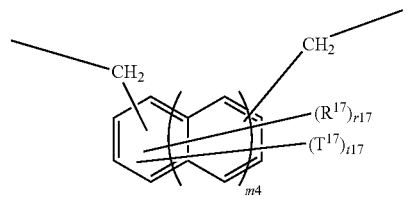

(3-2)

wherein, in formulae (2-1) to (2-5) and formula (3-1) or formula (3-2), each of $R_3$ to $R_{14}$, $R_{16}$, and $R_{17}$ independently represents the alkyl group (a1) having 1 to 10 carbon atoms and hydrogen atoms, wherein part or all of the hydrogen atoms may be substituted by a fluorine atom; each of $T_3$ to $T_{17}$ independently comprises a hydroxyl group and/or a carboxyl group and represents a hydrogen atom, a halogen atom, a nitro group, a cyano group, a methylenedioxy group, an acetoxy group, a methylthio group, an alkoxy group having 1 to 9 carbon atoms, an amino group having hydrogen atoms that may be substituted by an alkyl group having 1 to 3 carbon atoms, an alkyl group having 1 to 6 carbon atoms and having hydrogen atoms that may be substituted by a hydroxyl group, a halogenated alkyl group having 1 to 6 carbon atoms, or a combination thereof; each of $Q_1$ and $Q_2$ represents a single bond, an oxygen atom, a sulfur atom, a sulfonyl group, a carbonyl group, an imino group, an arylene group having 6 to 40 carbon atoms, an alkylene group having 1 to 10 carbon atoms and having hydrogen atoms that may be substituted by a halogen atom, or a combination thereof, wherein the alkylene group optionally forms a ring; each of m1 to m4, r4, r5, r8 to r14, t4, t5, and t8 to t14 independently represents an integer of 0 to 2; each of r3, r6, r7, r17, t3, t6, t7, and t17 independently represents an integer of 0 to 8; and each of r16 and t16 independently represents an integer of 0 to 9, wherein each of the total of r3 to r14, r16, and r17 and the total of t3 to t14, t16, and t17 is independently an integer of 1 to 10.

5. The composition according to claim 1, wherein (A) polymer (P) comprises repeating units represented by the following formulae (4-1) and (4-2):

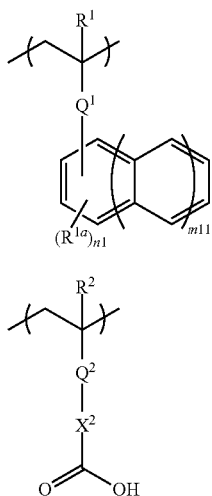 (4-1)

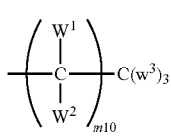 (4-2)

wherein, in formulae (4-1) and (4-2), $R^1$ and $R^2$ are the same or different and represent a hydrogen atom or an alkyl group having 1 to 10 carbon atoms, $Q^1$ and $Q^2$ are the same or different and represent a single bond, an ester linkage (—C(=O)—O— or —O—C(=O)—), or an amide linkage (—NH—CO— or —CO—NH—), $X^2$ represents a single bond, an alkylene group having 1 to 10 carbon atoms, or an arylene group having 6 to 14 carbon atoms, $R^{1a}$ represents an alkyl group (a1) having 1 to 10 carbon atoms and hydrogen atoms, wherein part or all of the hydrogen atoms may be substituted by a fluorine atom, n1 represents an integer of 1 to 3, and m11 represents an integer of 0 to 2.

6. The composition according to claim 2, wherein the alkyl group (a1) is the following formula (5):

$$\left(\begin{array}{c} W^1 \\ | \\ C \\ | \\ W^2 \end{array}\right)_{m10} \!\!\!\!-C(w^3)_3$$

(5)

wherein, in formula (5), each of $W^1$ and $W^2$ independently represents a hydrogen atom, a fluorine atom, a trifluoromethyl group, a difluoromethyl group, or a monofluoromethyl group, $w^3$ represents a hydrogen atom, a fluorine atom, or a combination thereof, wherein at least one of $W^1$, $W^2$, and $w^3$ is a fluorine atom or the fluorine-containing organic group as defined above, and m10 represents an integer of 0 to 9, wherein a number of the carbon atoms contained in formula (5) is at most 10.

7. The composition according to claim 2, wherein the alkyl group (a1) is unsubstituted by fluorine atom.

8. The composition according to claim 1, further comprising an acid compound and/or a basic compound.

9. A method for producing a semiconductor device, the method comprising the steps of:

forming a resist film on a substrate;

applying the composition according to claim 1 to the resist film and calcining the applied composition to form a resist upper-layer film;

subjecting the semiconductor substrate covered with the resist upper-layer film and the resist film to exposure with an EUV light or an electron beam through a mask pattern having a pattern for a semiconductor device;

subjecting the substrate obtained after the exposure to development to remove the resist upper-layer film and the resist film to form a resist pattern; and subjecting the developed substrate to dry etching or wet etching using the resist pattern as a mask.

10. A method for forming a resist pattern for use in producing a semiconductor device, which comprises the steps of:

forming a resist film on a substrate;

applying the composition according to claim 1 to the resist film and calcining the applied composition to form a resist upper-layer film;

subjecting the semiconductor substrate covered with the resist upper-layer film and the resist film to exposure with an EUV light or an electron beam optionally through a mask pattern having a pattern for a semiconductor device; and subjecting the substrate obtained after the exposure to development to remove the resist upper-layer film and the resist film to form the resist pattern.

11. A method for producing the composition according to claim 1, which comprises the step of mixing the polymer (P) and a ketone compound having 4 to 12 carbon atoms as a solvent.

12. The composition according to claim 1, wherein (a) polymer (P) comprises repeating units represented by any of the following formulae (P-1) to (P-4) and (P-8) to (P-10):

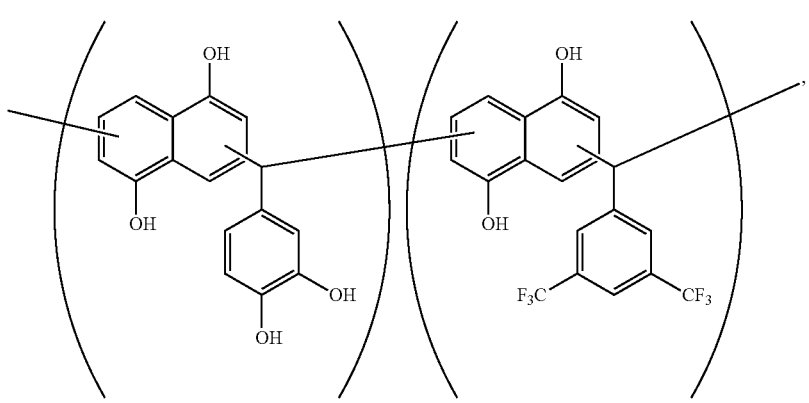

(P-1)

(P-2)
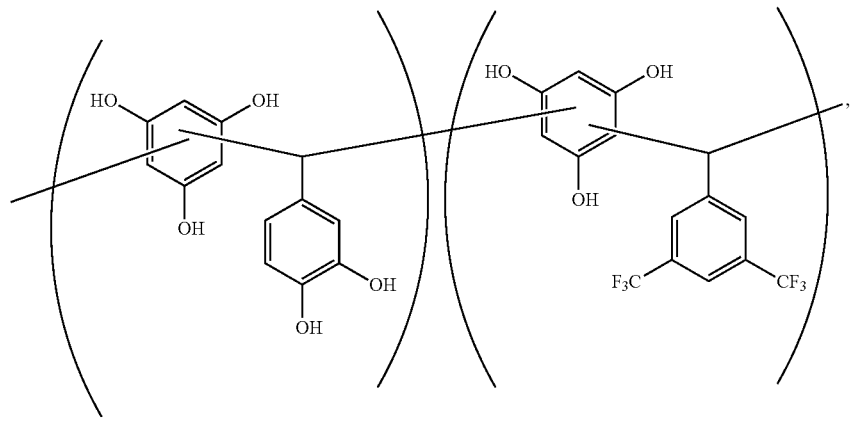
(P-3)
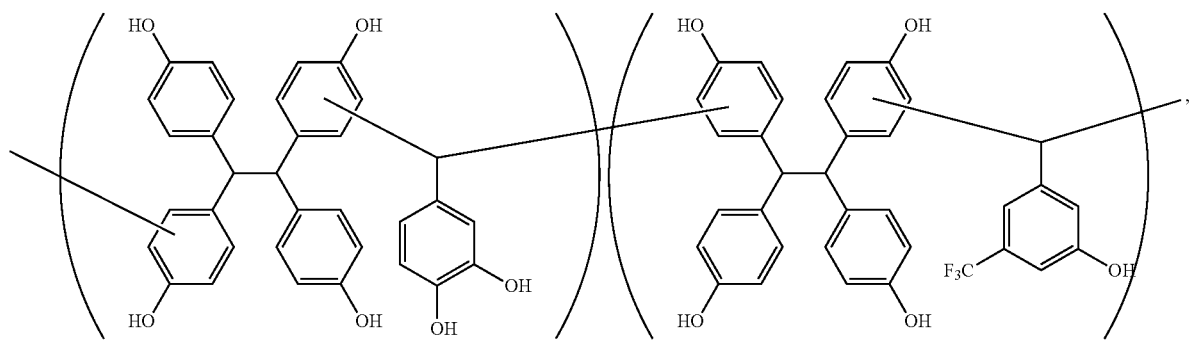
(P-2)
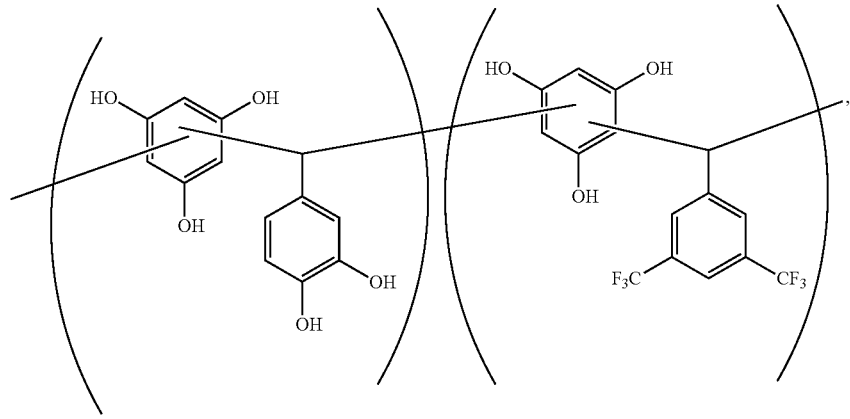
(P-4)
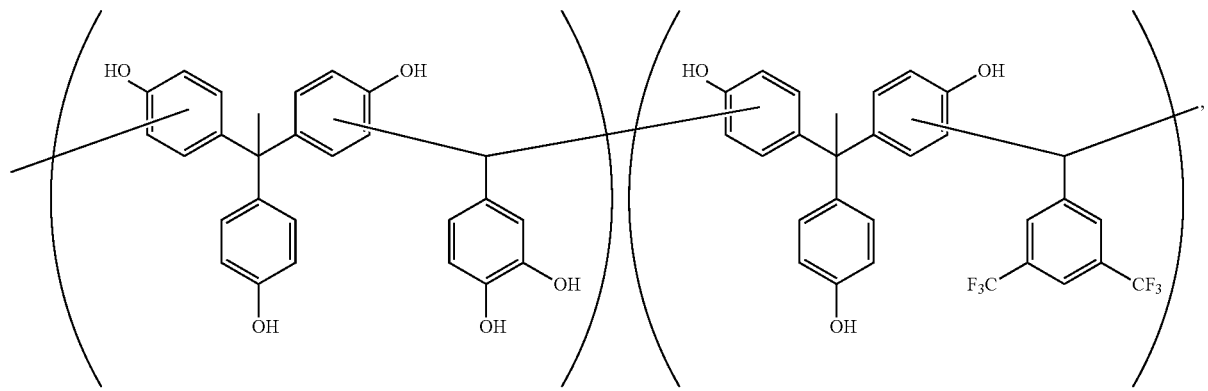

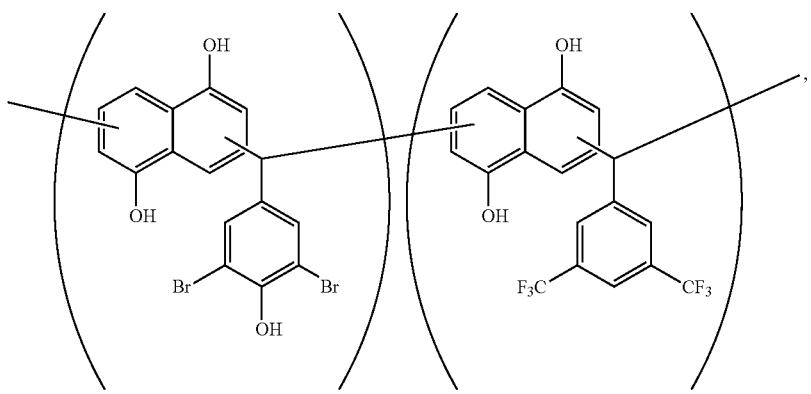
(P-8)
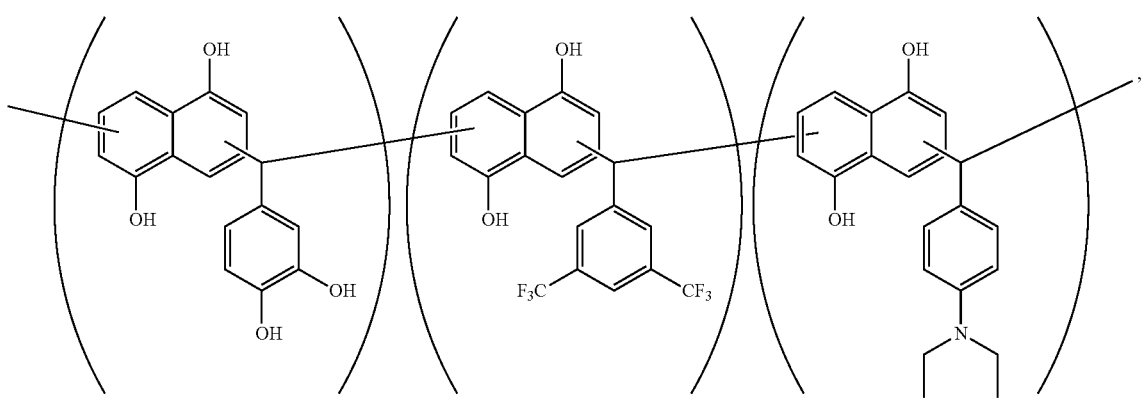
(P-9)
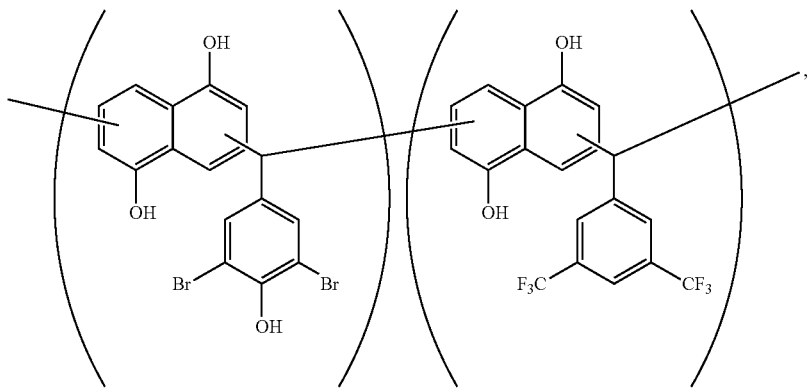
(P-8)
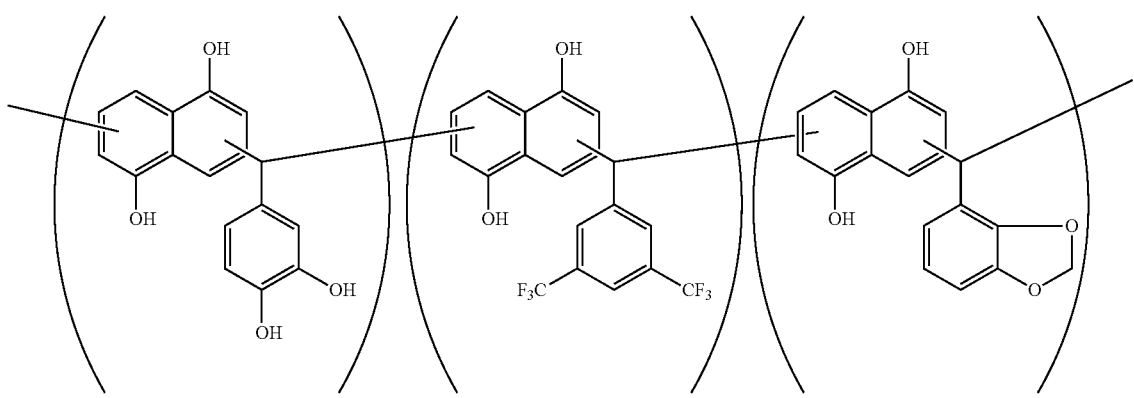
(P-10)

13. The composition according to claim 1, wherein (a) polymer (P) comprises repeating units represented by any of the following formulae (P-5) to (P-7):
a copolymer of:
(P-5)
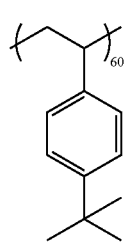 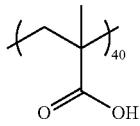
a copolymer of:
(P-6)
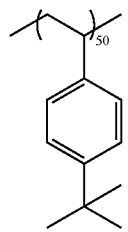 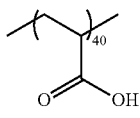 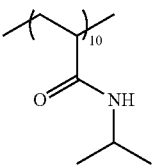
a copolymer of:
(P-7)
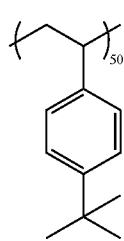 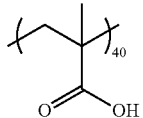 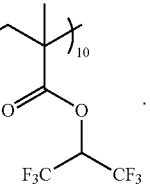
* * * * *